(12) United States Patent
Yun et al.

(10) Patent No.: US 8,754,466 B2
(45) Date of Patent: Jun. 17, 2014

(54) THREE-DIMENSIONAL SEMICONDUCTOR MEMORY DEVICES

(71) Applicants: Janggn Yun, Hwaseong-si (KR); Kwang Soo Seol, Yongin-si (KR); Jungdal Choi, Hwaseong-si (KR)

(72) Inventors: Janggn Yun, Hwaseong-si (KR); Kwang Soo Seol, Yongin-si (KR); Jungdal Choi, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/652,998

(22) Filed: Oct. 16, 2012

(65) Prior Publication Data

US 2013/0093005 A1    Apr. 18, 2013

(30) Foreign Application Priority Data

Oct. 17, 2011 (KR) .......................... 10-2011-0106016

(51) Int. Cl.
*H01L 29/792* (2006.01)

(52) U.S. Cl.
USPC .................................. 257/324; 257/E29.309

(58) Field of Classification Search
CPC .............. H01L 27/11563; H01L 27/1157; H01L 27/11582
USPC ..................... 257/324, 326, 329, 67, E29.309
See application file for complete search history.

(56) References Cited

U.S. PATENT DOCUMENTS

| | | | |
|---|---|---|---|
| 7,696,559 B2 | 4/2010 | Arai et al. | |
| 8,519,472 B2 * | 8/2013 | Jeong et al. | 257/326 |
| 2009/0090959 A1 | 4/2009 | Nishihara et al. | |
| 2009/0173981 A1 | 7/2009 | Nitta | |
| 2009/0278193 A1 | 11/2009 | Murata et al. | |
| 2010/0207193 A1 | 8/2010 | Tanaka et al. | |

FOREIGN PATENT DOCUMENTS

KR    10-2012-0130902    12/2012

* cited by examiner

*Primary Examiner* — Mark Prenty
(74) *Attorney, Agent, or Firm* — F. Chau & Associates, LLC

(57) ABSTRACT

Three-dimensional (3D) semiconductor memory devices are provided. According to the 3D semiconductor memory device, a gate structure includes gate patterns and insulating patterns alternately stacked on a semiconductor substrate. A vertical active pattern penetrates the gate structure. A gate dielectric layer is disposed between a sidewall of the vertical active pattern and each of the gate patterns. A semiconductor pattern is disposed on the gate structure and is connected to the vertical active pattern. A string drain region is formed in a portion of the semiconductor pattern and is spaced apart from the vertical active pattern.

20 Claims, 52 Drawing Sheets

THREE-DIMENSIONAL SEMICONDUCTOR MEMORY DEVICES

CROSS-REFERENCE TO RELATED APPLICATIONS

This U.S. non-provisional patent application claims priority under 35 U.S.C. §119 to Korean Patent Application No. 10-2011-0106016, filed on Oct. 17, 2011, the entirety of which is incorporated by reference herein.

BACKGROUND

Embodiments of the inventive concept relate to semiconductor devices and more particularly to three-dimensional semiconductor memory devices.

High integration density of semiconductor memory devices, which may contribute to cost savings, may be limited by their available planar area.

Three-dimensional semiconductor memory devices may address such limitations.

SUMMARY

Embodiments of the inventive concept provide three-dimensional semiconductor memory devices with improved reliability and higher integration.

In an embodiment, a three-dimensional (3D) semiconductor memory device may include a gate structure including gate patterns and insulating patterns alternately stacked on a semiconductor substrate, a vertical active pattern penetrating the gate structure, a gate dielectric layer disposed between a sidewall of the vertical active pattern and each of the gate patterns, a semiconductor pattern disposed on the gate structure, the semiconductor pattern connected to the vertical active pattern, and a string drain region formed in a portion of the semiconductor pattern, the string drain region spaced apart from the vertical active pattern.

In an embodiment, an uppermost gate pattern of the gate patterns may control a vertical channel region defined in the vertical active pattern and a horizontal channel region defined in the semiconductor pattern. The vertical channel region may be connected to one end of the horizontal channel region, and the string drain region may be connected to another end of the horizontal channel region.

In an embodiment, the semiconductor pattern may contact the vertical active pattern.

In an embodiment, an uppermost gate pattern of the gate patterns may extend in a first direction when viewed from a plan view, and the semiconductor pattern may extend in a second direction different from the first direction when viewed from a plan view.

In an embodiment, the 3D semiconductor memory device may further include: a bit line electrically connected to the string drain region and extending in the second direction.

In an embodiment, the 3D semiconductor memory device may further include a common source region formed in the semiconductor substrate at a side of the gate structure. A lowermost gate pattern of the gate patterns may control a vertical channel region defined in the vertical active pattern and a horizontal channel region defined in the semiconductor substrate. An end of the horizontal channel region may be connected to the common source region, and another end of the horizontal channel region may be connected to the vertical channel region.

In an embodiment, the 3D semiconductor memory device may further include: a body pickup region disposed in the semiconductor pattern, the body pickup region spaced apart from the string drain region. The body pickup region may be doped with dopants of a first conductivity type and the string drain region may be doped with dopants of a second conductivity type.

In an embodiment, the 3D semiconductor memory device may further include a bit line electrically connected to the string drain region and a body pickup line electrically connected to the body pickup region. The bit line may be disposed at a level different from the body pickup line with respect to a top surface of the semiconductor substrate.

In an embodiment, the 3D semiconductor memory device may further include a common source region formed in the semiconductor substrate and doped with dopants of the second conductivity type. The vertical active pattern may contact the common source region.

In an embodiment, a 3D semiconductor memory device may include a first gate structure including first gate patterns and first insulating patterns alternately stacked on a semiconductor substrate, a first vertical active pattern penetrating the first gate structure, a second gate structure including second gate patterns and second insulating patterns alternately stacked on the semiconductor substrate, the second gate structure laterally spaced apart from the first gate structure, a second vertical active pattern penetrating the second gate structure, a gate dielectric layer disposed between a sidewall of each of the first and second vertical active patterns and each of the first and second gate patterns, a semiconductor pattern disposed on the first and second gate structures, the semiconductor pattern connected to the first and second vertical active patterns, and a string drain region disposed in the semiconductor pattern, the string drain region spaced apart from the first and second vertical active patterns.

In an embodiment, the 3D semiconductor memory device may further include a string source region disposed in the semiconductor pattern. The string source region may be spaced apart from the string drain region and the first and second vertical active patterns. Bottom ends of the first and second vertical active patterns may be connected to each other and constitute a U-shape active part. An uppeimost gate pattern of the first gate patterns may correspond to a string selection gate pattern, and an uppermost gate pattern of the second gate patterns may correspond to a ground selection gate pattern. A lowermost gate pattern of the first gate patterns and an lowermost gate pattern of the second gate patterns may correspond to cell gate patterns.

In an embodiment, the string selection gate pattern may control a first vertical channel region defined in the first vertical active pattern and a first horizontal channel region defined in the semiconductor pattern. One end of the first horizontal channel region may be connected to the first vertical channel region, and another end of the first horizontal channel region may be connected to the string drain region. The ground selection gate pattern may control a second vertical channel region defined in the second vertical active pattern and a second horizontal channel region defined in the semiconductor pattern. One end of the second horizontal channel region may be connected to the second vertical channel region, and another end of the second horizontal channel region may be connected to the string source region.

In an embodiment, the 3D semiconductor memory device may further include a body pickup region formed in the semiconductor pattern. The body pickup region may be spaced apart from the string drain region and the string source region. The body pickup region may be doped with dopants of a first conductivity type, and the string drain region and the string source region may be doped with dopants of a second conductivity type. The body pickup region may be disposed between the string drain region and the string source region.

In an embodiment, the 3D semiconductor memory device may further include a bit line electrically connected to the string drain region, a common source line electrically connected to the string source region, and a body pickup line electrically connected to the body pickup region. The bit line may be disposed at a level different from the common source line with respect to a top surface of the semiconductor substrate. The bit line, the common source line, and the body pickup line may be spaced apart from each other.

In an embodiment, the 3D semiconductor memory device may further include an active connection portion disposed in a recess region formed in the semiconductor substrate under the first and second gate structures. The active connection portion may be formed of the same semiconductor material as the first and second vertical active patterns. The bottom end of the first vertical active pattern may be connected to the bottom end of the second vertical active pattern through the active connection portion. The gate dielectric layer may extend to be disposed between the active connection portion and the semiconductor substrate.

BRIEF DESCRIPTION OF THE DRAWINGS

The embodiments of the inventive concept will become more apparent in view of the attached drawings and accompanying detailed description.

DETAILED DESCRIPTION OF THE EMBODIMENTS

Figure 1:
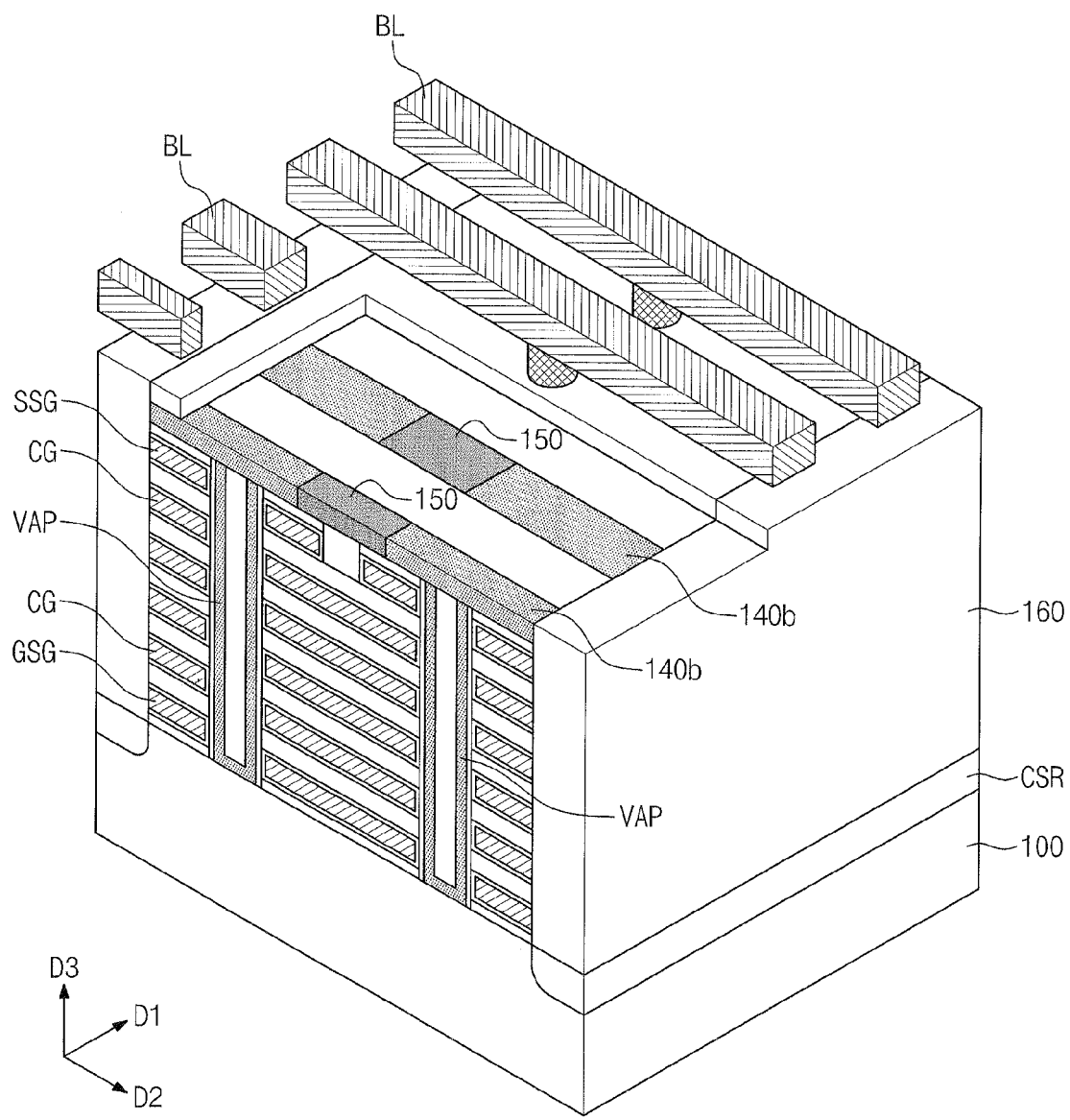
FIG. 1 is a perspective view illustrating a three-dimensional (3D) semiconductor memory device according to an embodiment of the inventive concept.

The embodiments of the inventive concept will now be described more fully hereinafter with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. The same reference numerals or the same reference designators may denote the same or substantially the same elements throughout the specification and the drawings.

Figure 2:
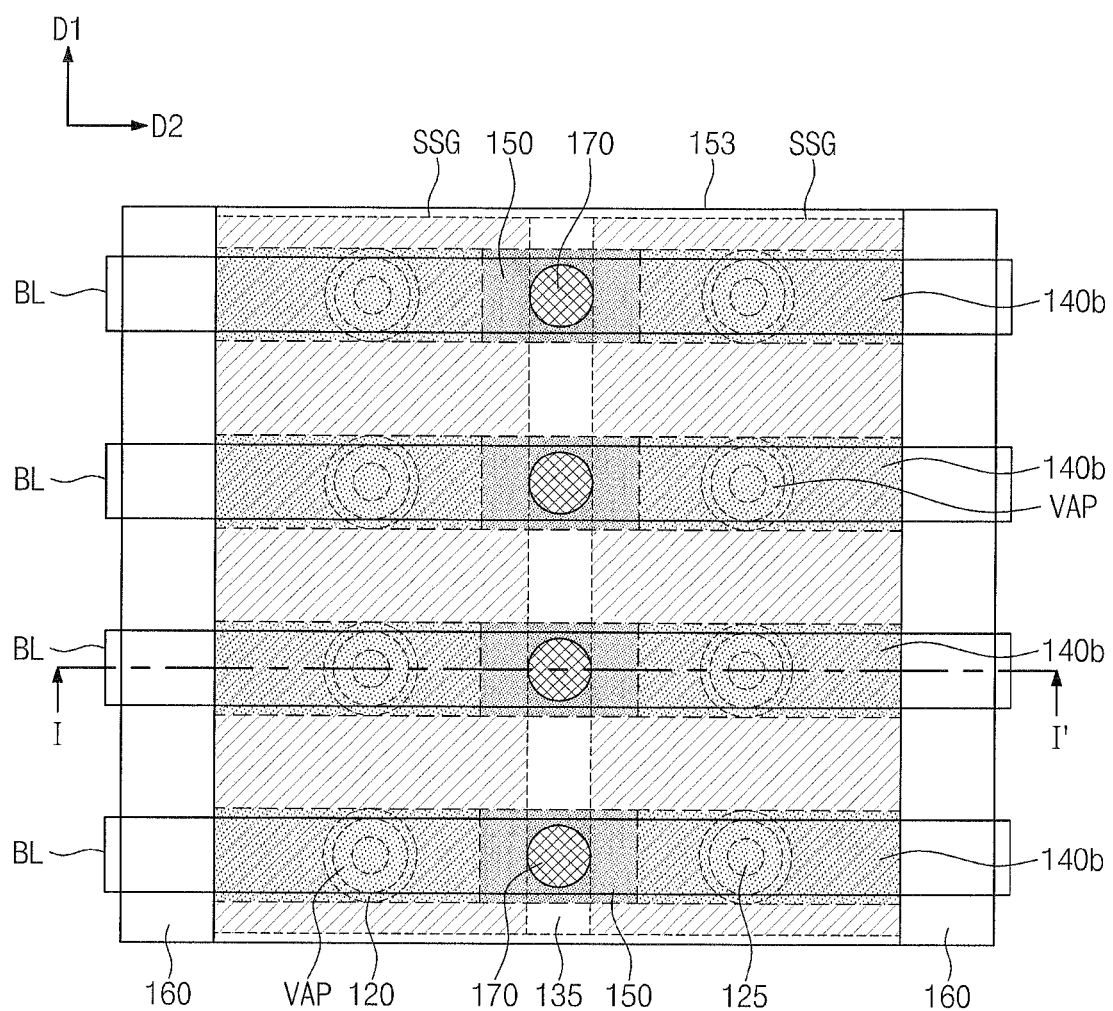
FIG. 2 is a plan view illustrating the 3D semiconductor memory device of FIG. 1.
Figure 3:
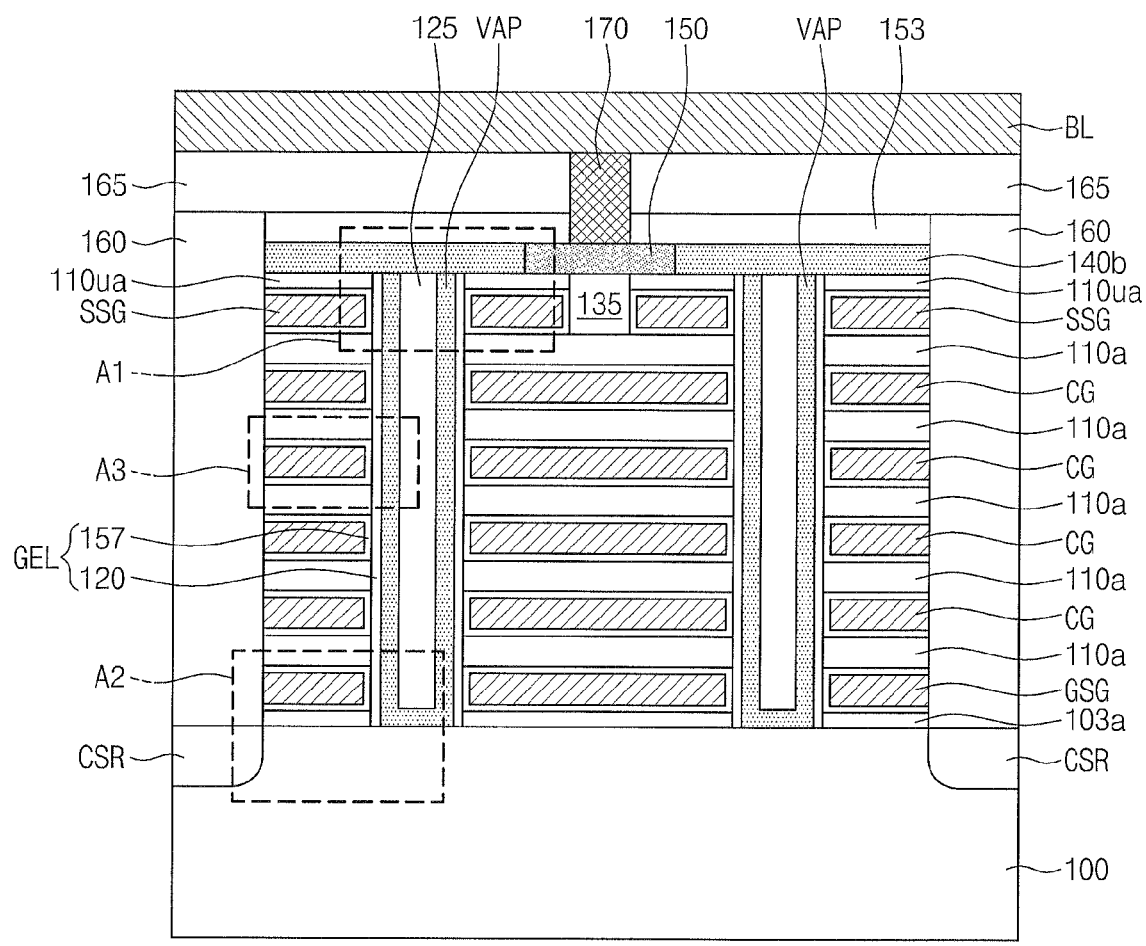
FIG. 3 is a cross-sectional view taken along a line I-I' of FIG. 2.
Figure 4A:
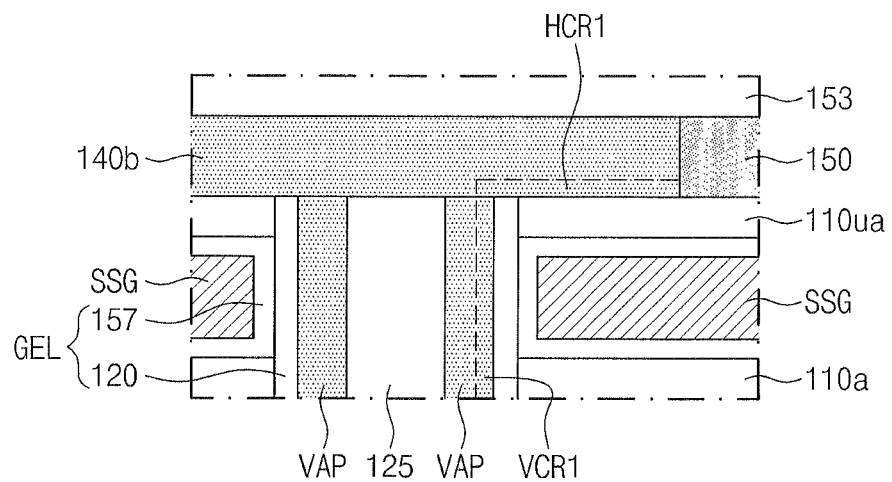
FIG. 4A is an enlarged view of a portion 'A1' of FIG. 3.
Figure 4B:
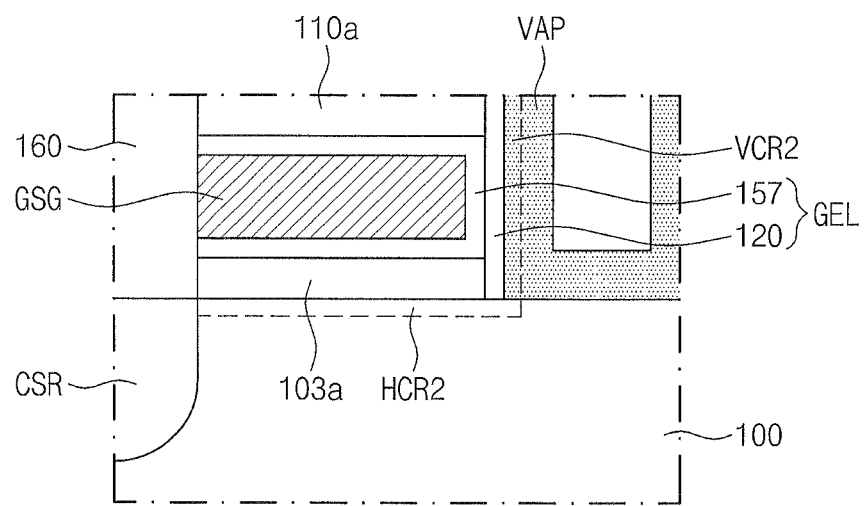
FIG. 4B is an enlarged view of a portion 'A2' of FIG. 3.
Figure 4C:
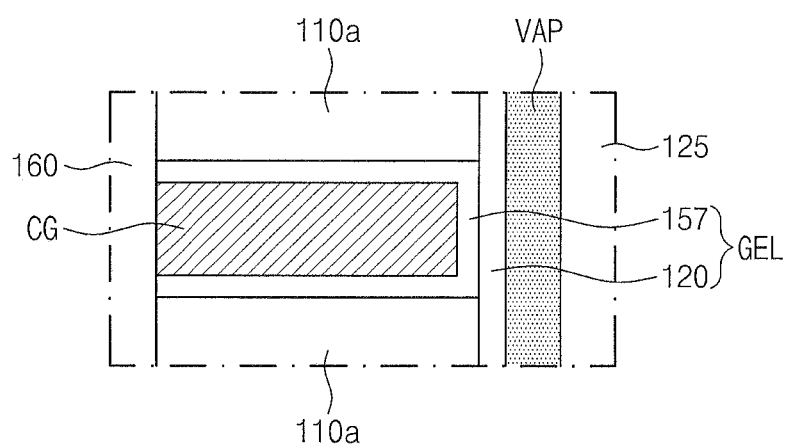
FIG. 4C is an enlarged view of a portion 'A3' of FIG. 3.

FIG. 1 is a perspective view illustrating a three-dimensional (3D) semiconductor memory device according to an embodiment of the inventive concept, FIG. 2 is a plan view illustrating the 3D semiconductor memory device of FIG. 1, and FIG. 3 is a cross-sectional view taken along a line I-I' of FIG. 2. FIG. 4A is an enlarged view of a portion 'A1' of FIG. 3, FIG. 4B is an enlarged view of a portion 'A2' of FIG. 3, and FIG. 4C is an enlarged view of a portion 'A3' of FIG. 3.

Referring to FIGS. 1, 2, and 3, a gate structure is disposed on a semiconductor substrate 100. The gate structure includes gate patterns GSG, CG, and SSG and insulating patterns 110a and 110ua which are alternately and repeatedly stacked on the semiconductor substrate 100. The uppermost gate pattern SSG and the lowermost gate pattern GSG of the gate patterns GSG, CG, and SSG in the gate structure correspond to a string selection gate pattern SSG and a ground selection gate pattern GSG, respectively. The gate patterns GSG, CG, and SSG in the gate structure include a plurality of stacked cell gate patterns CG. The stacked cell gate patterns CG are disposed between the ground selection gate pattern GSG and the string selection gate pattern SSG. A buffer dielectric pattern 103a is disposed between the gate structure and the semiconductor substrate 100. According to an embodiment, a plurality of gate structures are provided on the semiconductor substrate 100. The plurality of gate structures are laterally spaced apart from each other.

The semiconductor substrate 100 includes a semiconductor material. For example, according to an embodiment, the semiconductor substrate 100 includes a silicon substrate, a germanium substrate, or a silicon-germanium substrate. The semiconductor substrate 100 is doped with dopants of a first conductivity type. For example, according to an embodiment, the semiconductor substrate 100 includes a well region doped with the dopants of the first conductivity type. The gate structure is disposed on the well region. The uppermost insulating pattern 110ua of the insulating patterns 110a and 110ua is disposed on the string selection gate pattern SSG. The insulating patterns 110a under the uppermost insulating pattern 110ua include oxide. The uppermost insulating pattern 110ua includes the same insulating material as the insulating patterns 110a. Alternatively, the uppermost insulating pattern 110ua includes an insulating material different from the insulating patterns 110a. This will be described below in more detail. The gate patterns GSG, CG, and SSG are formed of a conductive material. For example, according to an embodiment, the gate patterns GSG, CG, and SSG include at least one of a semiconductor material doped with dopants (e.g., doped silicon, etc.), a conductive metal nitride (e.g., titanium nitride (TiN), tantalum nitride (TaN), and/or tungsten nitride (WN), etc.), metal (e.g., tungsten, titanium, and/or tantalum, etc.), and a metal-semiconductor compound (e.g., metal silicide, etc.). The buffer dielectric pattern 103a includes the same material as the insulating patterns 110a. For example, according to an embodiment, the buffer dielectric pattern 103a includes oxide.

In an embodiment, the gate structure includes a plurality of string selection gate patterns SSG which are disposed at the same level from a top surface of the semiconductor substrate 100. The string selection gate patterns SSG in the gate structure are laterally spaced apart from each other and disposed on a single uppermost cell gate pattern CG. According to an embodiment, a single ground selection gate pattern GSG is included as the lowermost gate pattern in the gate structure. A separation insulating pattern 135 is disposed between the string selection gate patterns SSG. The separation insulating pattern 135 extends upward and is disposed between the uppermost insulating patterns 110ua which are disposed on the plurality of string selection gate patterns SSG, respectively.

As illustrated in FIG. 2, the gate structure extends in a first direction D1 in a plan view. Thus, the string selection, cell, and ground selection gate patterns SSG, CG, and GSG extend in the first direction D1. In a plan view, the plurality of string selection gate patterns SSG are spaced apart from each other in a second direction D2 perpendicular to the first direction D1.

A plurality of vertical active patterns VAP penetrate the gate structure. In an embodiment, the vertical active patterns VAP contact the semiconductor substrate 100. As illustrated in FIG. 2, the plurality of vertical active patterns VAP are two-dimensionally arranged in rows and columns in a plan view. The columns are parallel to the first direction D1, and the rows are parallel to the second direction D2. In an embodiment, the vertical active patterns VAP constituting each of the columns penetrate a corresponding string selection gate pattern of the string selection gate patterns SSG and the cell and ground selection gate patterns CG and SSG under the corresponding string selection gate pattern SSG. For example, the vertical active patterns VAP penetrating each of the string selection gate pattern SSG are linearly arranged in the first direction D1.

According to an embodiment, the vertical active patterns VAP are formed of the same semiconductor material (e.g., silicon) as the semiconductor substrate 100. According to an embodiment, the vertical active patterns VAP have a polycrystalline state or a single-crystalline state. According to an embodiment, the vertical active patterns VAP have an undoped state or be doped with dopants of the first conductivity type. Alternatively, the vertical active patterns VAP are lightly doped with dopants of a second conductivity type different from the first conductivity type.

In an embodiment, as illustrated in FIG. 3, each of the vertical active patterns VAP has a pipe shape or a macaroni shape. According to an embodiment, a filling dielectric pattern 125 fills an inner space surrounded by each of the vertical active patterns VAP. According to an embodiment, the filling dielectric pattern 125 includes oxide, nitride, and/or oxynitride.

A gate dielectric layer GEL is disposed between a sidewall of each of the vertical active patterns VAP and each of the gate patterns GSG, CG, and SSG. The gate dielectric layer GEL will be described below in more detail.

A plurality of semiconductor patterns 140b are disposed on the gate structure. The semiconductor patterns 140b extend in the second direction D2 when viewed from a plan view. The semiconductor patterns 140b are spaced apart from each other in the first direction D1 and electrically insulated from each other. Each of the semiconductor patterns 140b is connected to top ends of the vertical active patterns VAP constituting each of the rows in the gate structure. Each of the semiconductor patterns 140b contacts the vertical active patterns VAP in each of the rows. Each of the semiconductor patterns 140b covers top surfaces of the filling dielectric patterns 125 filling the inner spaces of the vertical active patterns VAP in each of the rows. In an embodiment, as illustrated in FIG. 3, each of the semiconductor patterns 140b includes two opposite sidewalls respectively aligned with two opposite sidewalls of the gate structure.

According to an embodiment, the semiconductor patterns 140b are formed of the same semiconductor material as the vertical active patterns VAP. For example, according to an embodiment, when the vertical active patterns VAP are formed of silicon, the semiconductor patterns 140b are formed of silicon. According to an embodiment, the semiconductor patterns 140b have the same doped state as the vertical active patterns VAP. For example, according to an embodiment, the semiconductor patterns 140b have an undoped state or are doped with dopants of the first conductivity type. Alternatively, the semiconductor patterns 140b are lightly doped with dopants of the second conductivity type.

A string drain region 150 is formed in a portion of each of the semiconductor patterns 140b. The string drain region 150 corresponds to a region doped with dopants of the second conductivity type. The string drain region 150 has a high concentration. The string drain region 150 is spaced apart from the vertical active patterns VAP. For example, the string drain region 150 is spaced apart from a hole defined by the vertical active pattern VAP in the gate structure. Thus, the dopants in the string drain region 150 do not substantially influence the vertical active patterns VAP. As a result, it is possible to prevent a deterioration of characteristics of vertical channel regions defined in the vertical active pattern VAP. According to an embodiment, one of the first conductivity type and the second conductivity type is a P type and the other is an N type.

Since the string drain region 150 is spaced apart from the vertical active patterns VAP, at least a portion of the string selection gate pattern SSG overlaps a portion of the semiconductor pattern 140b in which the string drain region 150 is not formed. For example, the string selection gate pattern SSG overlaps a portion of the semiconductor pattern 140b between the string drain region 150 and each of the vertical active patterns VAP.

As illustrated in FIG. 3, common source regions CSR are disposed in the semiconductor substrate 100 at two opposite sides, respectively, of the gate structure. The common source regions CSR are doped with dopants of the second conductivity type. A capping dielectric pattern 153 is disposed on the semiconductor patterns 140b and fills spaces between the semiconductor patterns 140b. The capping dielectric pattern 153 has two opposite sidewalls respectively aligned with the two opposite sidewalls of the gate structure. The capping dielectric pattern 153 includes oxide. Device isolation patterns 160 are disposed on the common source regions CSR, respectively. The gate structure, the semiconductor patterns 140b, and the capping dielectric pattern 153 are disposed between two device isolation patterns 160 adjacent to each other. Top surfaces of the device isolation patterns 160 are substantially coplanar with a top surface of the capping dielectric pattern 153. According to an embodiment, the device isolation patterns 160 include oxide, nitride, and/or oxynitride.

Hereinafter, the string selection gate pattern SSG, the semiconductor pattern 140b, and the string drain region 150 are described in more detail with reference to FIG. 4A.

Referring to FIGS. 1, 2, 3, and 4A, the string selection gate pattern SSG controls a string horizontal channel region HCR1 defined in the semiconductor pattern 140b located over the string selection gate pattern SSG and a string vertical channel region VCR1 defined in the vertical active pattern VAP located beside the string selection gate pattern SSG. An end of the string horizontal channel region HCR1 is connected to the string drain region 150 and another end of the string horizontal channel region HCR1 is connected to the string vertical channel region VCR1. For example, a string selection transistor including the string selection gate pattern SSG has the string horizontal channel region HCR1 and the string vertical channel region VCR1. Thus, even though the string drain region 150 is spaced apart from the vertical active pattern VAP, a channel generated in the string vertical channel region VCR1 is electrically connected to the string drain region 150 through a channel generated in the string horizontal channel region HCR1 during an operation of the 3D semiconductor memory device.

A string selection gate dielectric layer of the string selection transistor includes the gate insulating layer GEL disposed between the vertical active pattern VAP and the string selection gate pattern SSG, and the uppermost insulating pattern 110ua and a portion 157 of the gate dielectric layer GEL disposed between the semiconductor pattern 140b and the string selection gate pattern SSG. According to an embodiment, the uppermost insulating pattern 110ua includes oxide, nitride, oxynitride, and/or a high-k dielectric material.

According to an embodiment, the common source region CSR is disposed in the semiconductor substrate 100 at a side of the gate structure. According to an embodiment, a ground selection transistor including the ground selection gate pattern GSG includes also a horizontal channel region and a vertical channel region.

Referring to FIGS. 1, 2, 3, and 4B, the ground selection gate pattern GSG controls a ground horizontal channel region HCR2 defined in the semiconductor substrate 100 under the ground selection gate pattern GSG and a ground vertical channel region VCR2 defined in the vertical active pattern VAP beside the ground selection gate pattern GSG. An end of the ground horizontal channel region HCR2 is connected to the common source region CSR, and another end of the ground horizontal channel region HCR2 is connected to the ground vertical channel region VCR2. A ground selection gate dielectric layer of the ground selection transistor includes the gate dielectric layer GEL disposed between the vertical active pattern VAP and the ground selection gate pattern GSG, and a portion 157 of the gate dielectric layer GEL and the buffer dielectric pattern 103a disposed between the ground selection gate pattern GSG and the semiconductor substrate 100. In an embodiment, the buffer dielectric pattern 103a is omitted.

The gate dielectric layer GEL is described in more detail with reference to FIG. 4C. Referring to FIGS. 1, 2, 3, and 4C, the gate dielectric layer GEL between each of the gate patterns GSG, CG, and SSG and each of the vertical active patterns VAP includes a tunnel dielectric layer, a charge storing layer, and a blocking dielectric layer. The tunnel dielectric layer is adjacent to the vertical active pattern VAP, and the blocking dielectric layer is adjacent to each of the gate patterns GSG, CG, and SSG. The charge storing layer is disposed between the tunnel dielectric layer and the blocking dielectric layer.

According to an embodiment, the tunnel dielectric layer includes oxide, oxynitride, and/or metal oxide (e.g., hafnium oxide, etc.). The charge storing layer includes a dielectric material having traps capable of storing charges. For example, according to an embodiment, the charge storing layer includes nitride and/or metal oxide (e.g., hafnium oxide, etc.). The blocking dielectric layer includes a high-dielectric layer having a dielectric constant higher than a dielectric constant of the tunnel dielectric layer. For example, according to an embodiment, the high-dielectric layer includes a metal oxide layer, such as an aluminum oxide layer or a hafnium oxide layer. According to an embodiment, the blocking dielectric layer further includes a barrier dielectric layer having an energy band gap greater than an energy band gap of the high-k dielectric layer. In an embodiment, the barrier dielectric layer is disposed between the charge storing layer and the high-k dielectric layer.

As illustrated in FIG. 4C, the gate dielectric layer GEL includes a first sub-layer 120 and a second sub-layer 157. The first sub-layer 120 includes at least a portion of the tunnel dielectric layer, and the second sub-layer 157 includes at least a portion of the blocking dielectric layer. One of the first and second sub-layers 120 and 157 includes the charge storing layer. For example, according to an embodiment, the first sub-layer 120 includes the tunnel dielectric layer, the charge storing layer, and the barrier dielectric layer, and the second sub-layer 157 includes the high-k dielectric layer. However, the embodiments of the inventive concept are not limited thereto. According to an embodiment, the first sub-layer 120 and the second sub-layer 157 include any combination.

As illustrated in FIG. 4C, the first sub-layer 120 vertically extends between the vertical active pattern VAP and the insulating patterns 110a and 110ua. The second sub-layer 157 horizontally extends and covers a bottom surface and a top surface of each of the gate pattern GSG, CG, and SSG. The extending portion of the second sub-layer 157 is disposed between the bottom or top surface of each of the gate patterns GSG, CG, and SSG and the insulating pattern 110 or 110ua.

A cell transistor includes each of the cell gate patterns CG and the gate dielectric layer GEL between the vertical active pattern VAP and each of the cell gate patterns CG. The cell transistor includes a cell vertical channel region defined in the vertical active pattern VAP.

Referring to FIGS. 1 to 3 and 4A to 4C, a vertical cell string includes a corresponding vertical active pattern of the vertical active patterns VAP, and the ground selection transistor, the cell transistors, and the string selection transistor defined at the corresponding vertical active pattern VAP. The ground selection, cell, and string selection transistors in the vertical cell string include vertical channel regions. Thus, a plurality of vertical cell strings are formed in the gate structure. The vertical cell strings in the gate structure are arranged along the rows and the columns when viewed from a plan view. The vertical cell strings in each of the rows share the string drain region 150 in each of the semiconductor patterns 140b. The ground selection transistor, the cell transistors, and the string selection transistor in each of the vertical cell strings are connected in series to each other. In an embodiment, each of the vertical cell strings includes a plurality of ground selection transistors connected in series to each other and/or a plurality of string selection transistors connected in series to each other. According to an embodiment, the uppermost transistor in each of the vertical cell strings also corresponds to the string selection transistor.

An interlayer dielectric layer 165 is disposed on the capping dielectric layer 153 and the device isolation patterns 160. The interlayer dielectric layer 165 includes oxide. Contact plugs 170 successively penetrate the interlayer dielectric layer 165 and the capping dielectric layer 153 and connect to the string drain regions 150, respectively. Bit lines BL are disposed on the interlayer dielectric layer 165 and connect to the contact plugs 170, respectively. The bit lines BL are electrically connected to the string drain regions 150 through the contact plugs 170, respectively. The bit lines BL extend in the second direction D2 to be parallel to the semiconductor patterns 140b. Each of the bit lines BL is connected to the string drain region 150 in the semiconductor pattern 140b connected to the vertical active patterns VAP in each of the rows of the vertical active patterns VAP.

According to an embodiment, the contact plugs 170 include at least one of metal (e.g., tungsten, titanium, tantalum, etc.), a conductive metal nitride (e.g., titanium nitride, tantalum nitride, etc.), and a metal-semiconductor compound (e.g., metal silicide, etc.). According to an embodiment, the bit lines BL include at least one of metal (e.g., tungsten, titanium, tantalum, etc.), a conductive metal nitride (e.g., titanium nitride, tantalum nitride, etc.), and a metal-semiconductor compound (e.g., metal silicide, etc.).

According to the 3D semiconductor memory device described above, the string drain region 150 is disposed in the semiconductor pattern 140b on the gate structure. Thus, the string drain region 150 is spaced apart from the vertical active pattern VAP, such that the string selection transistor has the string vertical channel region VCR1 with stable characteristics. As a result, it is possible to realize the 3D semiconductor memory device with improved reliability and higher integration.

When the string drain region 150 contacts the vertical active pattern VAP, the dopants in the string drain region 150 may be diffused into the string vertical channel region. Thus, a doping concentration of the string vertical channel region may be non-uniform. Therefore, the characteristics of the string selection transistor may be deteriorated, such that reliability of a 3D semiconductor memory device may decrease. However, according to an embodiment of the inventive concept, the string drain region 150 is disposed in a portion of the semiconductor pattern 150 to be separated from the vertical active pattern VAP. As a result, it is possible to realize the 3D semiconductor memory device with improved reliability.

Even though the string drain region 150 is spaced apart from the vertical active pattern VAP, the string selection gate pattern SSG, which is an uppermost gate pattern, controls the string horizontal channel region HCR1. Thus, the string drain region 150 can be electrically connected to the channel generated in the string vertical channel region VCR1 through the channel generated in the string horizontal channel region HCR1.

Hereinafter, modified examples of the present embodiment will be described with reference to drawings.

Figure 5:
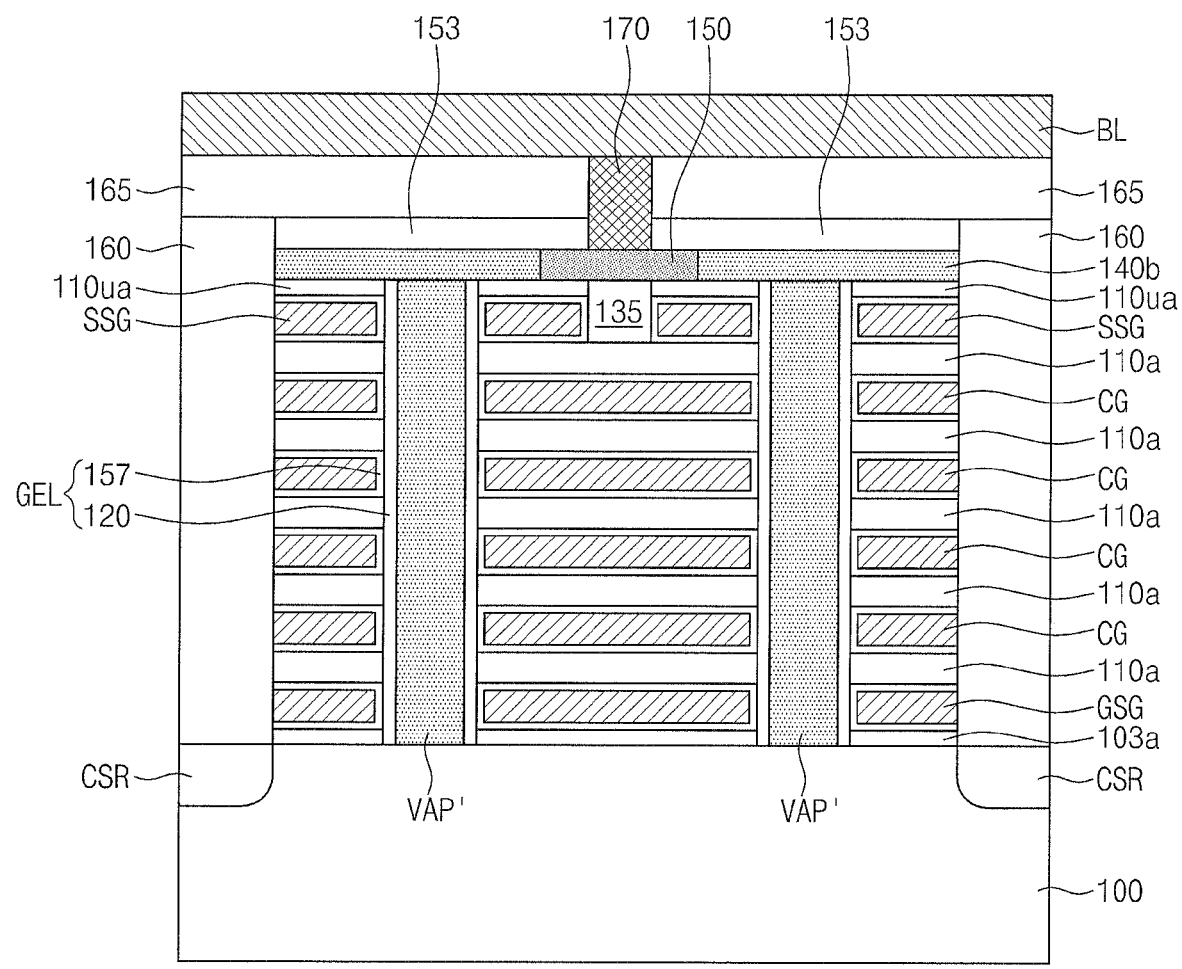
FIG. 5 is a cross-sectional view illustrating a 3D semiconductor memory device according to an embodiment of the inventive concept.

FIG. 5 is a cross-sectional view illustrating a 3D semiconductor memory device according to an embodiment of the inventive concept.

According to an embodiment, the filling dielectric pattern 125 described with reference to FIGS. 1 to 3 is omitted. According to an embodiment, as illustrated in FIG. 5, a vertical active pattern VAP' has a pillar shape. The semiconductor pattern 140b contacts a top surface of the vertical active pattern VAP' having the pillar shape.

Figure 6:
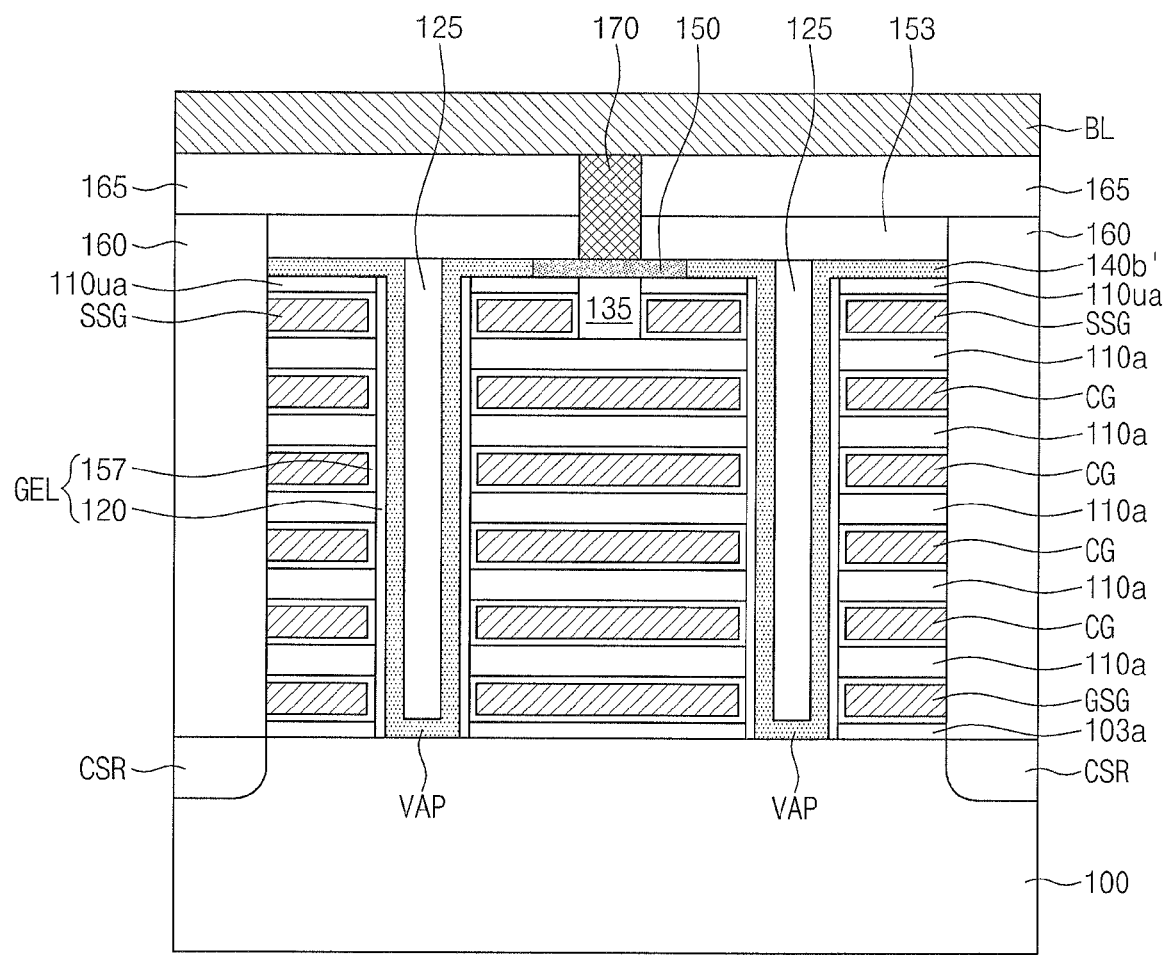
FIG. 6 is a cross-sectional view illustrating a 3D semiconductor memory device according to an embodiment of the inventive concept.

FIG. 6 is a cross-sectional view illustrating a 3D semiconductor memory device according to an embodiment of the inventive concept.

Referring to FIG. 6, a semiconductor pattern 140b' does not cover a top surface of the filling dielectric pattern 125 filling the inner space of the vertical active pattern VAP. According to an embodiment, the semiconductor pattern 140b' contacts the vertical active pattern VAP so that the semiconductor pattern 140b' and the vertical active pattern VAP constitute one body. According to an embodiment, the top surface of the filling dielectric pattern 125 is substantially coplanar with a top surface of the semiconductor pattern 140b'.

Figure 7:
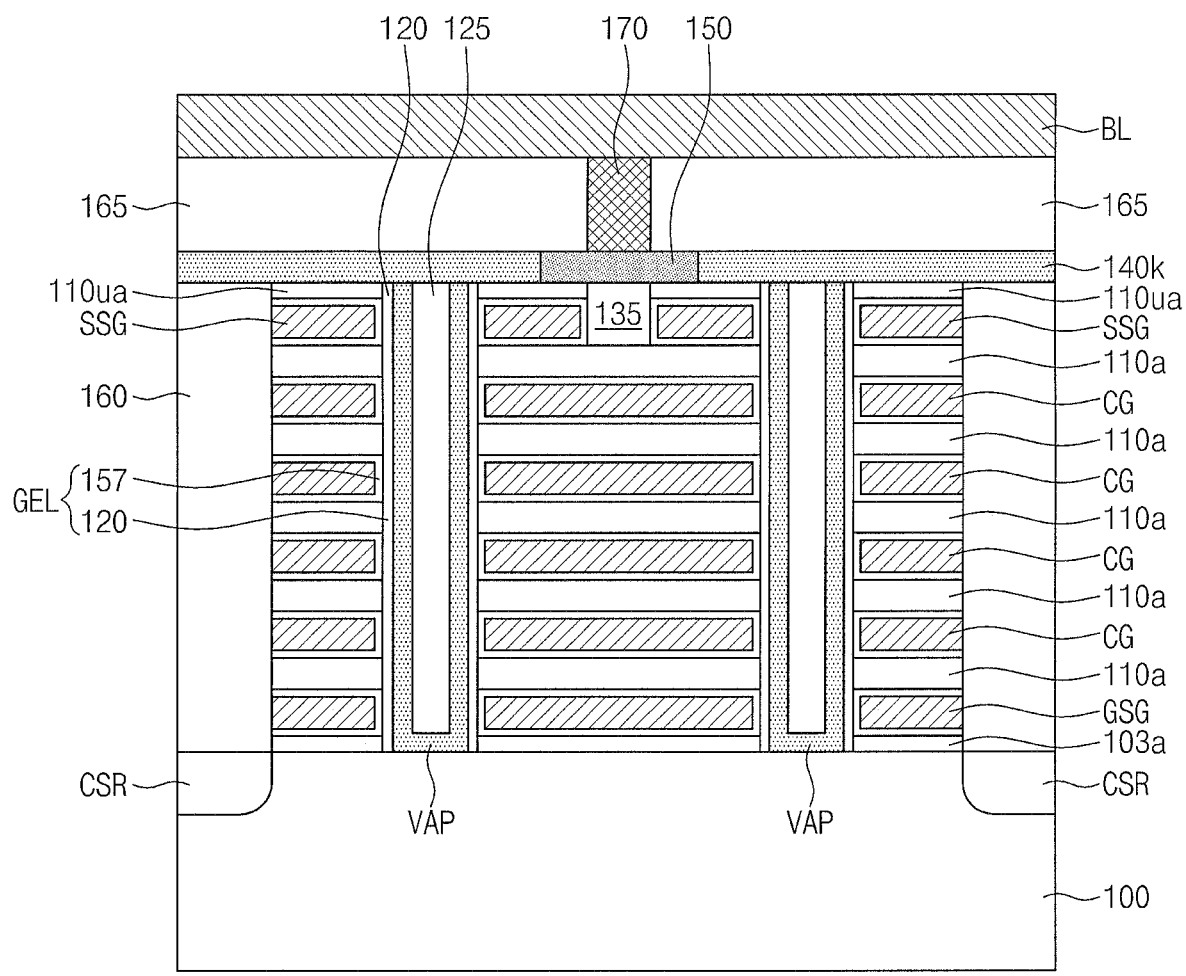
FIG. 7 is a cross-sectional view illustrating a 3D semiconductor memory device according to an embodiment of the inventive concept.

FIG. 7 is a cross-sectional view illustrating a 3D semiconductor memory device according to an embodiment of the inventive concept.

Referring to FIG. 7, a semiconductor pattern 140k laterally extends to cross the device isolation patterns 160 according to an embodiment. According to an embodiment, the capping dielectric pattern 153 is omitted, and top surfaces of the device isolation patterns 160 are substantially coplanar with top surfaces of the uppermost insulating patterns 110ua.

Figure 8:
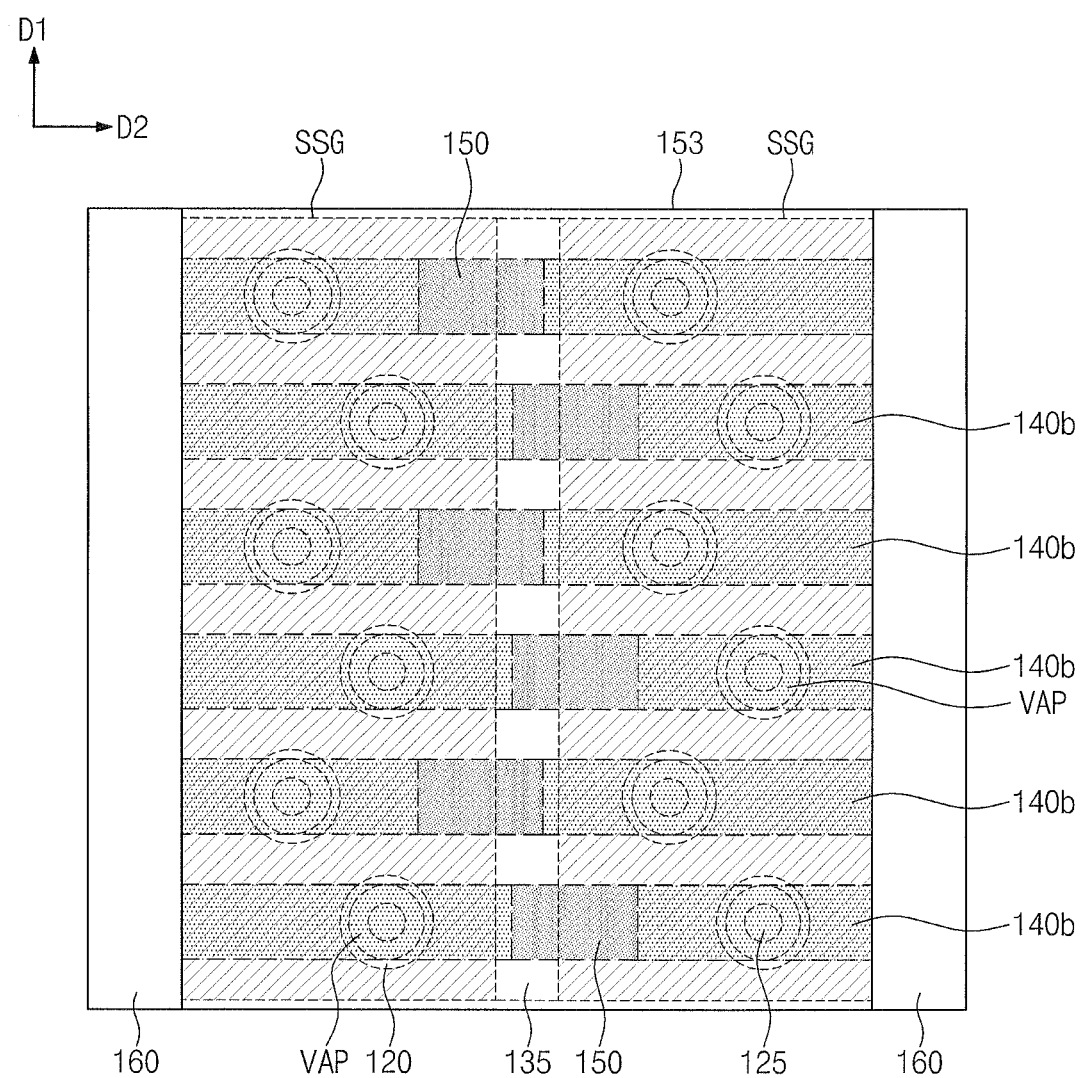
FIG. 8 is a cross-sectional view illustrating a 3D semiconductor memory device according to an embodiment of the inventive concept.

FIG. 8 is a cross-sectional view illustrating a 3D semiconductor memory device according to an embodiment of the inventive concept.

Referring to FIG. 8, according to an embodiment, a plurality of vertical active patterns VAP penetrating each of string selection gate patterns SSG are arranged in a zigzag shape along the first direction D1 when viewed from a plan view. For example, a column of odd-numbered vertical active patterns VAP, which is referred to as a first column, may be offset from a column of even-numbered vertical active patterns VAP, which is referred to as a second column. The vertical active patterns VAP constituting the first and second columns penetrate each of the string selection gate patterns SSG. According to an embodiment, string drain regions 150 formed in the semiconductor patterns 140b are arranged in a zigzag shape along the first direction D1. A width of the gate structure in the first direction D1 is reduced by the arrangement of the vertical active patterns VAP according to an embodiment. As a result, the 3D semiconductor memory device can have higher integration.

Figure 9:
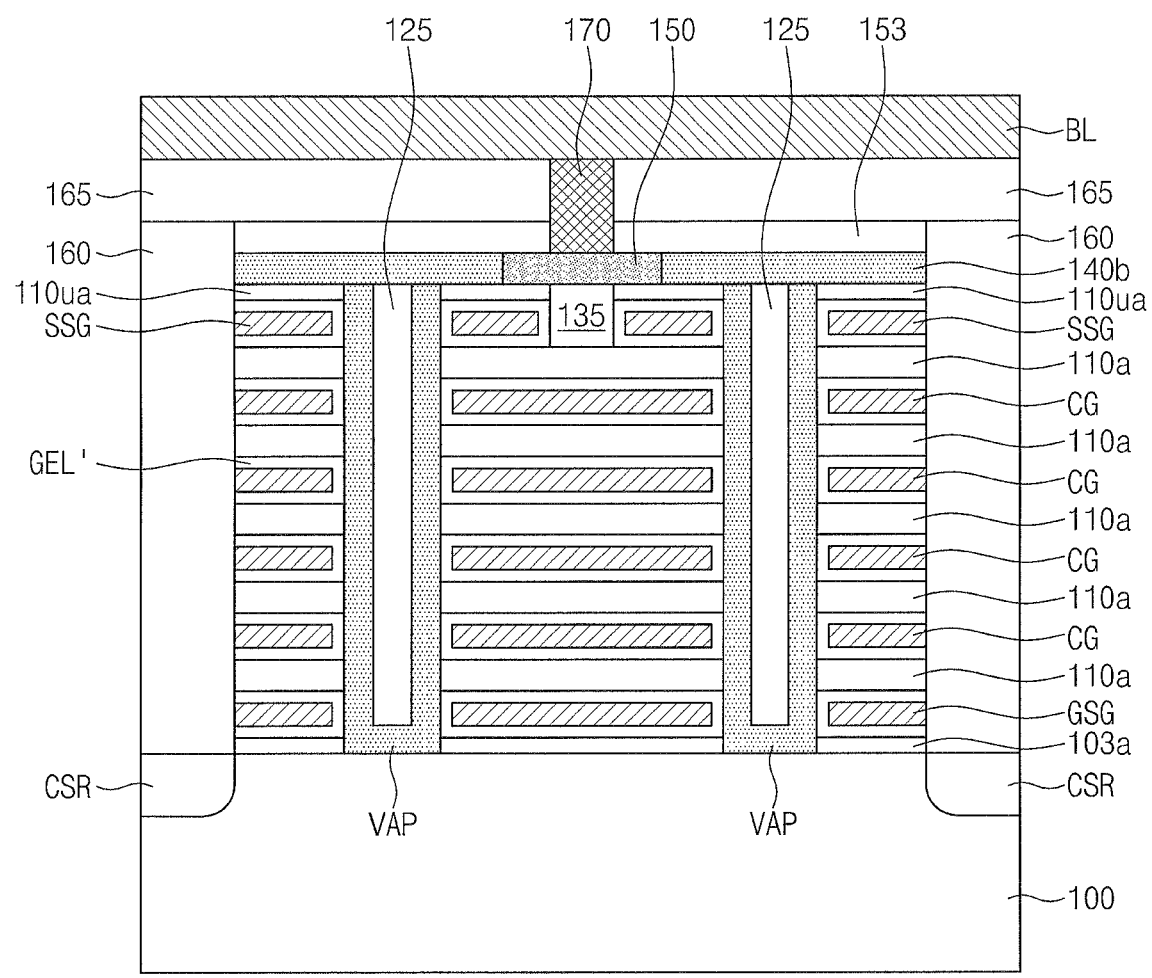
FIG. 9 is a cross-sectional view illustrating a 3D semiconductor memory device according to an embodiment of the inventive concept.

FIG. 9 is a cross-sectional view illustrating a 3D semiconductor memory device according to an embodiment of the inventive concept.

Referring to FIG. 9, a gate dielectric layer GEL' between the sidewall of the vertical active pattern VAP and each of the gate patterns GSG, CG, and SSG horizontally extends to cover the bottom surface and the top surface of each of the gate patterns GSG, CG, and SSG. For example, all the tunnel dielectric layer, the charge storing layer, and blocking dielectric layer in the gate dielectric layer GEL' horizontally extend to cover the bottom surface and the top surface of each of the gate patterns GSG, CG, and SSG. According to an embodiment, the insulating patterns 110a and 110ua contact the sidewalls of the vertical active patterns VAP.

The embodiments described with reference to FIGS. 5 to 9 may be combined in various forms under a non-contradictable condition.

FIGS. 10A, 11A, 12A, 13A, 14A, 15A, and 16A are plan views illustrating a method of manufacturing a 3D semiconductor memory device according to an embodiment of the inventive concept, and FIGS. 10B, 11B, 12B, 13B, 14B, 15B, and 16B are cross-sectional views taken along lines I-I' of FIGS. 10A, 11A, 12A, 13A, 14A, 15A, and 16A, respectively.

Figure 10A:
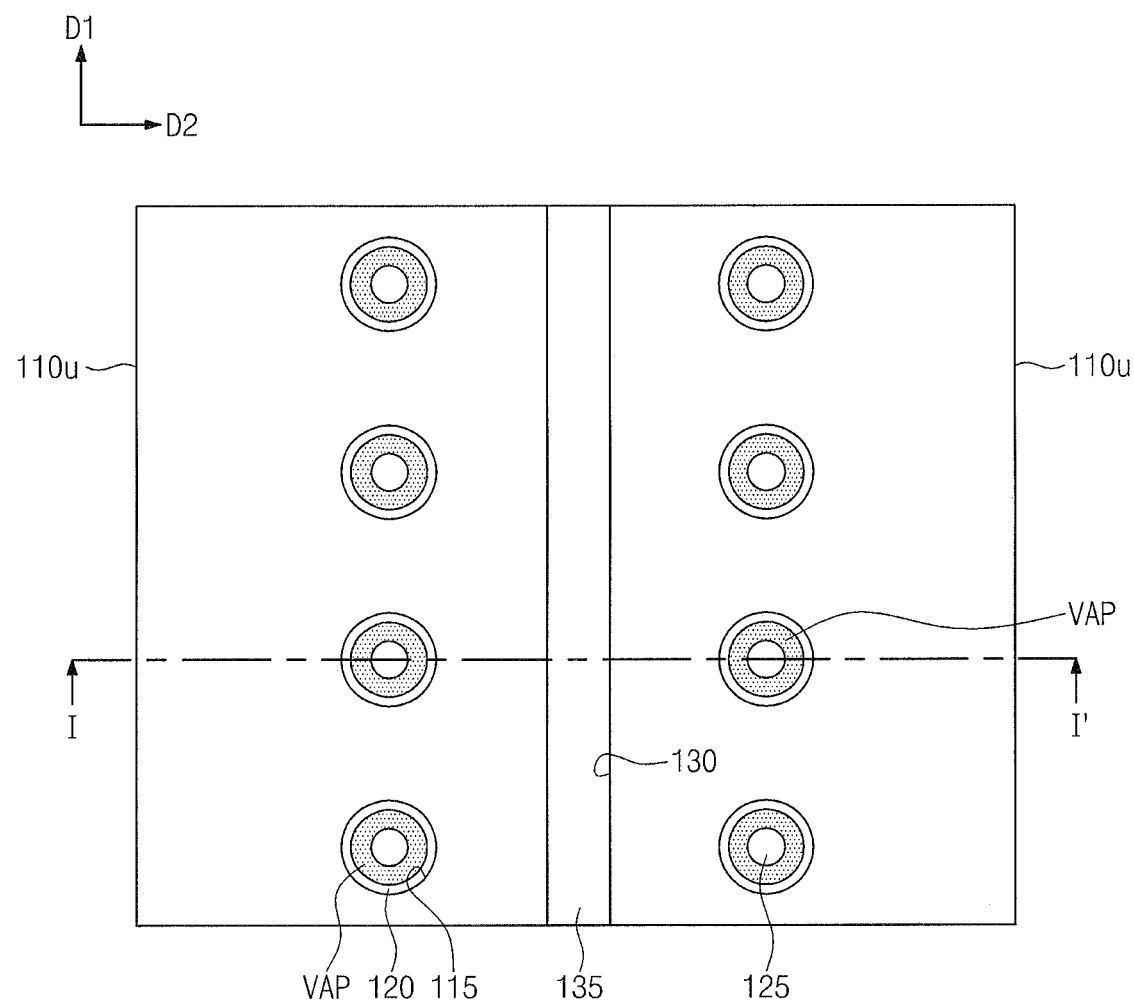
FIGS. 10A, 11A, 12A, 13A, 14A, 15A, and 16A are plan views illustrating a method of manufacturing a 3D semiconductor memory device according to an embodiment of the inventive concept.
Figure 10B:
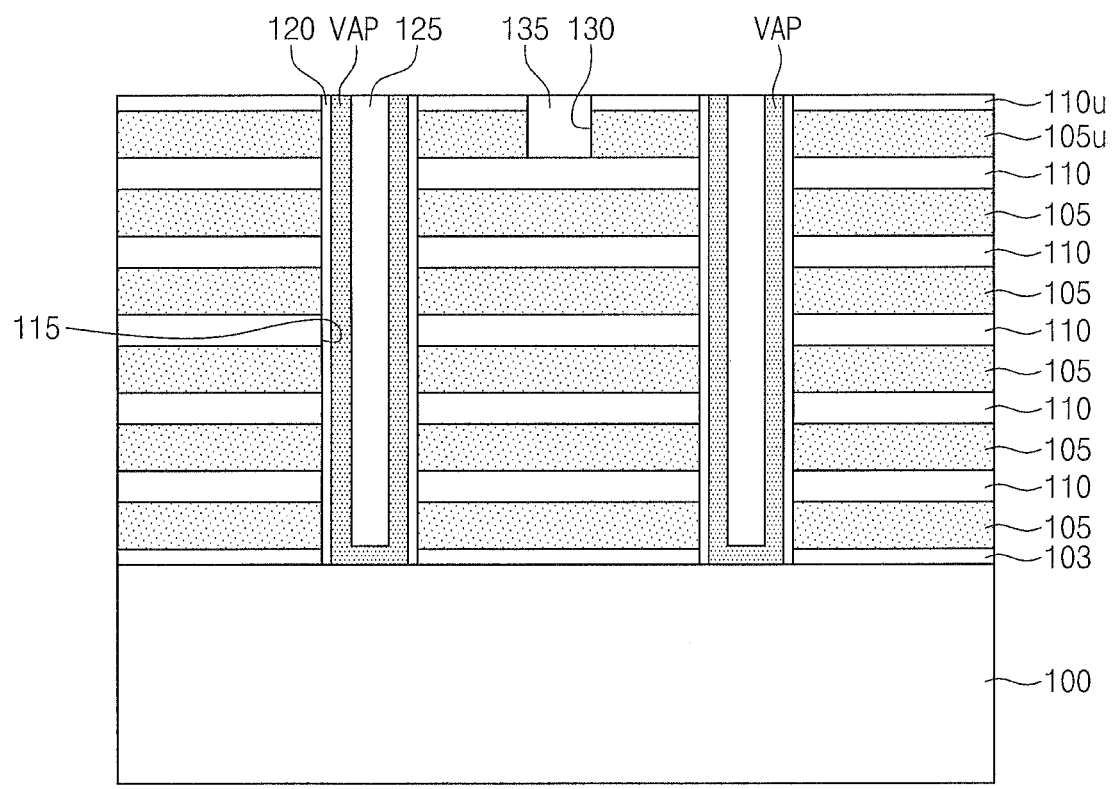
FIGS. 10B, 11B, 12B, 13B, 14B, 15B, and 16B are cross-sectional views taken along lines I-I' of FIGS. 10A, 11A, 12A, 13A, 14A, 15A, and 16A, respectively.

Referring to FIGS. 10A and 10B, sacrificial layers 105 and 105u and insulating layers 110 and 110u are alternately and repeatedly formed on a semiconductor substrate 100 doped with dopants of a first conductivity type. According to an embodiment, a buffer dielectric layer 103 is formed on the semiconductor substrate 100. According to an embodiment, the buffer dielectric layer 103 is formed on the semiconductor substrate 100 before the sacrificial layers 105 and 105u and the insulating layers 110 and 110u are formed. Alternately, the buffer dielectric layer 103 is omitted. The sacrificial layers 105 and 105u are formed of a material having an etch selectivity with respect to the insulating layers 110 and 110u and the buffer dielectric layer 103. For example, according to an embodiment, the insulating layers 110 and 110u and the buffer dielectric layer 103 incude oxide layers, and the sacrificial layers 105 and 105u include nitride layers. According to an embodiment, the dopants of the first conductivity type are provided into the semiconductor substrate 100 to form a well region. According to an embodiment, the dopants of the first conductivity type are provided in the semiconductor substrate 100 before the formation of the sacrificial layers 105 and 105u and the insulating layers 110 and 110u.

Holes 115 are formed to penetrate the insulating layers 110 and 110u, the sacrificial layers 105 and 105u, and the buffer dielectric layer 103. The holes 115 expose the semiconductor substrate 100. As illustrated in FIG. 10A, the holes 115 are two-dimensionally arranged to constitute rows and columns when viewed from a plan view. The columns are parallel to a first direction D1, and the rows are parallel to a second direction D2.

A first sub-layer 120 is conformally formed on the semiconductor substrate 100 having the holes 115. The first sub-layer 120 disposed on bottom surfaces of the holes 115 are removed to expose the semiconductor substrate 100. The first sub-layer 120 disposed on the uppermost insulating layer 110u of the insulating layers 110 and 110u is removed. A vertical active pattern VAP and a filling dielectric pattern 125 are formed in each of the holes 115. In an embodiment, the vertical active pattern VAP and the filling dielectric pattern 125 are formed by deposition processes and a planarization process. In an embodiment, the vertical active pattern VAP is formed by an epitaxial process, and the filling dielectric pattern 125 is omitted. In an embodiment, the vertical active pattern VAP is fanned by a solid phase epitaxial (SPE) process and a planarization process.

The uppermost insulating layer 110u and the uppermost sacrificial layer 105u of the sacrificial layers 105 and 105u are patterned to form a cutting trench 130. The cutting trench 130 is formed between the columns of vertical active patterns VAP in a plan view. A separation insulating pattern 135 is formed in the cutting trench 130. The cutting trench 130 and the separation insulating pattern 135 may be formed to separating string selection gate patterns which are formed by subsequent processes.

According to an embodiment, after the holes 115 and the vertical active patterns VAP are formed, the cutting trench 130 and the separation insulating pattern 135 are formed. Alternatively, after the cutting trench 130 and the separation insulating pattern 135 are formed, the holes 115 and the vertical active patterns VAP are formed.

A thickness of the uppermost insulating layer 110u is controlled by a planarization process for the formation of the vertical active patterns VAP.

Figure 11A:
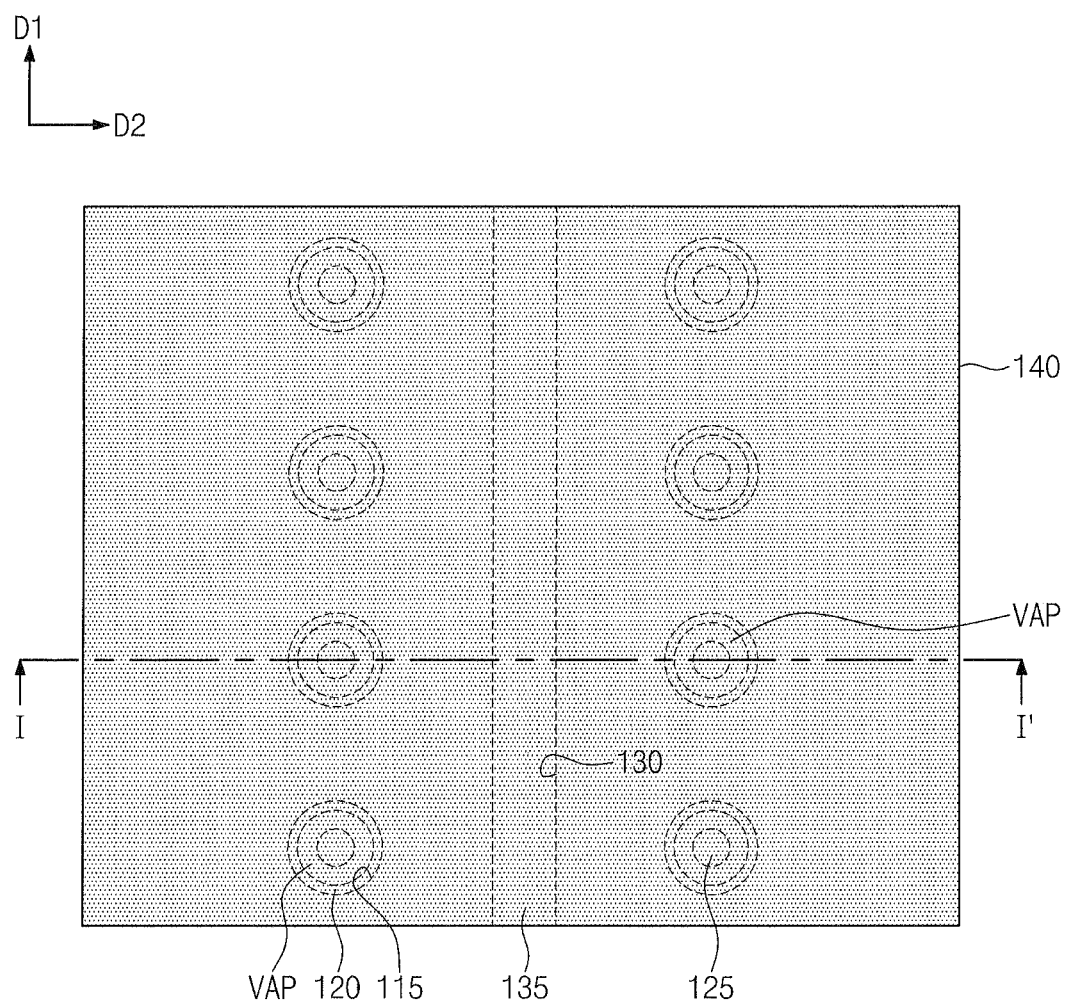
Figure 11B:
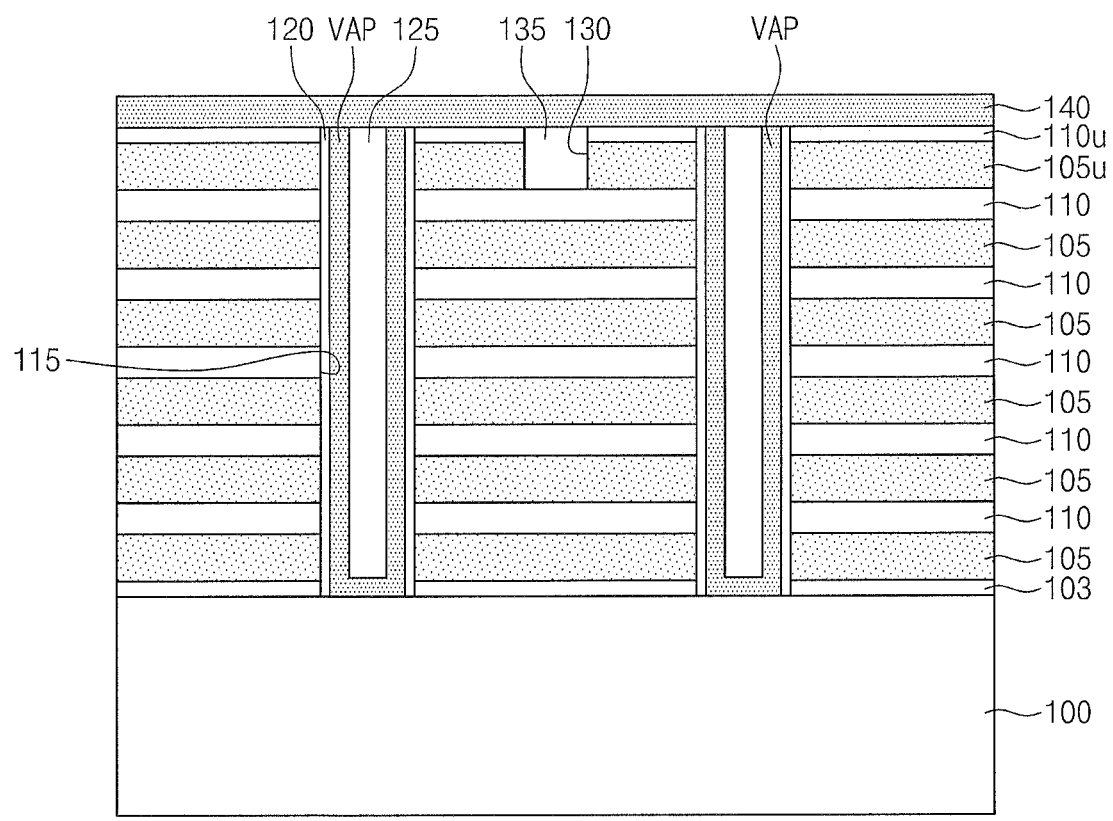

Referring to FIGS. 11A and 11B, a semiconductor layer 140 is foamed on the semiconductor substrate 100. The semiconductor layer 140 is disposed on the uppermost insulating layer 110u, the separation insulating pattern 130, and the vertical active patterns VAP. The semiconductor layer 140 contacts the vertical active patterns VAP. According to an embodiment, a surface treatment process is performed on the uppermost insulating layer 110u. According to an embodiment, the surface treatment process is performed before the semiconductor layer 140 is formed.

Figure 12A:
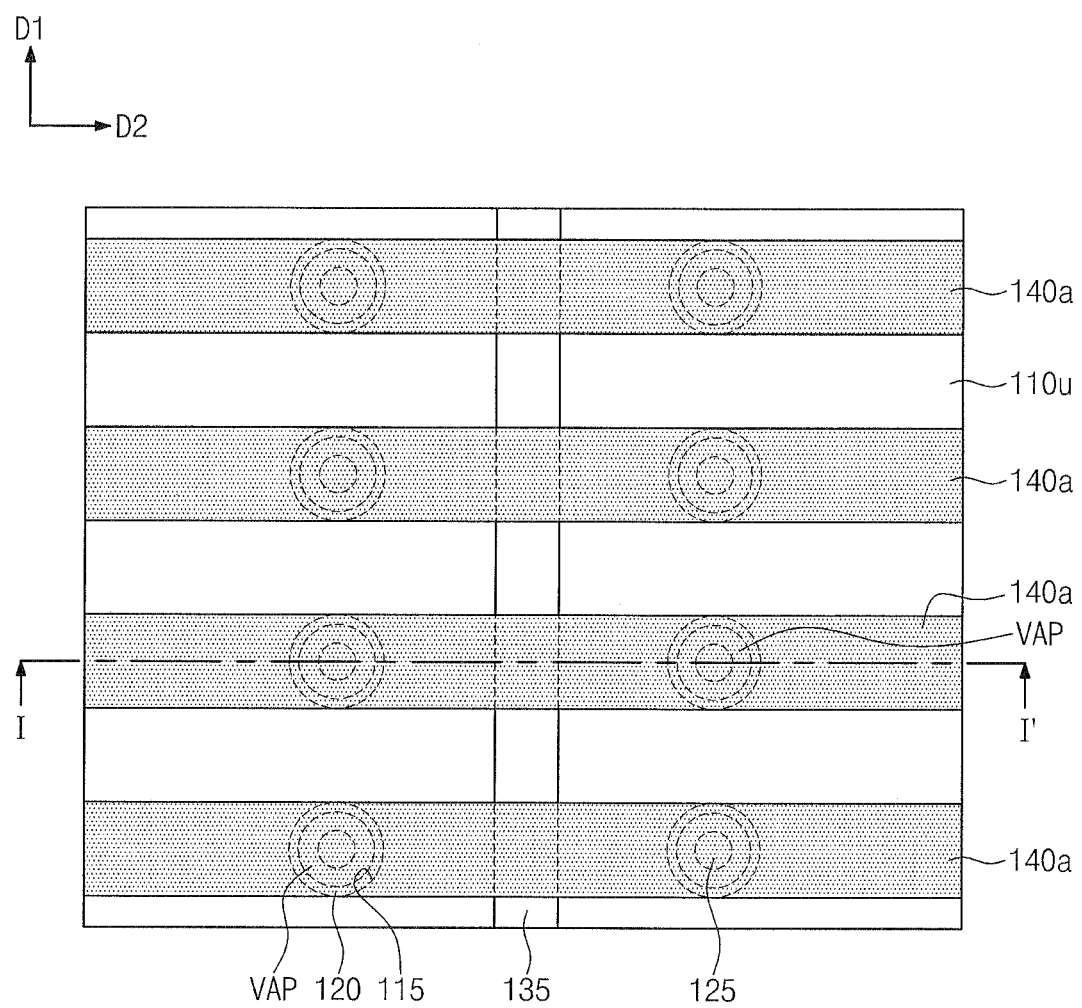
Figure 12B:
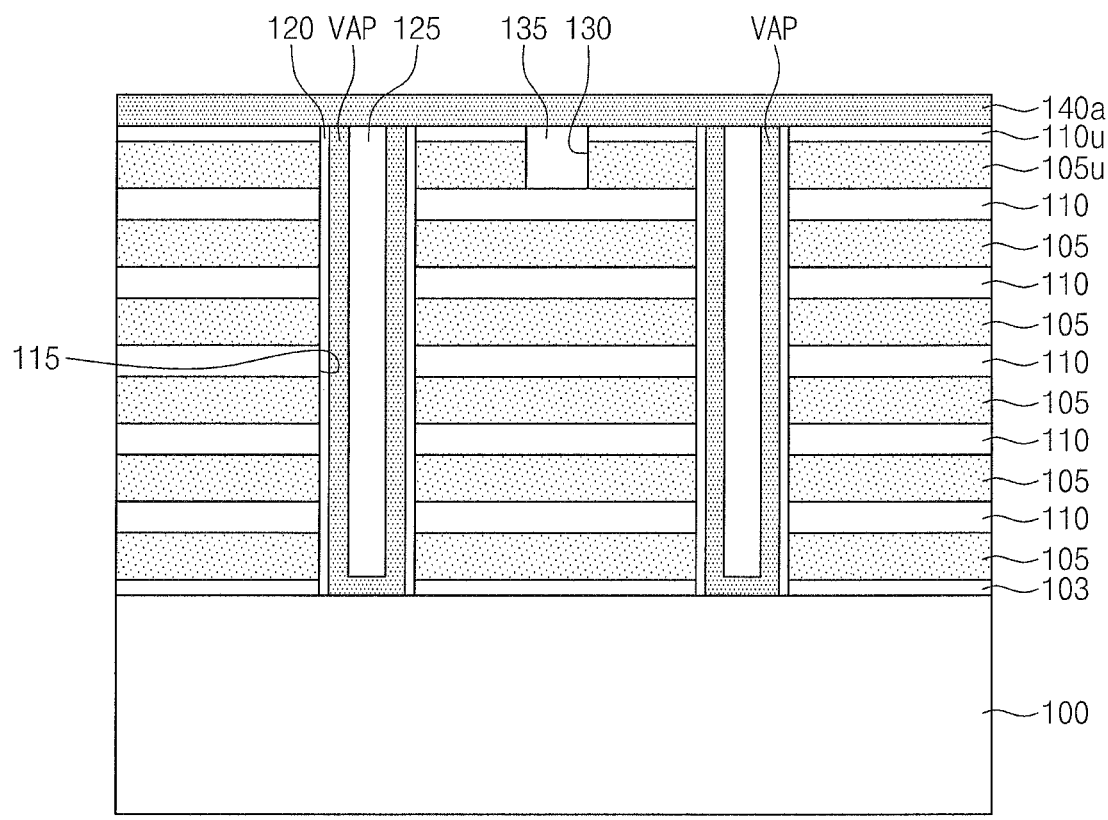

Referring to FIGS. 12A and 12B, the semiconductor layer 140 is patterned to form preliminary semiconductor patterns 140a. As illustrated in FIG. 12A, the preliminary semiconductor patterns 140a have line shapes extending in the second direction D2 in a plan view. Each of the preliminary semiconductor patterns 140a contacts the vertical active patterns VAP constituting each of the rows of vertical active patterns VAP. The preliminary semiconductor patterns 140a are separated from each other.

Figure 13A:
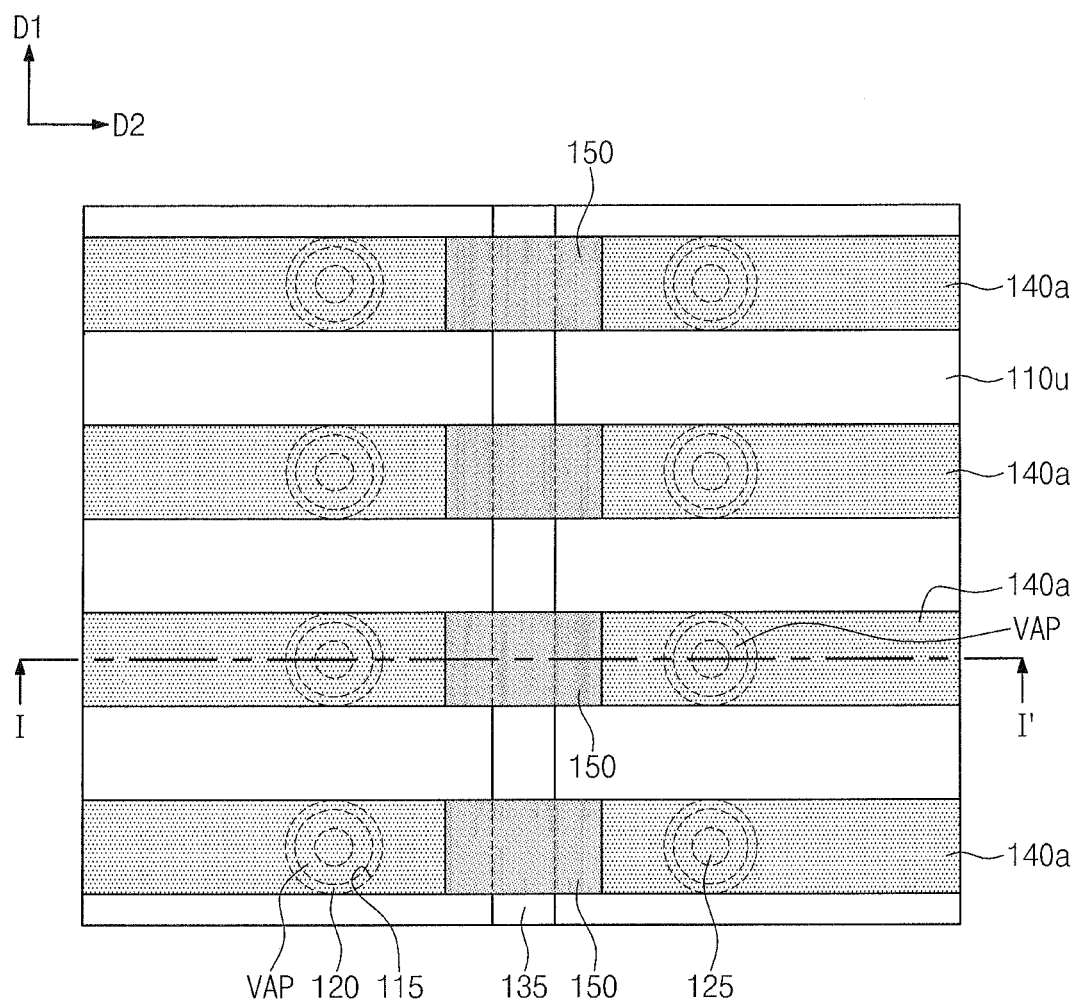
Figure 13B:
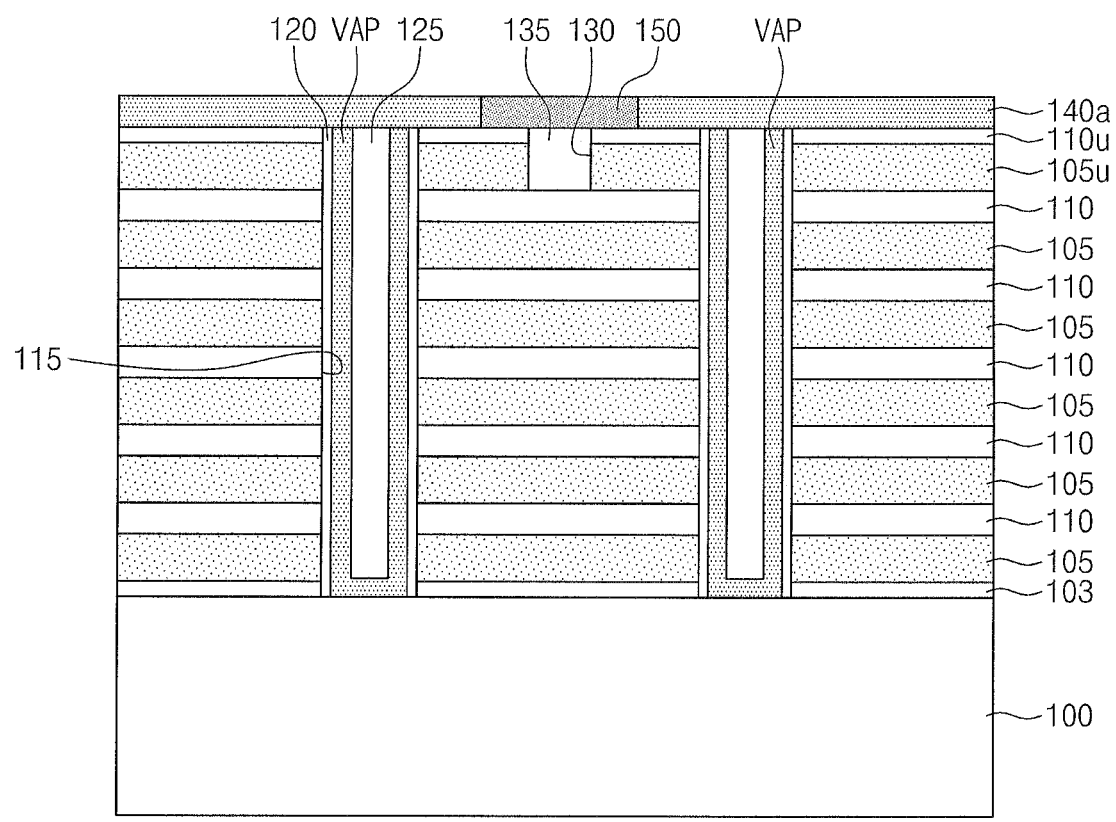

Referring to FIGS. 13A and 13B, dopants of a second conductivity type are provided into the preliminary semiconductor patterns 140a to foim string drain regions 150. According to an embodiment, after the preliminary semiconductor patterns 140a are formed, the string drain regions 150 may be formed.

Alternatively, the dopants of the second conductivity type are provided into the semiconductor layer 140 illustrated in FIGS. 11A and 11B to form a doped region extending in the first direction D1. Subsequently, the semiconductor layer 140 and the doped region are patterned to form the preliminary semiconductor patterns 140a and the string drain regions 150 in the preliminary semiconductor patterns 140a. According to an embodiment, the doped region is divided into the string drain regions 150.

Figure 14A:
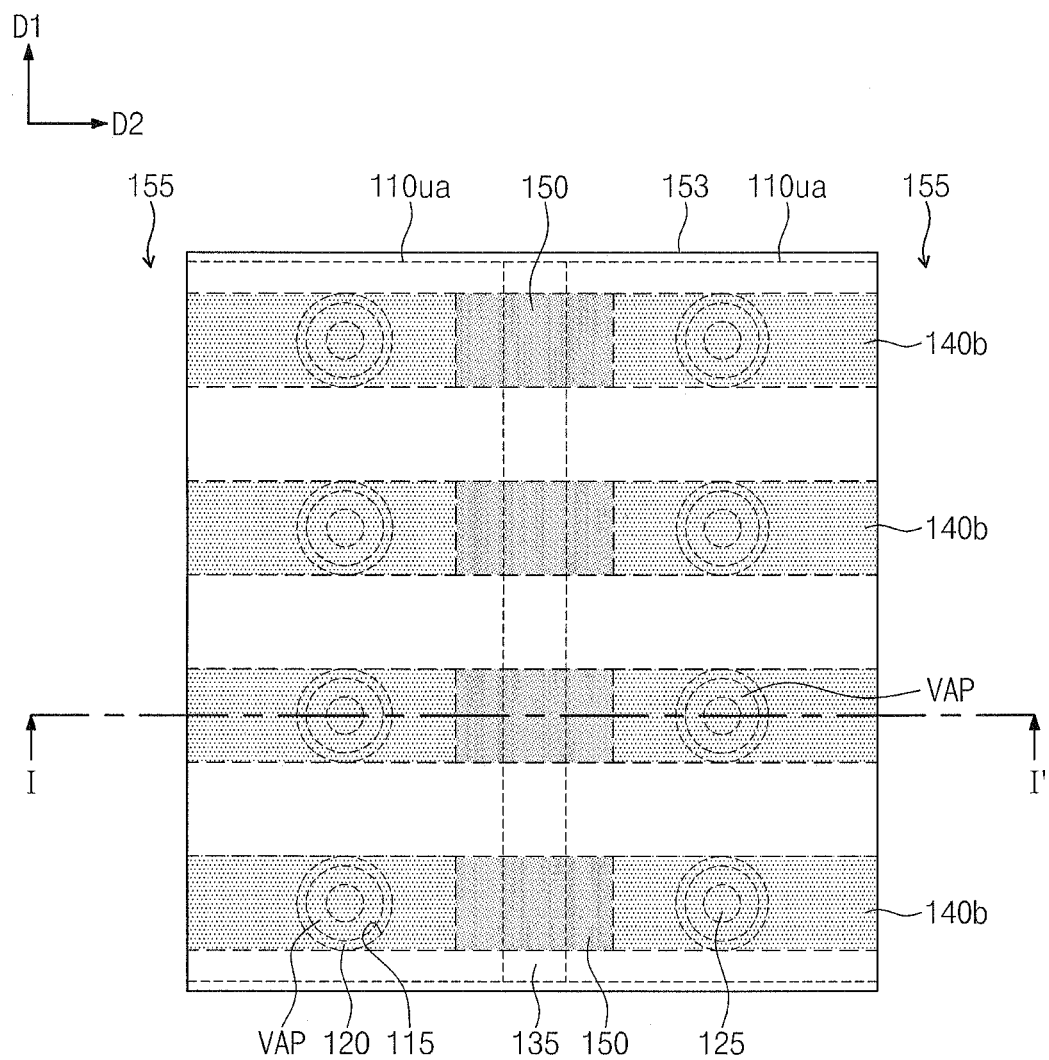
Figure 14B:
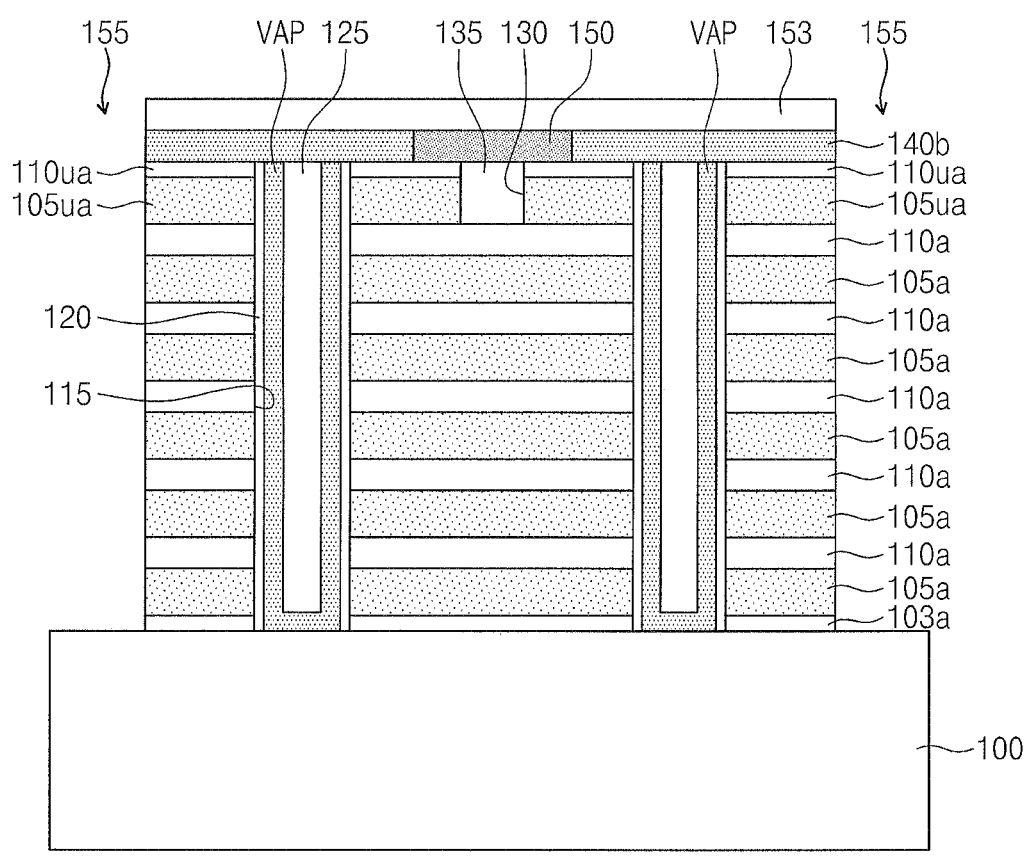

Referring to FIGS. 14A and 14B, a capping dielectric layer is formed on the semiconductor substrate 100 having the preliminary semiconductor patterns 140a and the string drain regions 150. The capping dielectric layer, the preliminary semiconductor patterns 140a, the insulating layers 110u and 110, and the sacrificial layers 105u and 105 are successively patterned to form device isolation trenches 155. Sacrificial patterns 105a and 105ua, insulating patterns 110a and 110ua, semiconductor patterns 140b, and a capping dielectric pattern 153 are formed between two device isolation trenches 155 adjacent to each other. The sacrificial patterns 105a and 105ua and the insulating patterns 110a and 110ua are alternately and repeatedly stacked. The cutting trench 130 and the separation insulating pattern 135 are disposed between the adjacent device isolation trenches 155. Thus, a plurality of the uppermost sacrificial patterns 105ua are formed between the adjacent device isolation trenches 155. The plurality of the uppermost sacrificial patterns 105ua are disposed at substantially the same level from a top surface of the semiconductor substrate 100.

When the device isolation trenches 155 are formed, the buffer dielectric layer 103 is also patterned to form a buffer dielectric pattern 103a.

Figure 15A:
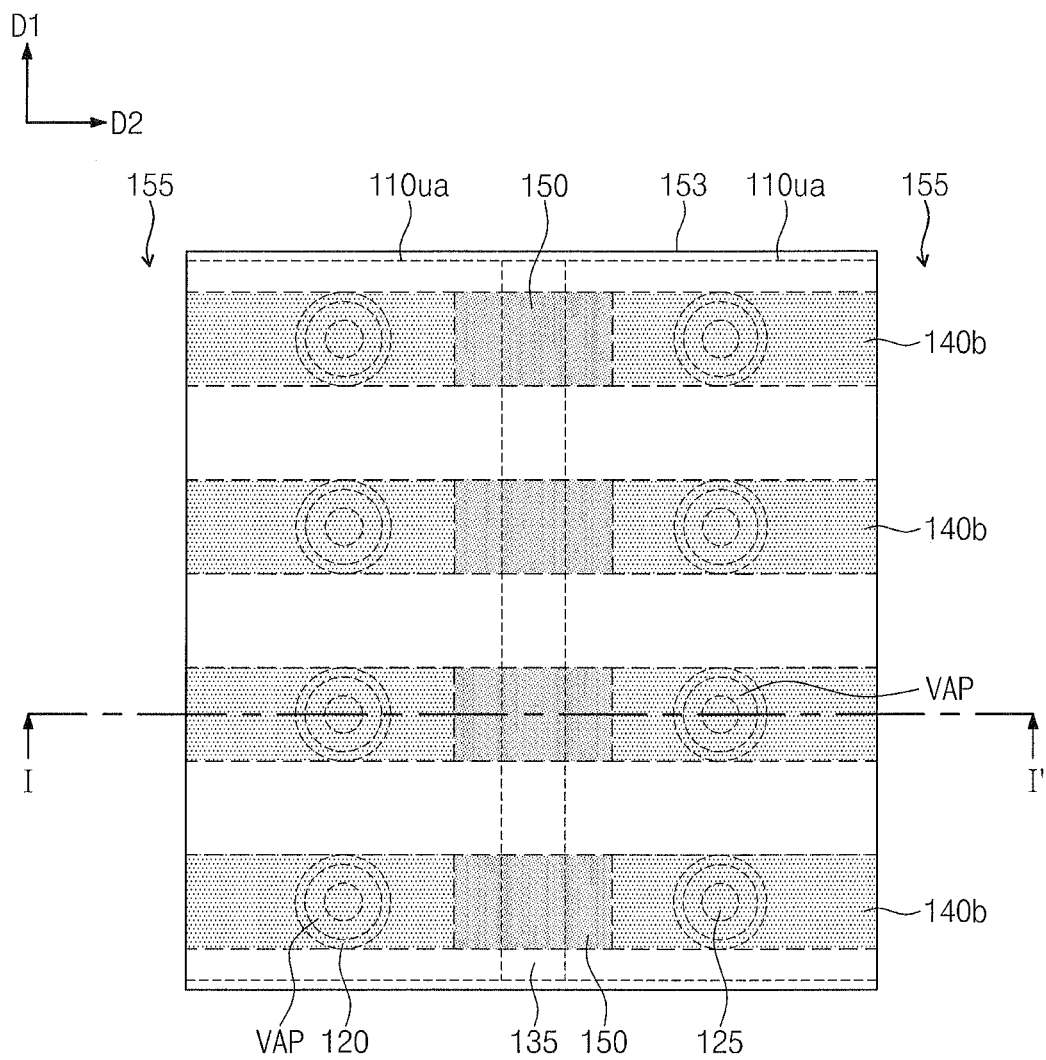
Figure 15B:
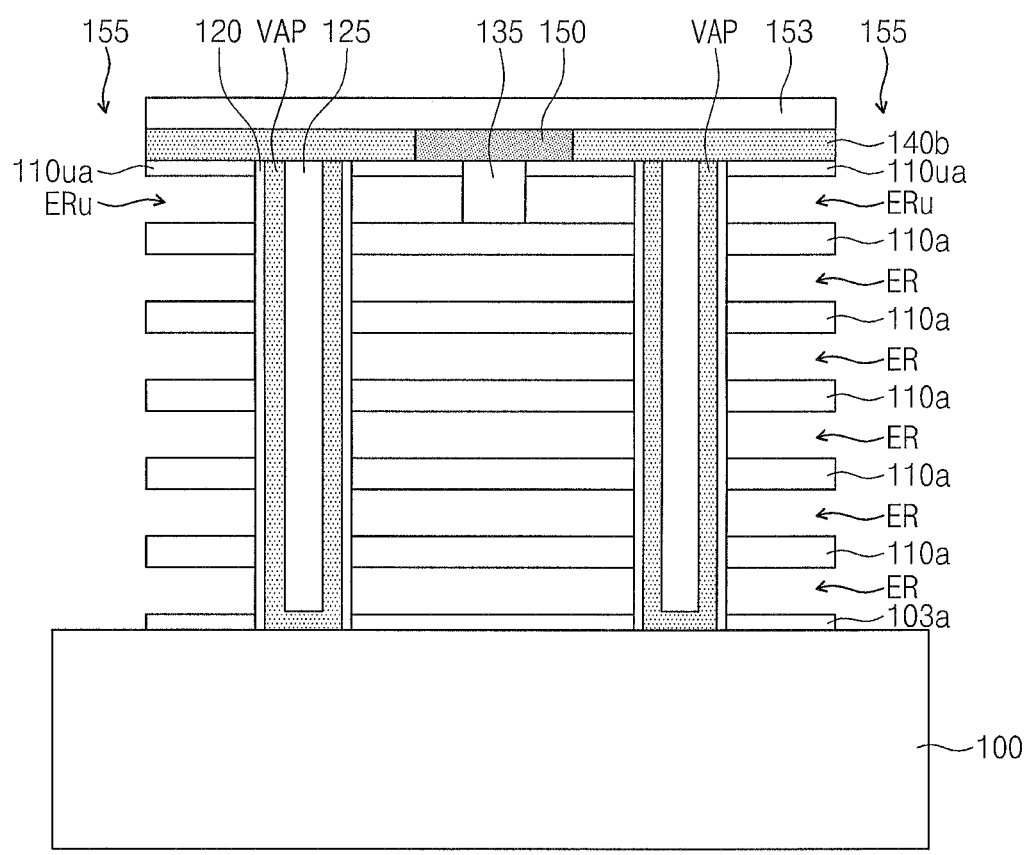

Referring to FIGS. 15A and 15B, the sacrificial patterns 105a and 105ua exposed by the device isolation trenches 155 are removed to form empty regions ER and ERu. First sides of the uppermost empty regions ERu adjacent to the separation insulating pattern 135 are closed by the separation insulating pattern 135. Second sides of the uppermost empty regions ERu adjacent to the device isolation trenches are opened. Two opposite sides of each of the empty regions ER under the uppermost empty region ERu are opened.

Figure 16A:
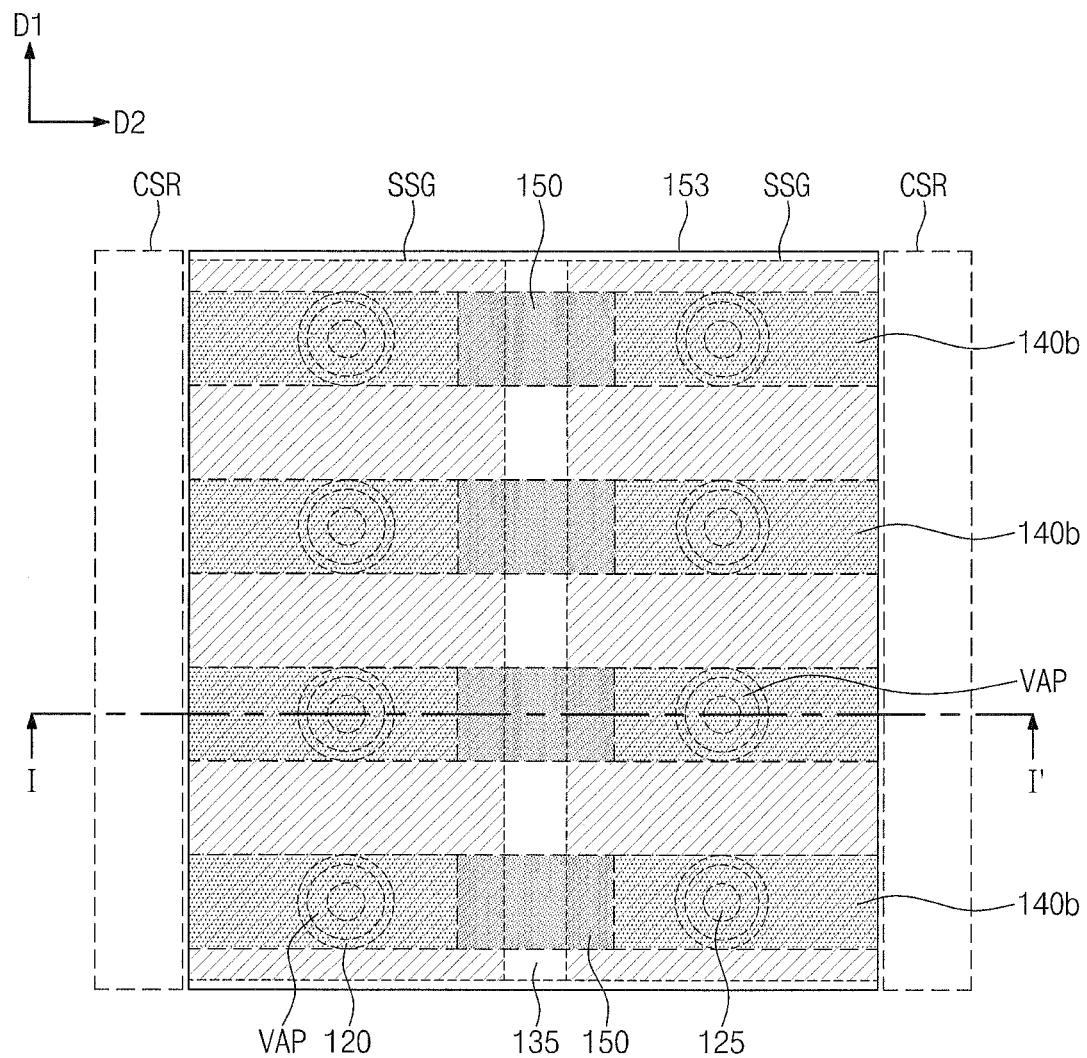
Figure 16B:
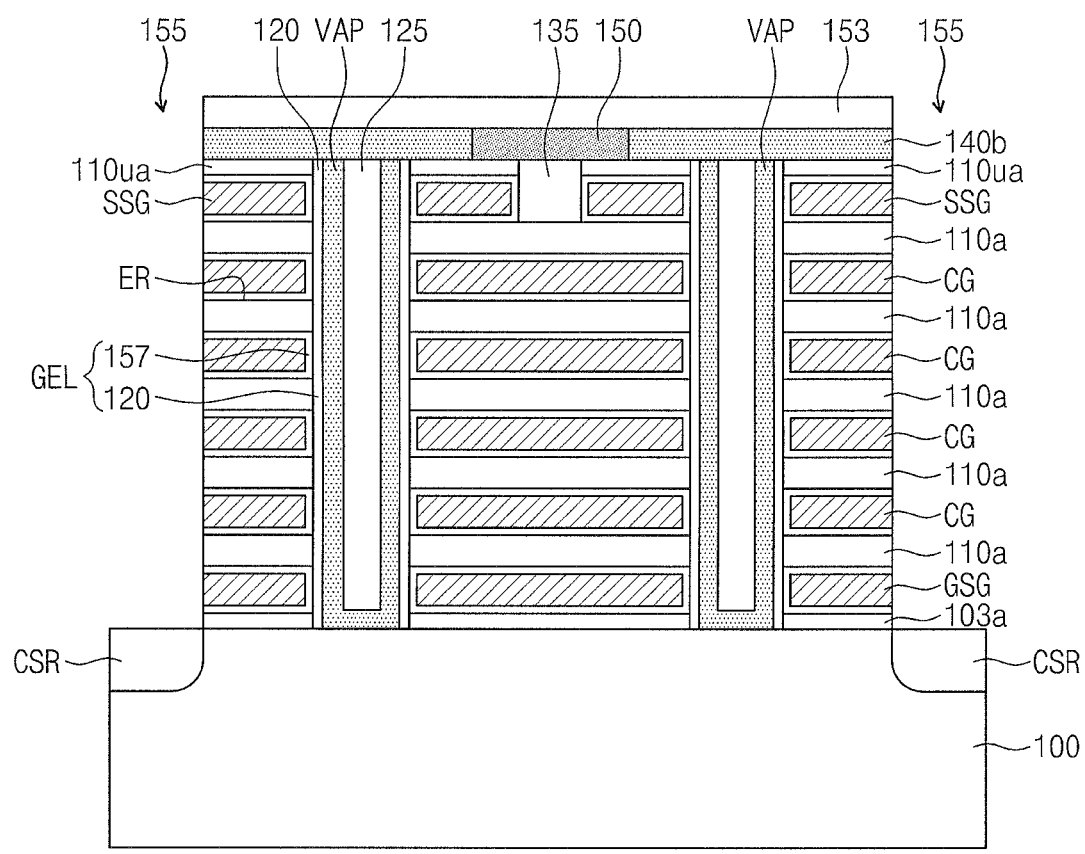

Referring to FIGS. 16A and 16B, a second sub-layer 157 may be conformally formed on the semiconductor substrate 100 having the empty regions ER and ERu. A conductive layer may be formed on the semiconductor substrate 100 having the second sub-layer 157 to fill the empty regions ER and ERu.

A conductive layer outside the empty regions ER and ERu is removed to faun gate patterns GSG, CG, and SSG in the empty regions ER and ERu, respectively. According to an embodiment, the second sub-layer 157 outside the empty regions ER and ERu are removed or remain. Forming the gate patterns GSG, CG, and SSG by using the sacrificial patterns 105a and 105ua and the empty regions ER and ERu is defined as 'a replacement process'.

Dopants of the second conductivity type are provided into the semiconductor substrate 100 under the device isolation trenches 155 to form common source regions CSR. According to an embodiment, the common source regions CSR is formed after the gate patterns GSG, CG, and SSG are formed or before the empty regions ER and ERu are formed.

Subsequently, the device isolation patterns 155 of FIGS. 1 to 3 are formed in the device isolation trenches 155, respectively. Subsequently, the interlayer dielectric layer 165, the contact plugs 170, and bit lines BL of FIGS. 1 to 3 are formed. Thus, it is possible to realize the 3D semiconductor memory device illustrated in FIGS. 1 to 3 and 4A to 4C.

According to an embodiment, the filling dielectric pattern 125 is omitted. Thus, it is possible to realize the 3D semiconductor memory device illustrated in FIG. 5.

Next, a method of manufacturing the 3D semiconductor memory device illustrated in FIG. 6 will be described with reference to drawings.

Figure 17A:
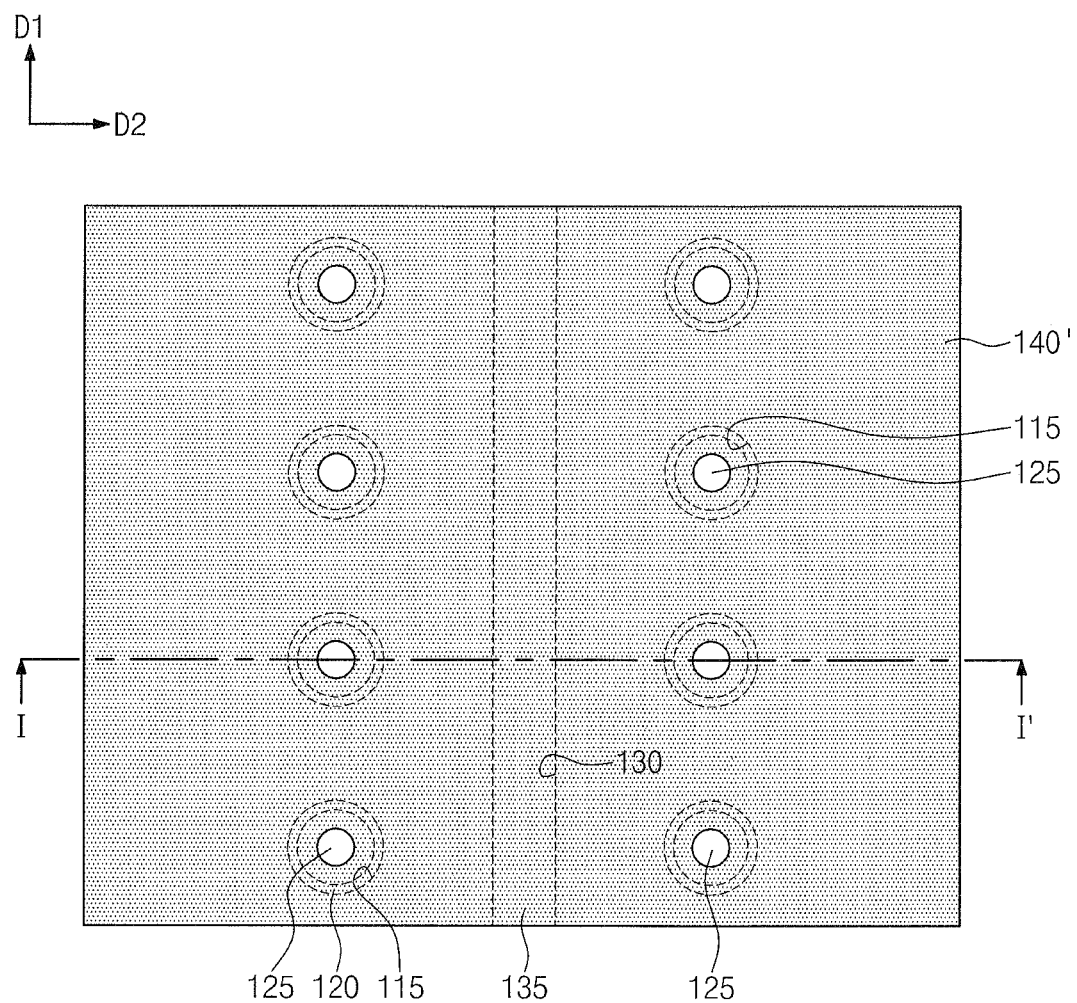
FIGS. 17A and 18A are plan views illustrating a method of manufacturing a 3D semiconductor memory device as shown in FIG. 6.
Figure 17B:
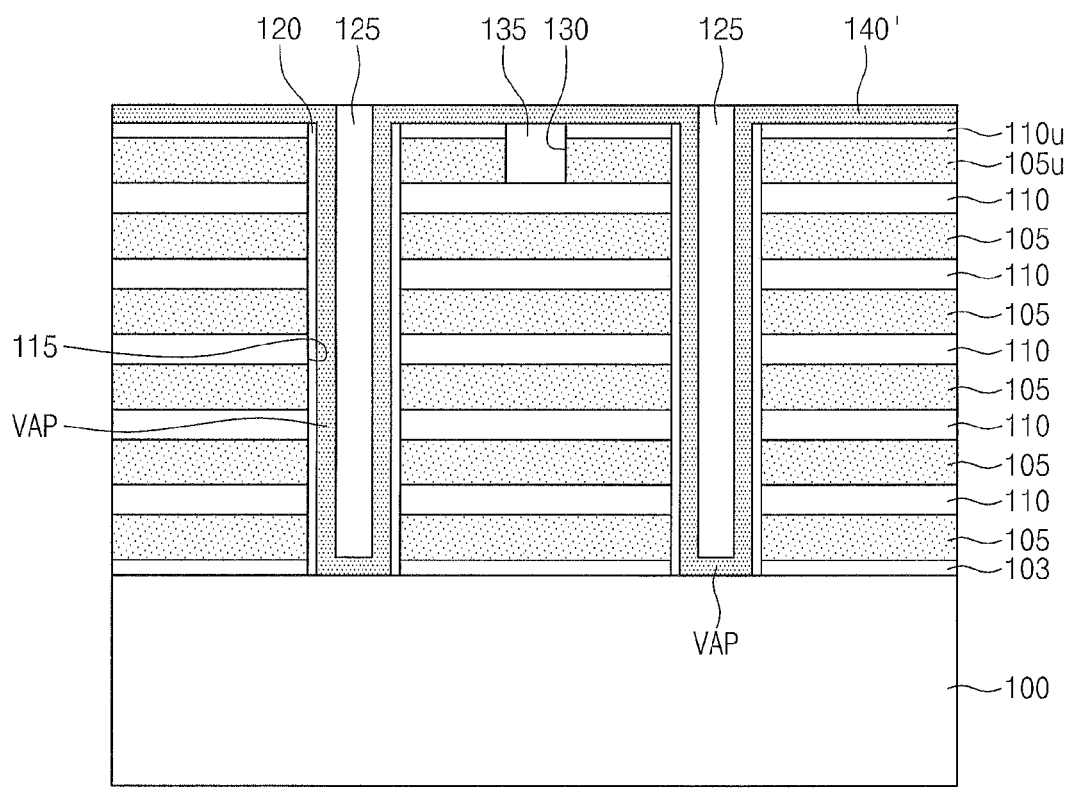
FIGS. 17B and 18B are cross-sectional views taken along lines I-I' of FIGS. 17A and 18A, respectively.
Figure 18A:
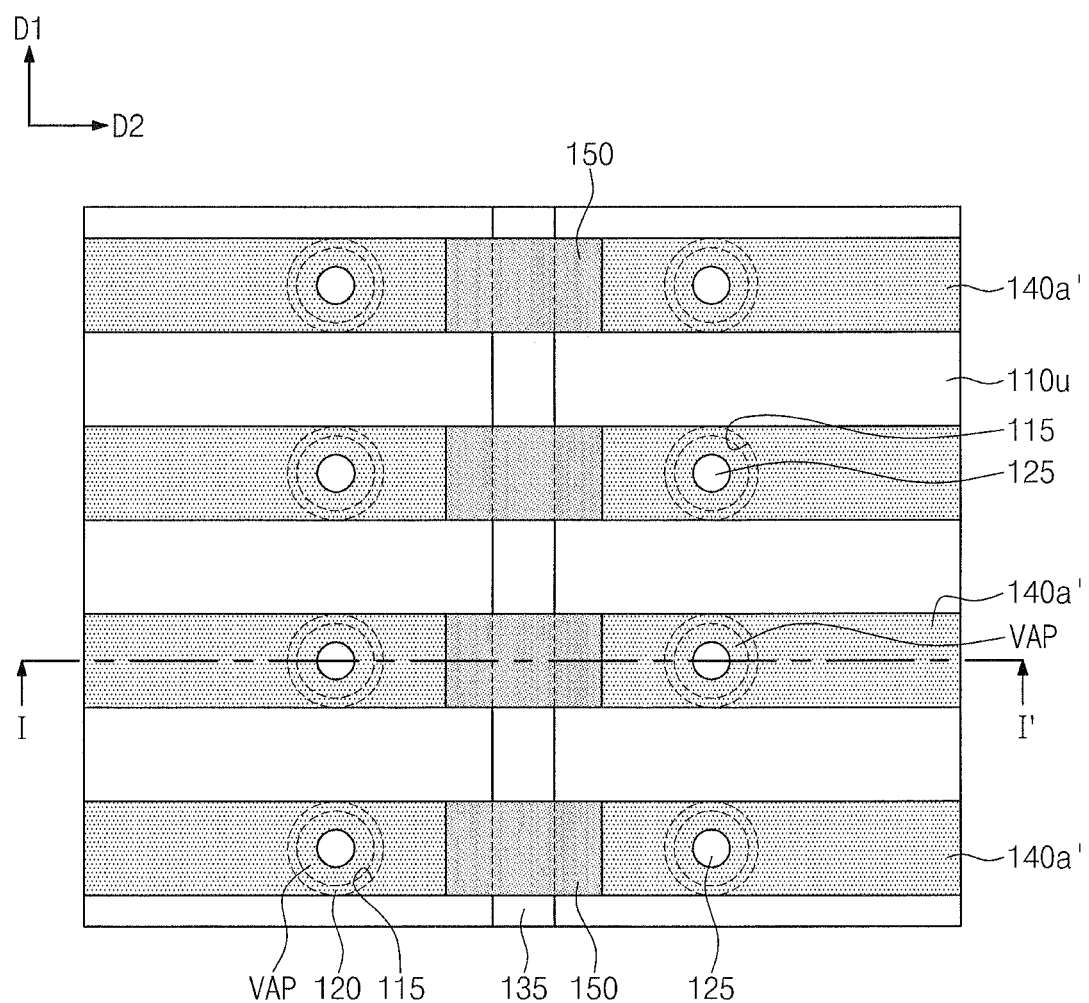
Figure 18B:
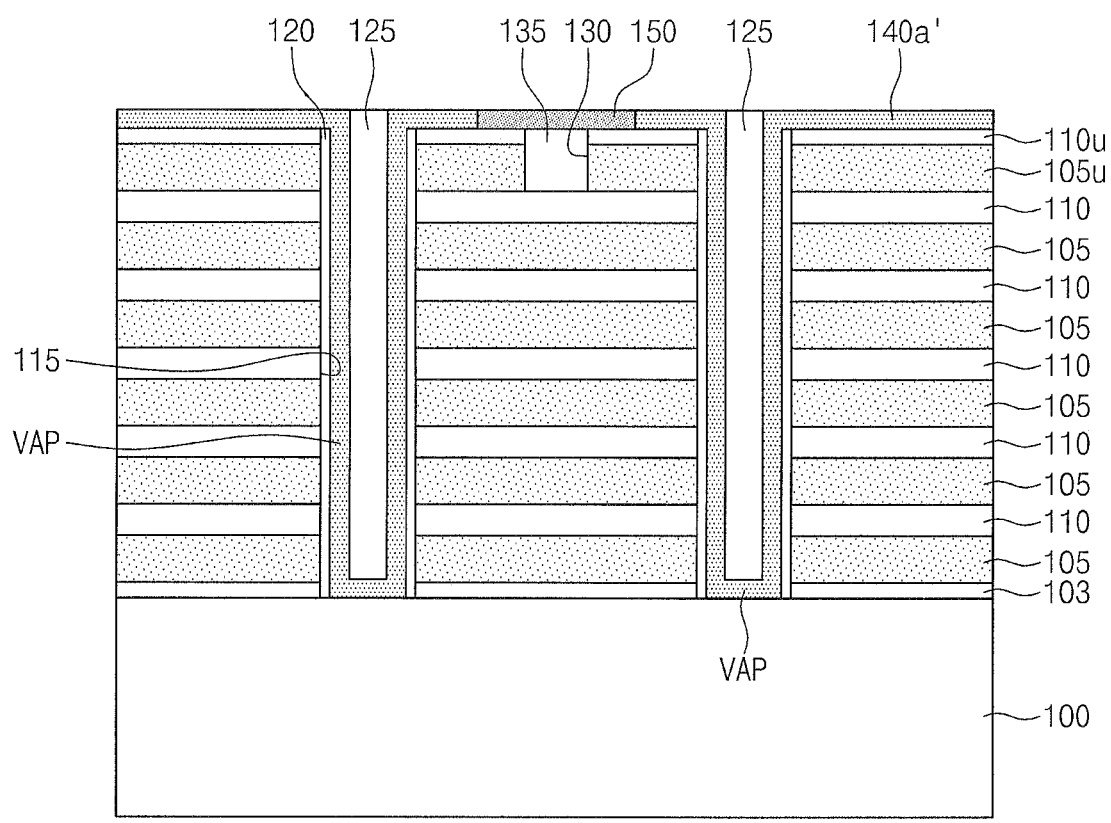

FIGS. 17A and 18A are plan views illustrating a method of manufacturing a 3D semiconductor memory device as shown in FIG. 6, and FIGS. 17B and 18B are cross-sectional views taken along lines I-I' of FIGS. 17A and 18A, respectively.

Referring to FIGS. 17A and 17B, a semiconductor layer 140' is conformally formed on the semiconductor substrate 100 having the holes 115 and the first sub-layer 120. Thus, vertical active patterns VAP are defined in the holes 115. A filling dielectric layer is formed on the semiconductor layer 140' to fill the holes 115. Subsequently, the filling dielectric layer is planarized until the semiconductor layer 140' is exposed, thereby forming filling dielectric patterns 125 in the holes 115, respectively.

Referring to FIGS. 18A and 18B, the semiconductor layer 140' disposed on the uppermost insulating layer 110u is patterned to form preliminary semiconductor patterns 140a'. Dopants of the second conductivity type are provided into the preliminary semiconductor patterns 140a' to form string drain regions 150. Alternatively, before the semiconductor layer 140' is patterned, a doped region of the second conductivity type is formed in the semiconductor layer 140'. The semiconductor layer 140' and the doped region are then patterned to form the preliminary semiconductor patterns 140a' and the string drain regions 150.

Subsequently, the processes described with reference to FIGS. 14A, 15A, and 16A and 14B, 15B, and 16B are performed. Thus, it is possible to realize the 3D semiconductor memory device illustrated in FIG. 6.

According to an embodiment, the vertical active patterns VAP and the semiconductor patterns 140b' are formed using a single semiconductor layer 140'.

According to the manufacturing method described with reference to FIGS. 10A to 16A and 10B to 16B, after the semiconductor patterns 140b are formed, the gate patterns GSG, CG, and SSG are formed. Alternatively, after the gate patterns GSG, CG, and SSG are formed, the semiconductor patterns are formed. This are described with reference to the drawings.

Figure 19A:
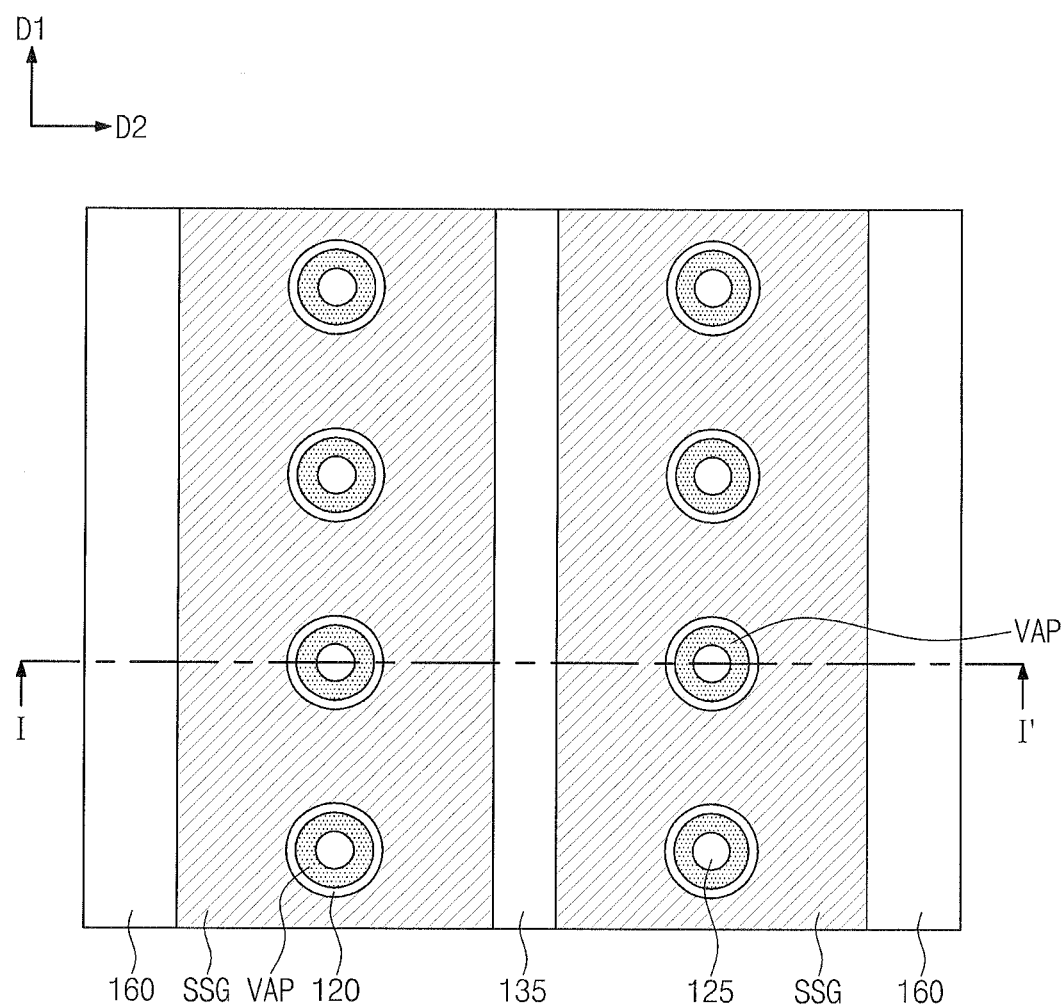
FIGS. 19A and 20A are plan views illustrating a method of manufacturing a 3D semiconductor memory device as shown in FIG. 7.
Figure 19B:
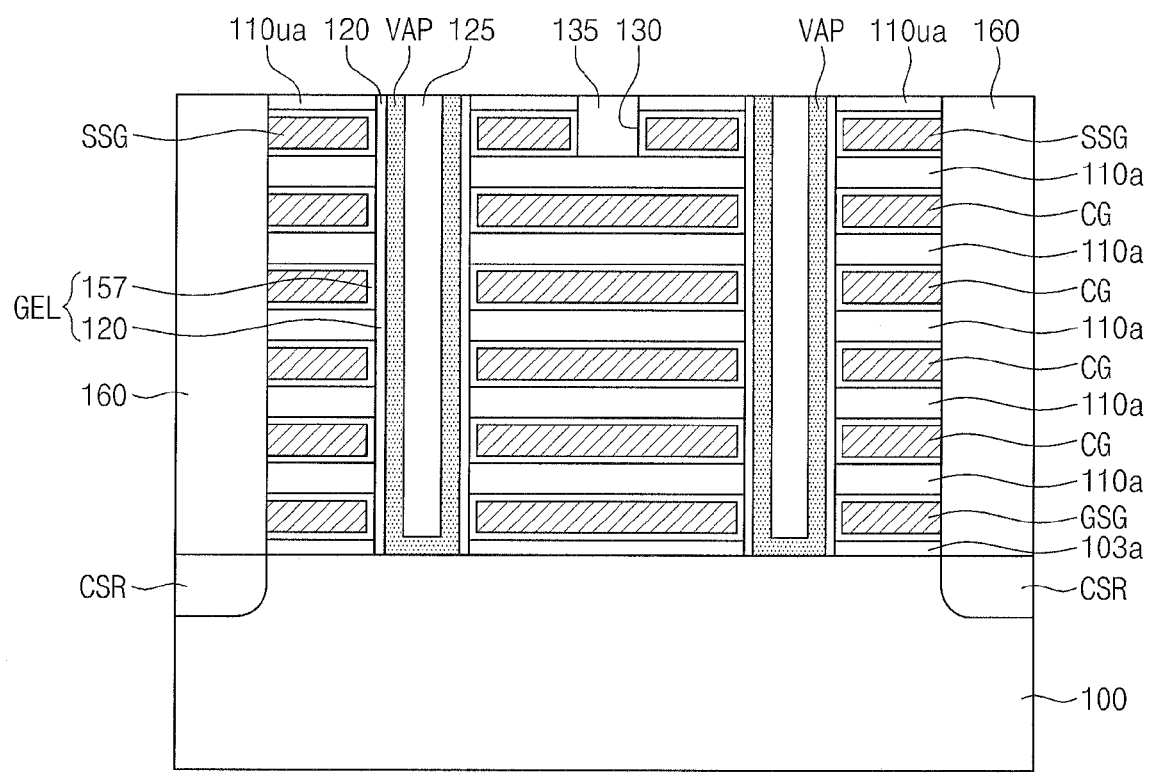
FIGS. 19B and 20B are cross-sectional views taken along lines I-I' of FIGS. 19A and 20A, respectively.
Figure 20A:
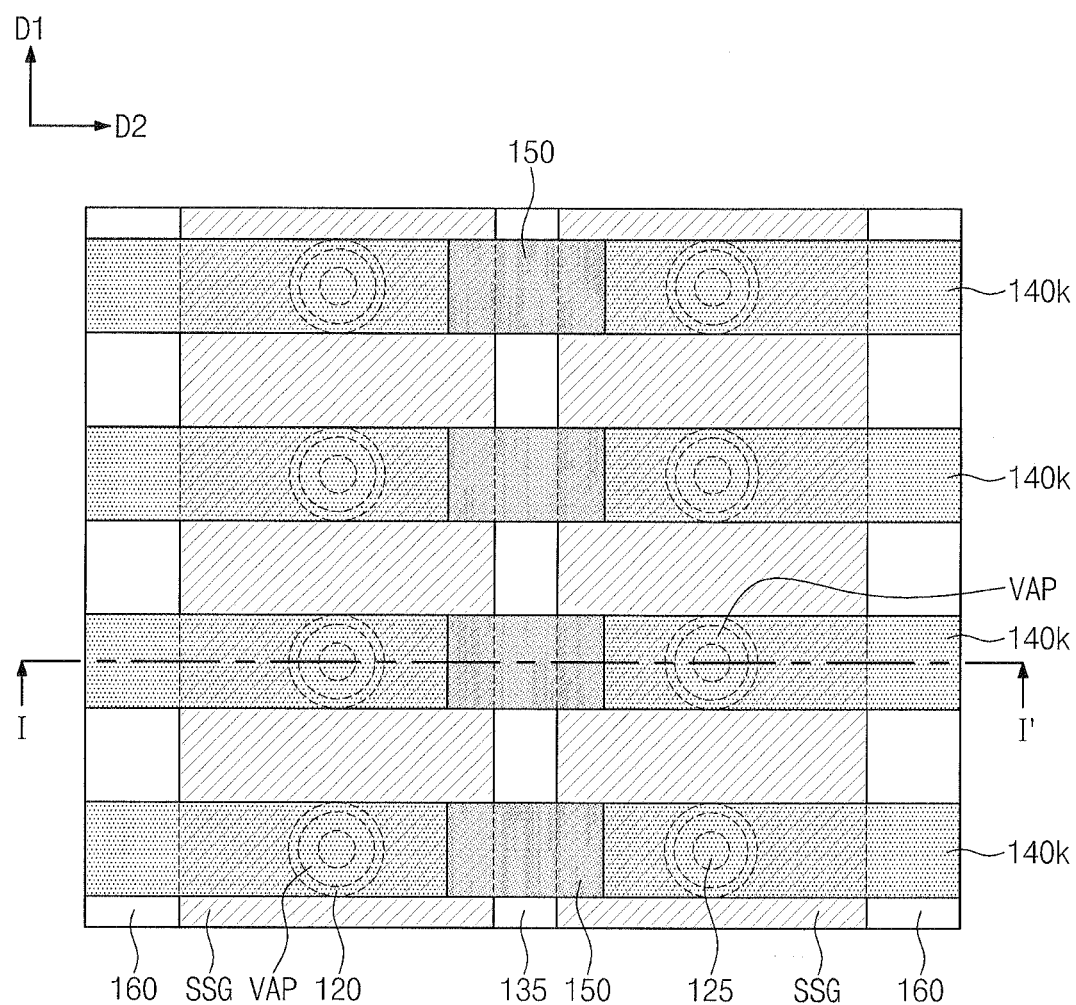
Figure 20B:
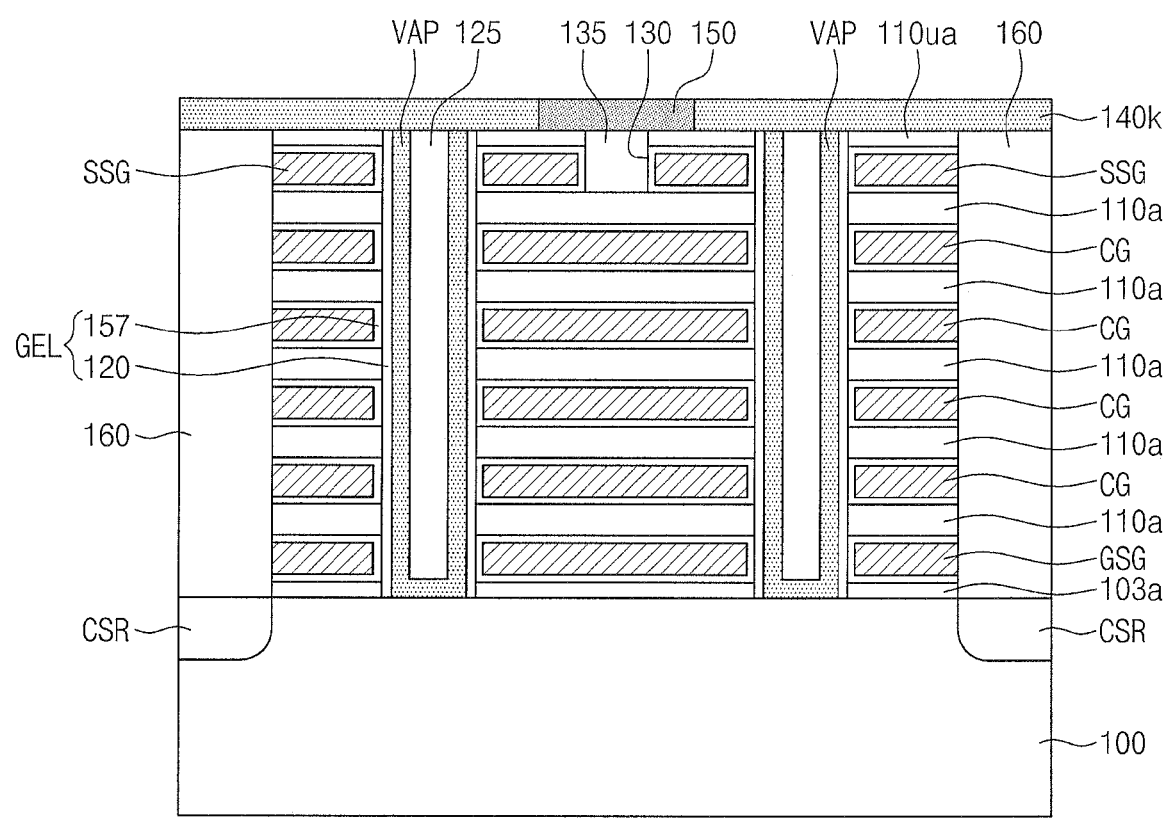

FIGS. 19A and 20A are plan views illustrating a method of manufacturing a 3D semiconductor memory device as shown in FIG. 7, and FIGS. 19B and 20B are cross-sectional views taken along lines I-I' of FIGS. 19A and 20A, respectively.

The manufacturing method illustrated in FIGS. 10A to 16A and 10B to 16B except the formation processes of the semiconductor layer 140, the preliminary semiconductor patterns 140a, the string drain regions 150, and the semiconductor patterns 140b is performed to form the vertical active patterns VAP, the gate structure, the common source regions CSR, and the device isolation patterns 160 illustrated in FIGS. 19A and 19B. The gate structure includes the gate patterns GSG, CG, and SSG and the insulating patterns 110a and 110ua which are alternately and repeatedly stacked.

Referring to FIGS. 20A and 20B, a semiconductor layer is sequentially formed on an entire surface of the semiconductor substrate 100. The semiconductor layer contacts top ends of the vertical active patterns VAP. The semiconductor layer is patterned to form semiconductor patterns 140k extending in the first direction D1. String drain regions 150 doped with dopants of the second conductivity type are formed in the semiconductor patterns 140k. Alternatively, after a doped region of the second conductivity type is formed in the semiconductor layer, the semiconductor layer and the doped region are patterned to the semiconductor patterns 140k and the string drain regions 150.

Subsequently, the interlayer dielectric layer 165, the contact plugs 170, and the bit lines BL of FIG. 7 are formed. Thus, it is possible to realize the 3D semiconductor memory device of FIG. 7.

Positions of the holes 116 are determined as positions of the vertical active patterns VAP illustrated in FIG. 8. Thus, it is possible to realize the 3D semiconductor memory device of FIG. 8.

In the manufacturing method illustrated in FIGS. 10A, 11A, 12A, 13A, 14A, 15A, and 16A and 10B, 11B, 12B, 13B, 14B, 15B, and 16B, the formation of the first sub-layer 120 is omitted. According to an embodiment, the formation process of the second sub-layer 157 is replaced with a formation process of the gate dielectric layer GEL' of FIG. 9. Thus, it is possible to realize the 3D semiconductor memory device illustrated in FIG. 9.

Figure 21:
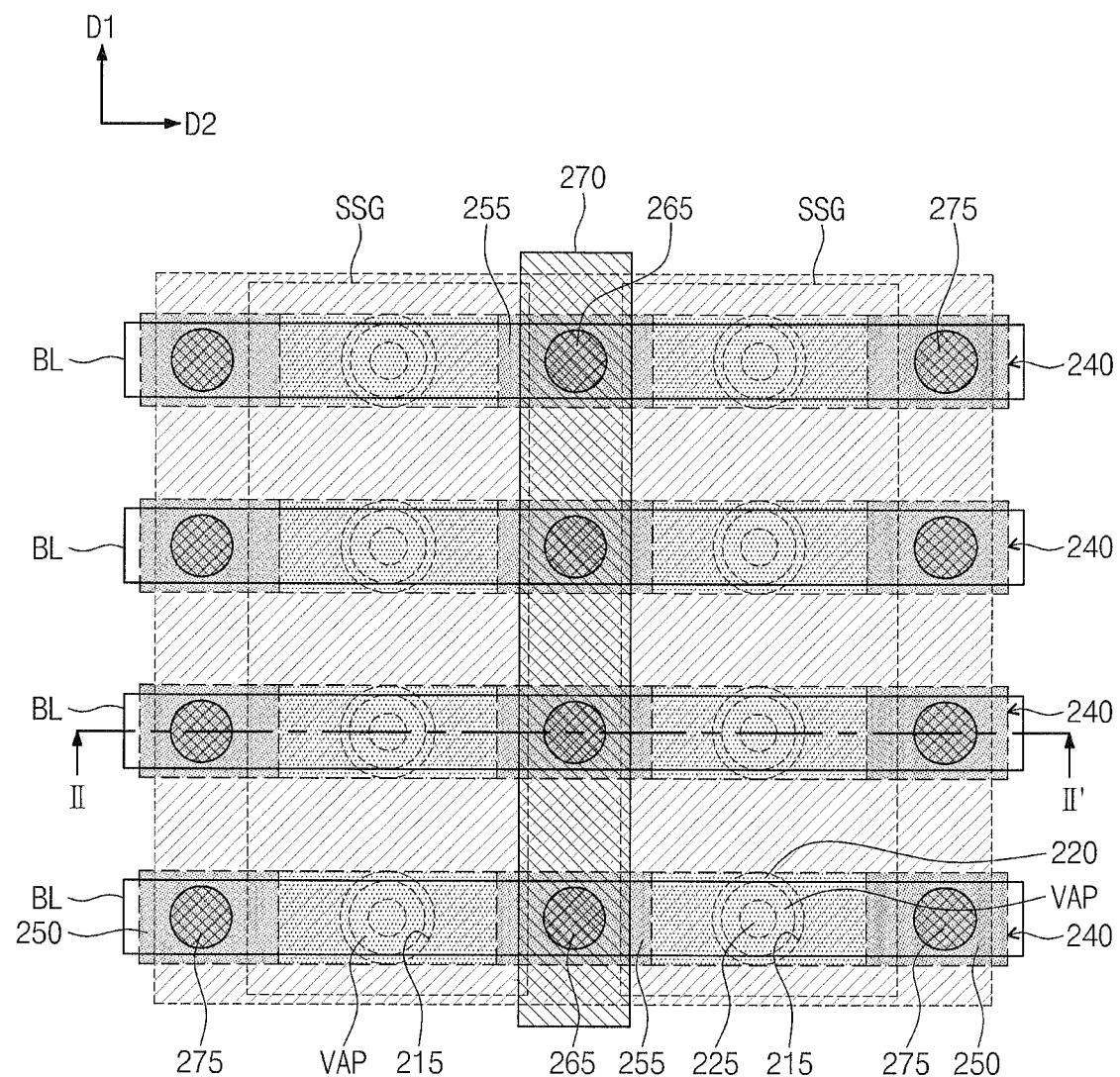
FIG. 21 is a plan view illustrating a 3D semiconductor memory device according to an embodiment of the inventive concept.
Figure 22:
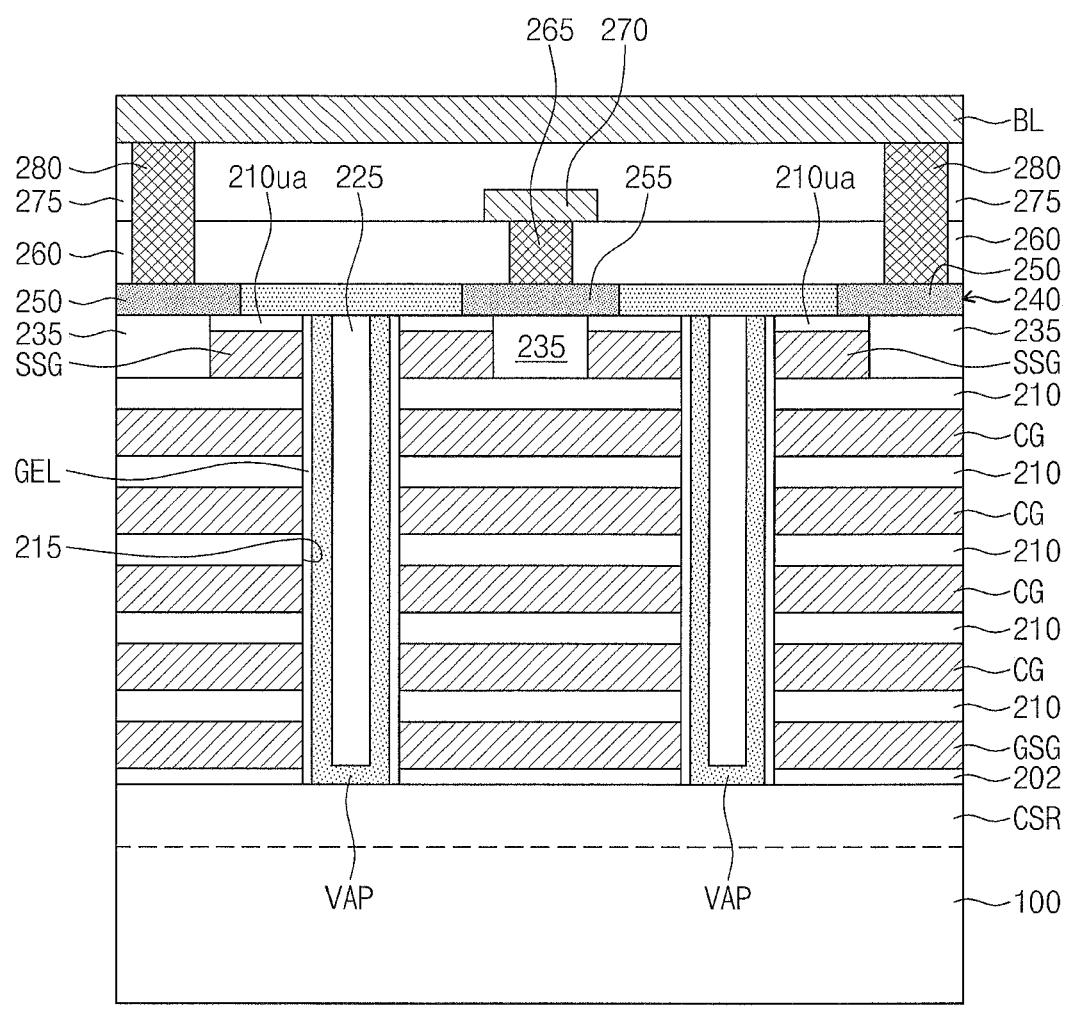
FIG. 22 is a cross-sectional view taken along a line II-II' of FIG. 21.

FIG. 21 is a plan view illustrating a 3D semiconductor memory device according to an embodiment of the inventive concept, and FIG. 22 is a cross-sectional view taken along a line II-II' of FIG. 21.

Referring to FIGS. 21 and 22, a common source region CSR is disposed in a semiconductor substrate 200. The semiconductor substrate 200 is doped with dopants of a first conductivity type, and the common source region CSR is doped with dopants of a second conductivity type. A gate structure is disposed on the common source region CSR. The gate structure includes insulating patterns 202, 210, and 210ua and gate patterns GSG, CG, and SSG which are alternately and repeatedly stacked.

The lowermost insulating pattern 202 is disposed between the lowermost gate pattern GSG and the common source region CSR, and the uppermost insulating pattern 210ua is disposed on the uppermost gate pattern SSG.

The lowermost gate pattern GSG corresponds to a ground selection gate pattern GSG, and the uppermost gate pattern SSG corresponds to a string selection gate pattern SSG. A plurality of cell gate patterns CG are sequentially stacked between the ground selection gate pattern GSG and the string selection gate pattern SSG. A plurality of the string selection gate patterns SSG are disposed on the uppermost cell gate pattern CG. The plurality of the string selection gate patterns SSG are disposed at substantially the same level from a top surface of the semiconductor substrate 200.

As illustrated in FIG. 21, the string selection gate patterns SSG extend in a first direction D1 and be spaced apart from each other in a second direction D2 perpendicular to the first direction D1 when viewed from a plan view. A separation insulating pattern 235 is disposed between the string selection gate patterns SSG adjacent to each other. The separation insulating pattern 235 upward extend to be disposed between the uppermost insulating patterns 210ua on the string selection gate patterns SSG. As illustrated in FIG. 21, the cell gate patterns CG and the ground selection gate pattern GSG have plate shapes when viewed from a plan view.

A plurality of vertical active patterns VAP are disposed in a plurality of holes 215, respectively, penetrating the gate structure. A gate dielectric layer GEL is disposed between a sidewall of each of the vertical active patterns VAP and each of the gate patterns GSG, CG, and SSG. In an embodiment, the gate dielectric layer GEL is disposed between the entire inner sidewall of each of the holes 215 and the entire sidewall of each of the vertical active patterns VAP. For example, the gate dielectric layer GEL covers the entire sidewall of the vertical active pattern VAP. The vertical active pattern VAP has a pipe shape or a macaroni shape. According to an embodiment, an inner space surrounded by the vertical active pattern VAP is filled with a filling dielectric pattern 225. The vertical active pattern VAP contacts the common source region CSR.

As illustrated in FIG. 21, the vertical active patterns VAP are two-dimensionally arranged to constitute rows and columns when viewed from a plan view. The columns are parallel to the first direction D1, and the rows are parallel to the second direction D2. The vertical active patterns VAP in each of the columns penetrate each of the string selection gate pattern SSG.

Semiconductor patterns 240 are disposed on the gate structure and extend in the second direction D2. The semiconductor patterns 240 are separated from each other. Each of the semiconductor patterns 240 is connected to the vertical active patterns VAP constituting each of the rows. In more detail, each of the semiconductor patterns 240 contacts the vertical active patterns VAP constituting each of the rows. A string drain region 250 doped with dopants of the second conductivity type is disposed in each of the semiconductor patterns 240. The string drain region 250 is spaced apart from the vertical active patterns VAP. The string selection gate pattern SSG controls a vertical channel region defined in the vertical active pattern VAP beside the string selection gate pattern SSG and a horizontal channel region defined in the semiconductor pattern 240 over the string selection gate pattern SSG. Due to the horizontal channel region of the string selection gate pattern SSG, vertical channel regions defined in the vertical active pattern VAP of a string selection transistor, cell transistors, and a ground selection transistor can be electrically connected to the string drain region 250.

A body pickup region 255 doped with dopants of the first conductivity type is disposed in each of the semiconductor pattern 240. The body pickup region 255 is spaced apart from the string drain region 250. A voltage is provided to bodies of the ground selection, cell, and string selection transistors defined in the vertical active pattern VAP through the body pickup region 255. For example, according to an embodiment, an erasing voltage is provided to the bodies of the transistors through the body pickup region 255 during an erasing operation of the 3D semiconductor memory device. Thus, even though the vertical active patterns VAP are not in contact with the well region in the semiconductor substrate 200 due to the common source region CSR, the erasing voltage can be provided to the bodies of the transistors through the body pickup region 255 to perform the erasing operation. As a result, a speed of the erasing operation can be improved.

When the erasing voltage is not provided to the bodies in the vertical active pattern VAP, the erasing operation may be performed using a gate-induced drain leakage (GIDL) phenomenon, but a speed of the erasing operation using the GIDL phenomenon may be reduced. However, according to an embodiment of the inventive concept, due to the body pickup region 255 disposed in the semiconductor pattern 240 on the gate structure, the easing voltage can be provided to the bodies in the vertical active pattern VAP. As a result, it is possible to improve the speed of the erasing operation of the 3D semiconductor memory device.

A body pickup line 270 is electrically connected to the body pickup region 255, and a bit line BL is electrically connected to the string drain region 250. The bit line BL is disposed at a level different from the body pickup line 270 with respect to the top surface of the semiconductor substrate 200.

For example, a first interlayer dielectric layer 260 is disposed on the gate structure and the semiconductor patterns 240, and the body pickup line 270 is disposed on the first interlayer dielectric layer 260. The body pickup line 270 is electrically connected to the body pickup region 255 through a first contact plug 265 penetrating the first interlayer dielectric layer 260. The body pickup line 270 extends in the first direction D1. A second interlayer dielectric layer 275 is disposed on the first interlayer dielectric layer 260 and the body pickup line 270. The bit line BL is disposed on the second interlayer dielectric layer 275. The bit line BL is electrically connected to the string drain region 240 through a second contact plug 280 successively penetrating the second and first interlayer dielectric layers 275 and 260. The bit line BL extends in the second direction D2. For example, the bit line BL crosses the body pickup line 270.

Figure 23A:
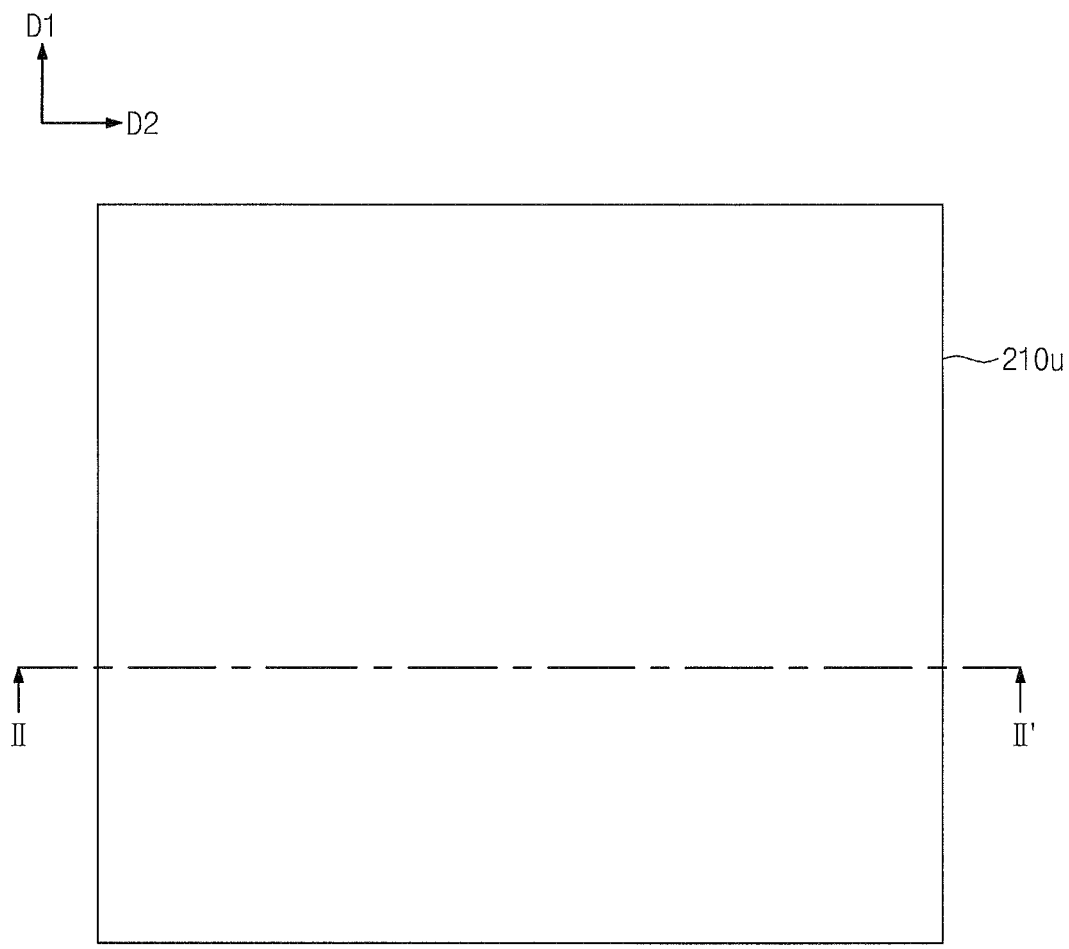
FIGS. 23A, 24A, and 25A are plan views illustrating a method of manufacturing a 3D semiconductor memory device according to an embodiment of the inventive concept.
Figure 23B:
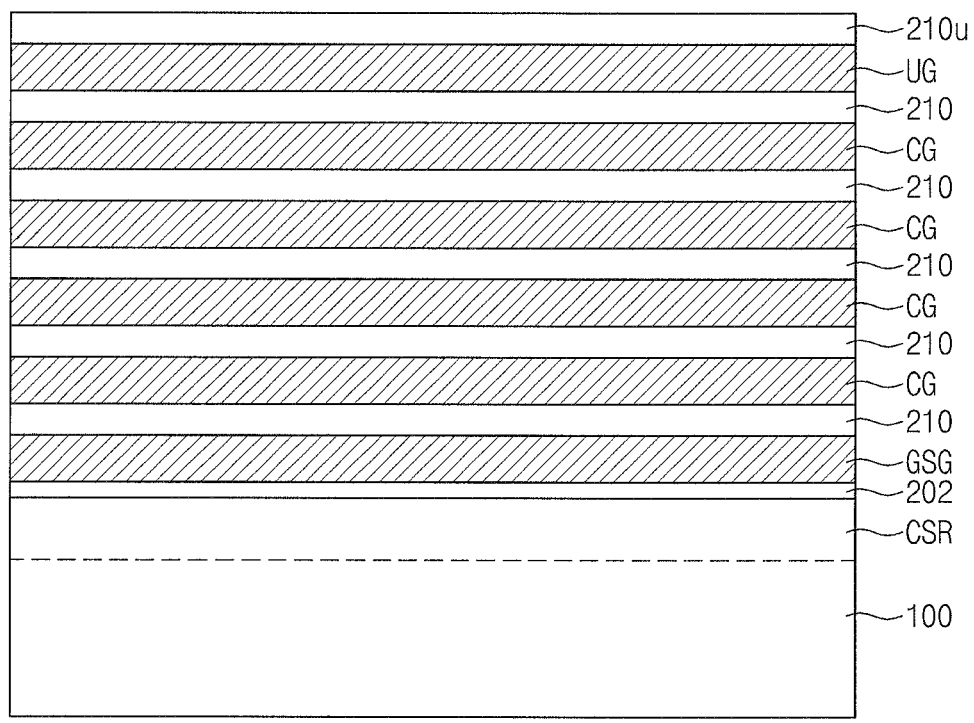
FIGS. 23B, 24B, and 25B are cross-sectional views taken along lines II-II' of FIGS. 23A, 24A, and 25A, respectively.
Figure 24A:
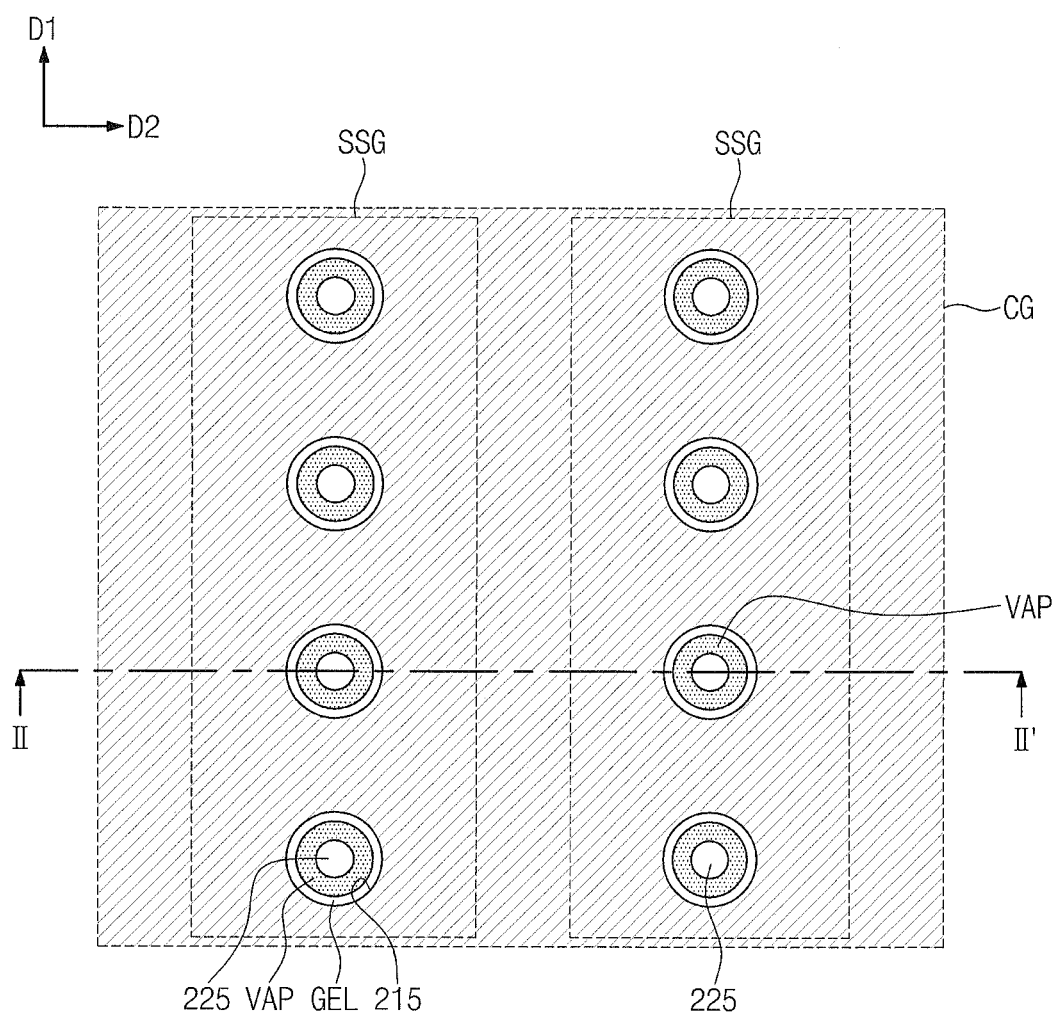
Figure 24B:
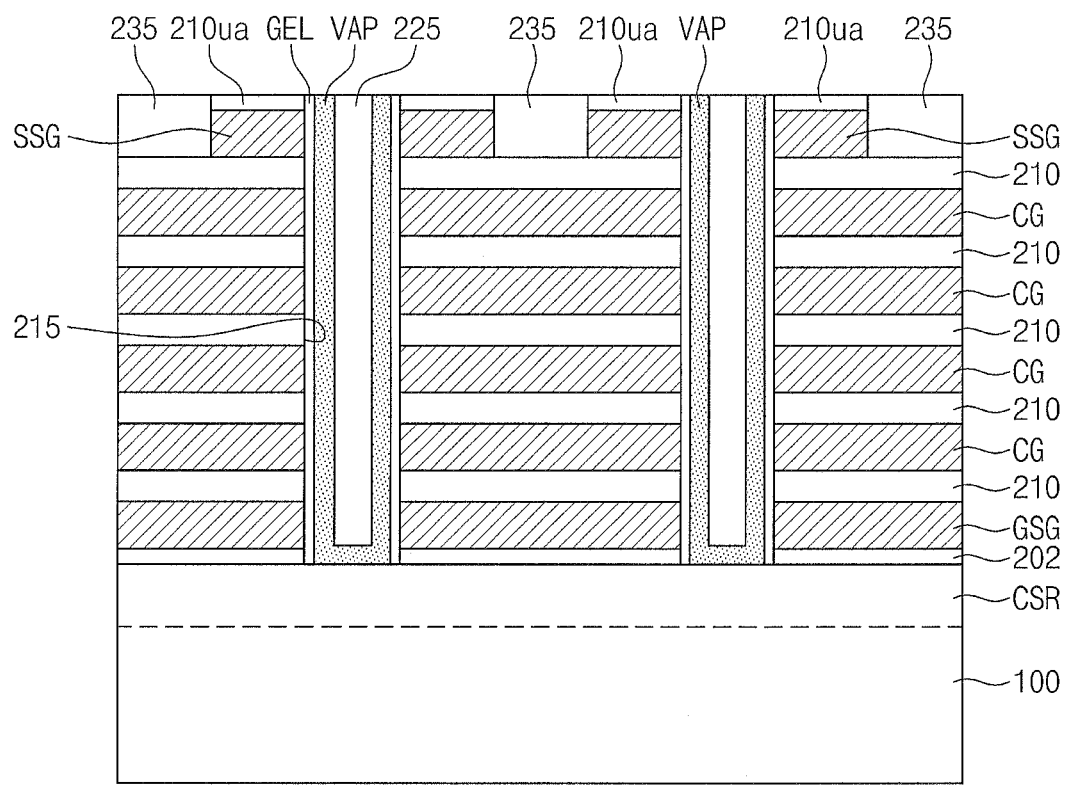
Figure 25A:
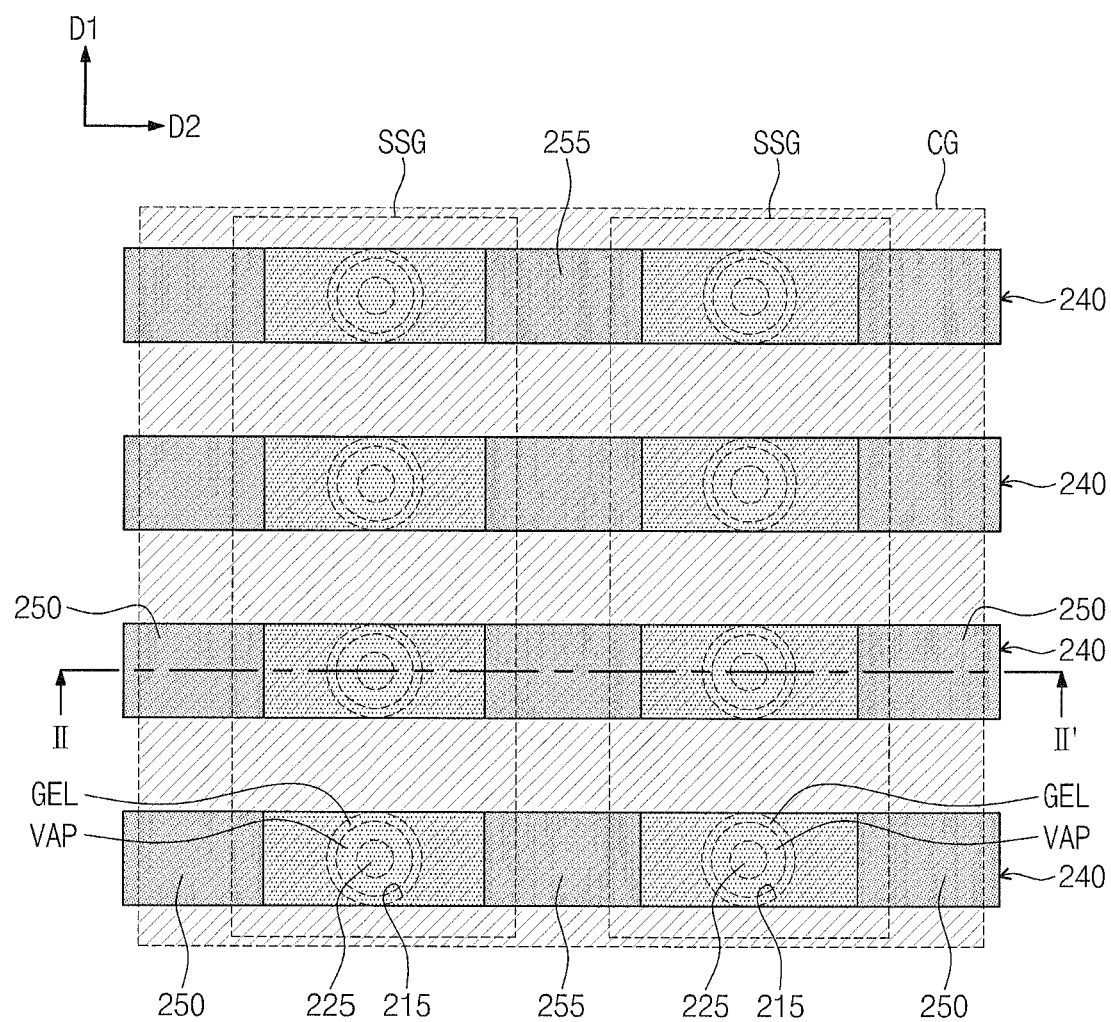
Figure 25B:
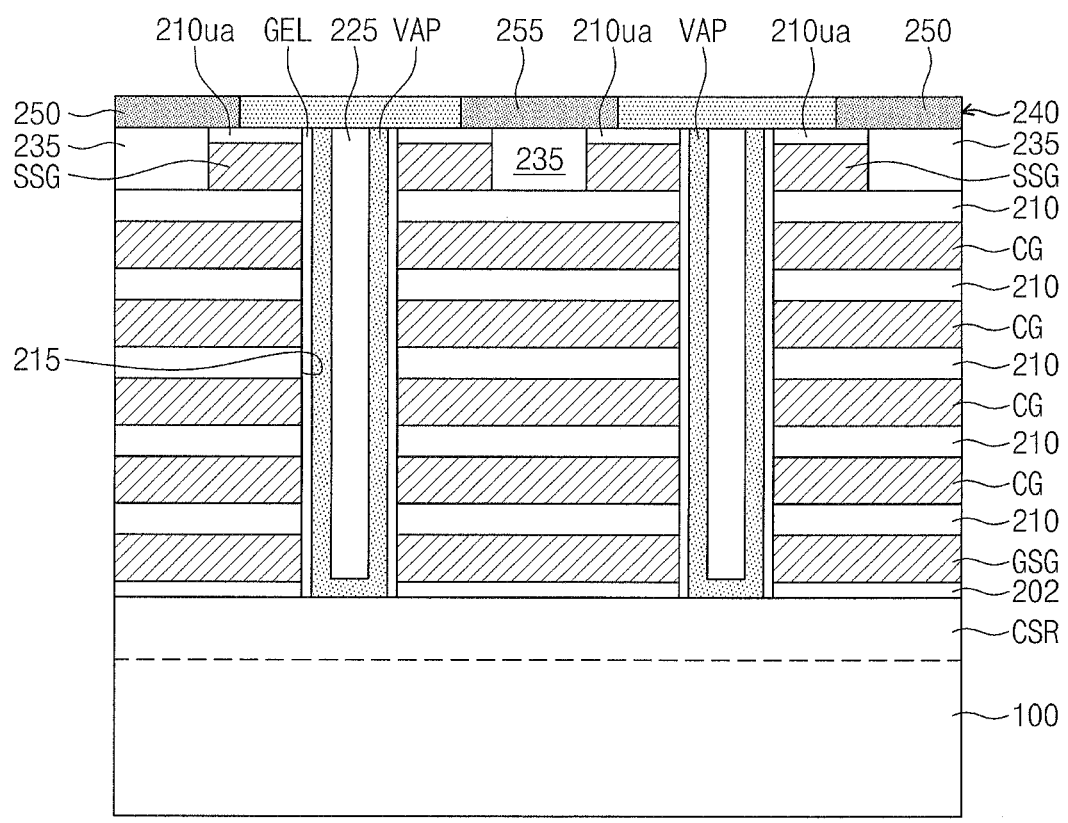

FIGS. 23A, 24A, and 25A are plan views illustrating a method of manufacturing a 3D semiconductor memory device according to an embodiment of the inventive concept, and FIGS. 23B, 24B, and 25B are cross-sectional views taken along lines II-II' of FIGS. 23A, 24A, and 25A, respectively.

Referring to FIGS. 23A and 23B, a common source region CSR is formed in a semiconductor substrate 200. Subsequently, a preliminary gate structure is formed on the semiconductor substrate 200. The preliminary gate structure is disposed on the common source region CSR. The preliminary gate structure includes insulating patterns 202, 210, and 210$u$ and gate patterns GSG, CG, and UG which are alternately and repeatedly stacked. The preliminary gate structure includes a ground selection gate pattern having a plate shape and cell gate patterns CG having plate shapes. The uppermost gate pattern UG and the uppermost insulating pattern 210$u$ of the preliminary gate structure have plate shapes.

Referring to FIGS. 24A and 24B, the uppermost insulating pattern 210$u$ and the uppermost gate pattern UG of the preliminary gate structure are patterned to form a plurality of string selection gate patterns SSG extending in a first direction D1.

An uppermost insulating pattern 210$ua$ extending in the first direction D1 is formed on each of the string selection gate patterns SSG. Thus, it is possible to form the gate structure described with reference to FIGS. 21 and 22. A separation insulating pattern 235 is formed between the string gate patterns SSG.

Holes 215 are formed to penetrate the gate structure. A gate dielectric layer GEL is formed on inner sidewalls of the holes 215. A vertical active pattern VAP and a filling dielectric pattern 225 are formed in each of the holes 215.

After the gate structure is formed, the holes 215 and the vertical active patterns VAP are formed. Alternatively, after the holes 215 and the vertical active patterns VAP are formed in the preliminary gate structure, the uppermost insulating pattern 210$u$ and the uppermost gate pattern UG of the preliminary gate structure are patterned to form the gate structure.

Referring to FIGS. 25A and 25B, a semiconductor layer is subsequently formed on the semiconductor substrate 200 having the gate structure. The semiconductor layer is patterned to form semiconductor patterns 240 extending in the second direction D2. Dopants of a first conductivity type are injected into first regions of the semiconductor patterns 240 to form body pickup regions 255. Dopants of a second conductivity type are injected into second regions of the semiconductor patterns 240 to form string drain regions. After the body pickup regions 255 are formed, the string drain regions 250 are formed. Alternatively, after the string drain regions 250 are formed, the body pickup regions 255 are formed.

Alternatively, a first doped region of the first conductivity type and a second doped region of the second conductivity type are formed in the semiconductor layer. The first doped region is separated from the second doped region. The semiconductor layer, the first doped region, and the second doped region are patterned to form the semiconductor patterns 240, the string drain regions 250, and the body pickup regions 255.

Subsequently, the first interlayer dielectric layer 260, the first contact plug 265, and the body pickup line 270 illustrated in FIGS. 21 and 22 are sequentially formed. Subsequently, the second interlayer dielectric layer 275, the second contact plug 280 and the bit line BL illustrated in FIGS. 21 and 22 are sequentially formed. Thus, it is possible to realize the 3D semiconductor memory device illustrated in FIGS. 21 and 22.

According to an embodiment, the components described in connection with FIGS. 21 to 25 are formed of the same materials as the respective corresponding components described in FIGS. 1 to 20. According to an embodiment, the body pickup region 255 and the body pickup line 270 are applied to the embodiment described in connection with FIGS. 1 to 20. According to an embodiment, the embodiment described with reference to FIGS. 5 to 9 is applied to the embodiment described in connection with FIGS. 21 to 25 under a non-contradictable condition.

Figure 26:
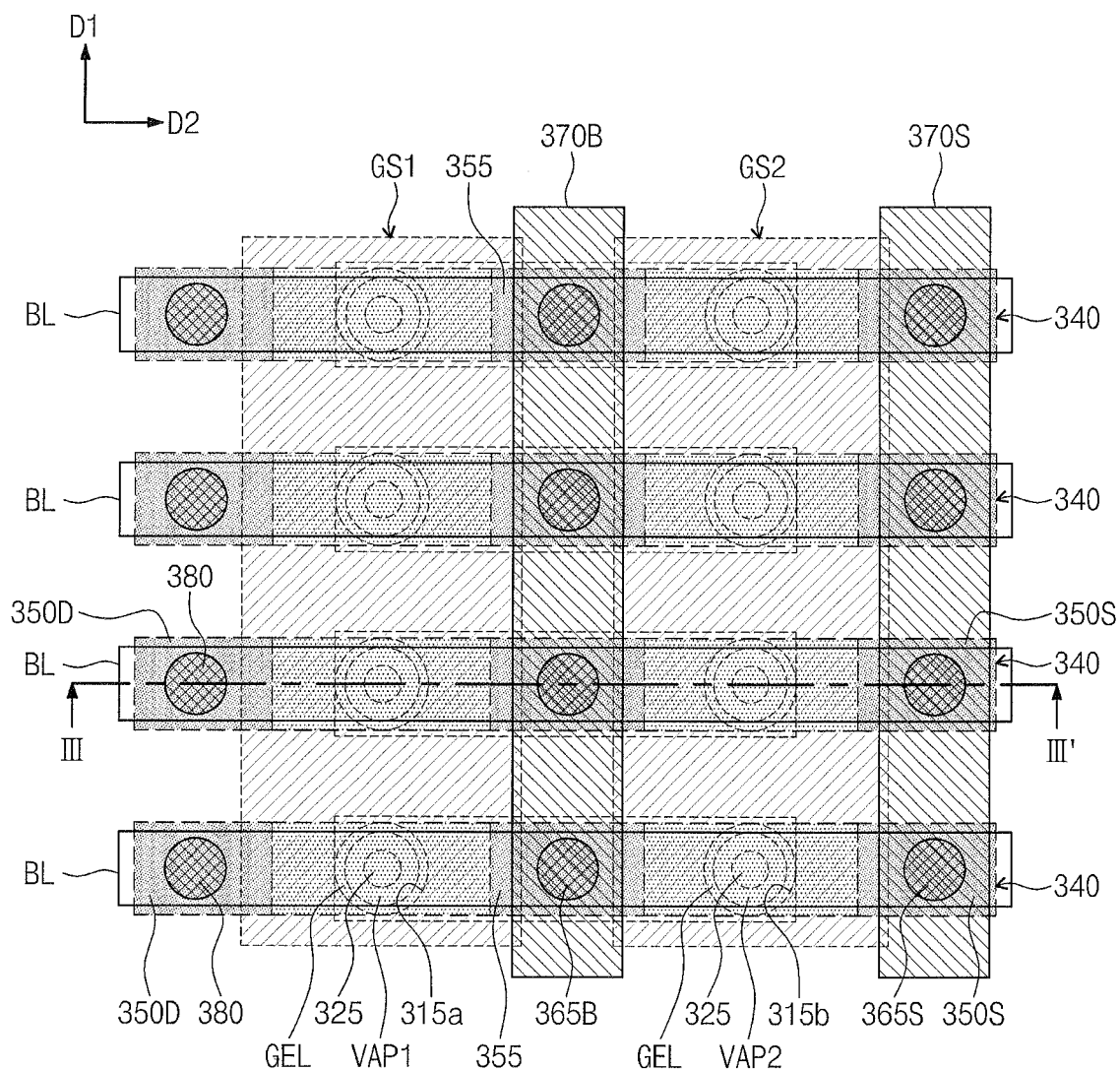
FIG. 26 is a plan view illustrating a 3D semiconductor memory device according to an embodiment of the inventive concept.
Figure 27:
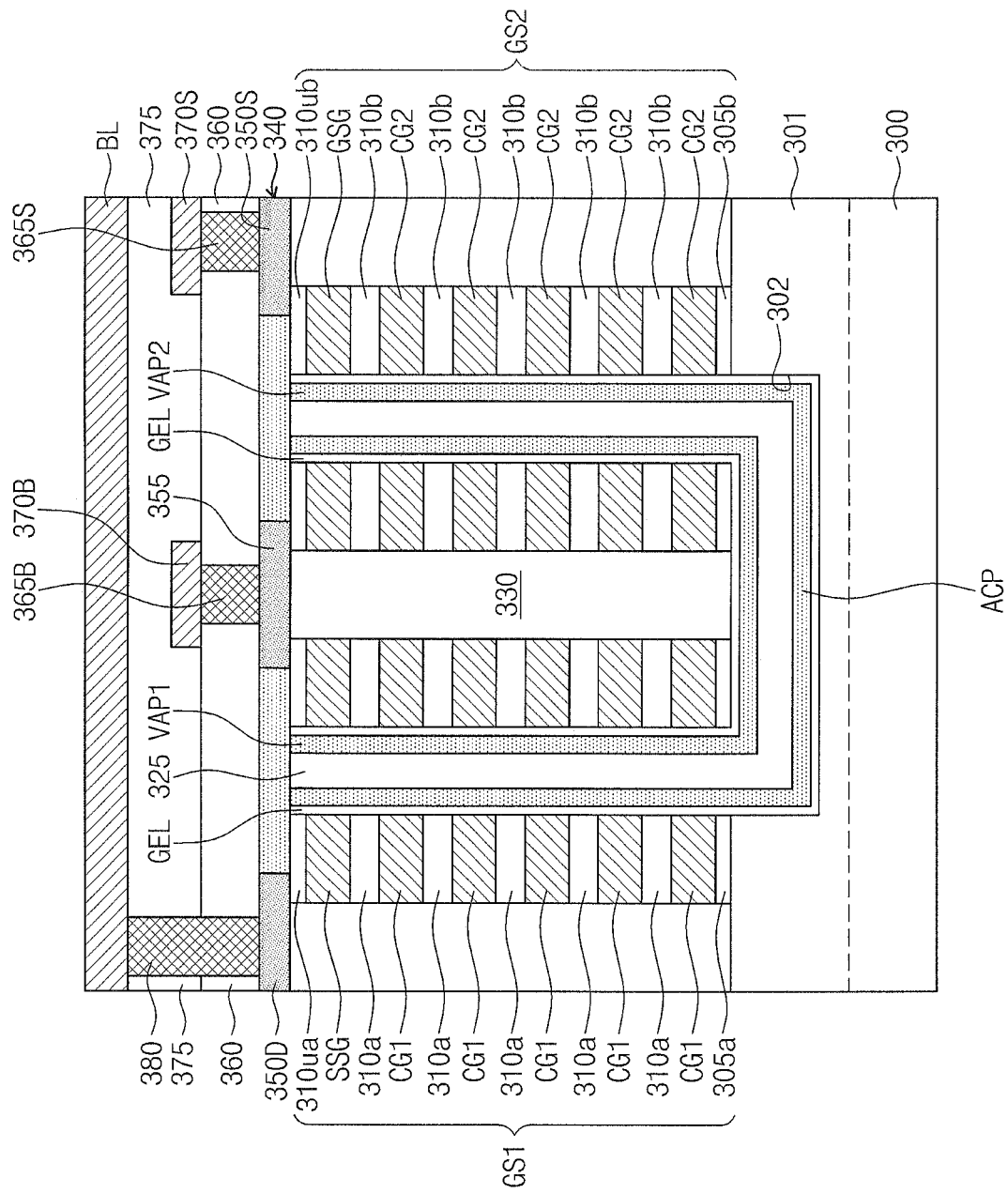
FIG. 27 is a cross-sectional view taken along a line III-III' of FIG. 26.

FIG. 26 is a plan view illustrating a 3D semiconductor memory device according to an embodiment of the inventive concept, and FIG. 27 is a cross-sectional view taken along a line of III-III' FIG. 26.

Referring to FIGS. 26 and 27, an electrode-doped region 301 doped with dopants of a first or a second conductivity type is disposed in a semiconductor substrate 300. A first gate structure GS1 and a second gate structure GS2 are disposed on the semiconductor substrate 300. The first and second gate structures GS1 and GS2 are disposed on the electrode-doped region 301. The first and second gate structures GS1 and GS2 extend in parallel in a first direction D1 when viewed from a plan view. The first and second gate structures GS1 and GS2 are spaced apart from each other in a second direction D2.

The first gate structure GS1 includes first insulating patterns 305$a$, 310$a$, 310$ua$ and first gate patterns CG1 and SSG which are alternately and repeatedly stacked. The first gate patterns CG1 and SSG include a plurality of first cell gate patterns CG1 sequentially stacked, and a string selection gate pattern SSG on the uppermost first cell gate pattern of the first cell gate patterns CG1. The lowermost gate pattern of the first gate patterns CG1 and SSG corresponds to the lowermost first cell gate pattern of the first cell gate patterns CG1. For example, the first gate structure GS1 does not include a ground selection gate pattern. The second gate structure GS2 includes second insulating patterns 305$b$, 310$b$, 310$ub$ and second gate patterns CG2 and GSG which are alternately and repeatedly stacked. The second gate patterns CG2 and GSG include a plurality of second cell gate patterns CG2 sequentially stacked and a ground selection gate pattern GSG on the uppermost second cell gate pattern of the second cell gate patterns CG2. The lowermost gate pattern of the second gate patterns CG2 and GSG corresponds to the lowermost second cell gate pattern of the second cell gate patterns CG2.

The lowermost first insulating pattern 305$a$ of the first insulating patterns 305$a$, 310$a$, and 310$ua$ is disposed between the lowermost first cell gate pattern CG1 and the semiconductor substrate 300, and the lowermost second insulating pattern 305$b$ of the second insulating patterns 305$b$, 310$b$, and 310$ub$ is disposed between the lowermost second cell gate pattern CG1 and the semiconductor substrate 300. The uppermost first insulating pattern 310$ua$ of the first insulating patterns 305$a$, 310$a$, and 310$ua$ is disposed on the string selection gate pattern SSG, and the uppermost second insulating pattern 310$ub$ of the second insulating patterns 305$b$, 310$b$, and 310$ub$ is disposed on the ground selection gate pattern GSG.

First vertical active patterns VAP1 are disposed in first holes 315a, respectively, penetrating the first gate structure GS1. Second vertical active patterns VAP2 are disposed in second holes 315b, respectively, penetrating the second gate structure GS2. As illustrated in FIG. 26, the first vertical active patterns VAP1 and the second vertical active patterns VAP2 constitute a plurality of rows parallel to the second direction D2 when viewed from a plan view. Each of the rows includes each of the first vertical active patterns VAP1 and each of the second vertical active patterns VAP2. The first vertical active patterns VAP1 are arranged in a column shape or in a zigzag shape along the first direction D1. Likewise, the second vertical active patterns VAP2 are arranged in a column shape or in a zigzag shape along the first direction D1.

As illustrated in FIG. 27, bottom ends of the first vertical active pattern VAP1 and the second vertical active pattern VAP2 in each of the rows are connected to each other to constitute a U-shape active part. The first and second vertical active patterns VAP1 and VAP2 in each of the rows are connected to each other by an active connection portion ACP in a recess region 302 which is formed in the semiconductor substrate 300. The active connection portion ACP is formed of the same semiconductor material as the first and second vertical active patterns VAP1 and VAP2. The first vertical active pattern VAP1, the active connection portion ACP, and the second vertical active pattern VAP 2 of the U-shape active part are connected to each other without boundaries to constitute one body. In an embodiment, the first vertical active pattern VAP1, the active connection portion ACP, and the second vertical active pattern VAP 2 of the U-shape active part have a pipe shape or a macaroni shape. In an embodiment, a filling dielectric pattern 325 fills an inner space surrounded by the first vertical active pattern VAP1, the active connection portion ACP, and the second vertical active pattern VAP2. In an embodiment, the filling dielectric pattern 325 is omitted. The first vertical active pattern VAP1, the active connection portion ACP, and the second vertical active pattern VAP2 have pillar shapes.

A gate dielectric layer GEL is disposed between a sidewall of each of the first and second vertical active patterns VAP1 and VAP2 and each of the first and second gate patterns CG1, SSG, CG2, and GSG. The gate dielectric layer GEL covers an entire sidewall of the first vertical active pattern VAP1 and an entire sidewall of the second vertical active pattern VAP 2. The gate dielectric layer GEL extends to be disposed between an inner surface of the recess region 302 and the active connection portion ACP. Thus, the active connection portion ACP is insulated from the electrode-doped region 301. A predetermined voltage is applied to the electrode-doped region 301 to generate a connection channel in the active connection portion ACP during an operation of the 3D semiconductor memory device according to an embodiment. Vertical channels in the first vertical active pattern VAP1 are electrically connected to vertical channels in the second vertical active pattern VAP2 through the connection channel.

Device isolation patterns 330 are disposed at two opposite sides of each of the first and second gate structures GS1 and GS2. In an embodiment, top surfaces of the device isolation patterns 330 are substantially coplanar with top surfaces of the uppermost first and second insulating patterns 310ua and 310ub.

The U-shape active part and portions of the first and second gate structures GS1 and GS2 surrounding the U-shape active part constitute one U-shape cell string. The string selection gate pattern SSG and the ground selection gate pattern GSG of the U-shape cell string correspond to the uppermost gate pattern of the first gate structure GS1 and the uppermost gate pattern of the second gate structure GS2, respectively.

Semiconductor patterns 340 are disposed on the first gate structure GS1, the second gate structure GS2, and the device isolation patterns 330. The semiconductor patterns 340 extend in parallel with the second direction D2 when viewed from a plan view. The semiconductor patterns 340 are laterally separated from each other. Each of the semiconductor patterns 340 is connected to top ends of the first and second vertical active patterns VAP1 and VAP2 in each of the rows. In more detail, each of the semiconductor patterns 340 contacts the top ends of the first and second vertical active patterns VAP1 and VAP2 in each of the rows.

A string drain region 350D is disposed in each of the semiconductor pattern 340 and is spaced apart from the first and second vertical active patterns VAP1 and VAP2. A portion of the string drain region 350D overlaps the string selection gate pattern SSG. The string selection gate pattern SSG controls a first horizontal channel region defined in the semiconductor pattern 340 over the string selection gate pattern SSG and a first vertical channel region defined in the first vertical active pattern VAP beside the string selection gate pattern SSG. Two opposite ends of the first horizontal channel region are connected to the string drain region 350D and the first vertical channel region, respectively.

A string source region 350S is disposed in each of the semiconductor patterns 340 and is spaced apart from the vertical active patterns VAP1 and VAP2 and the string drain region 350D. A portion of the string source region 350S overlaps the ground selection gate pattern GSG. The ground selection gate pattern GSG controls a second horizontal channel region defined in the semiconductor pattern 340 over the ground selection gate pattern GSG and a second vertical channel region defined in the second vertical active pattern VAP2 beside the ground selection gate pattern GSG. Two opposite ends of the second horizontal channel region are connected to the string source region 350S and the second vertical channel region, respectively.

A body pickup region 355 is disposed in each of the semiconductor patterns 340. The body pickup region 355 is spaced apart from the string drain region 350D and the string source region 350S. The body pickup region 355 is disposed between the string drain region 350D and the string source region 350S.

In an embodiment, in a plan view, a top surface of the first vertical active pattern VAP1 is disposed between the string drain region 350D and the body pickup region 355, and a top surface of the second vertical active pattern VAP2 is disposed between the body pickup region 355 and the string source region 350S.

The body pickup region 355 is doped with dopants of the first conductivity type, and the string drain and source regions 350D and 350S are doped with dopants of the second conductivity type.

A body pickup line 370B is electrically connected to the body pickup region 355, and a common source line 370S is electrically connected to the string source region 350S. A bit line BL is electrically connected to the string drain region 350D. The bit line BL is disposed at a level different from at least the common source line 370S with respect to a top surface of the semiconductor substrate 300. The body pickup line 370B is disposed at a level different from the bit line BL.

For example, a first interlayer dielectric layer 360 is disposed on the semiconductor patterns 340. The body pickup line 370B and the common source line 370S are disposed on the first interlayer dielectric layer 360. The body pickup line 370B and the common source line 370S extend in parallel in the first direction D1. The body pickup line 370B is electrically connected to the body pickup region 355 through a first contact plug 365B penetrating the first interlayer dielectric layer 360. The common source line 370S is electrically connected to the string source region 350S through a second contact plug 365S penetrating the first interlayer dielectric layer 360.

A second interlayer dielectric layer 375 is disposed on the first interlayer dielectric layer 360, the body pickup line 370B, and the common source line 370S. The bit lines BL are disposed on the second interlayer dielectric layer 375 and extend in the second direction D2. Each of the bit lines BL is electrically connected to the string drain region 350D in each of the semiconductor patterns 340 through a third contact plug 380 successively penetrating the second and first interlayer dielectric layers 375 and 360.

FIGS. 28A, 29A, 30A, and 31A are plan views illustrating a method of manufacturing a 3D semiconductor memory device according to an embodiment of the inventive concept, and FIGS. 28B, 29B, 30B, and 31B are cross-sectional views taken along lines of III-III' FIGS. 28A, 29A, 30A, and 31A, respectively.

Figure 28A:
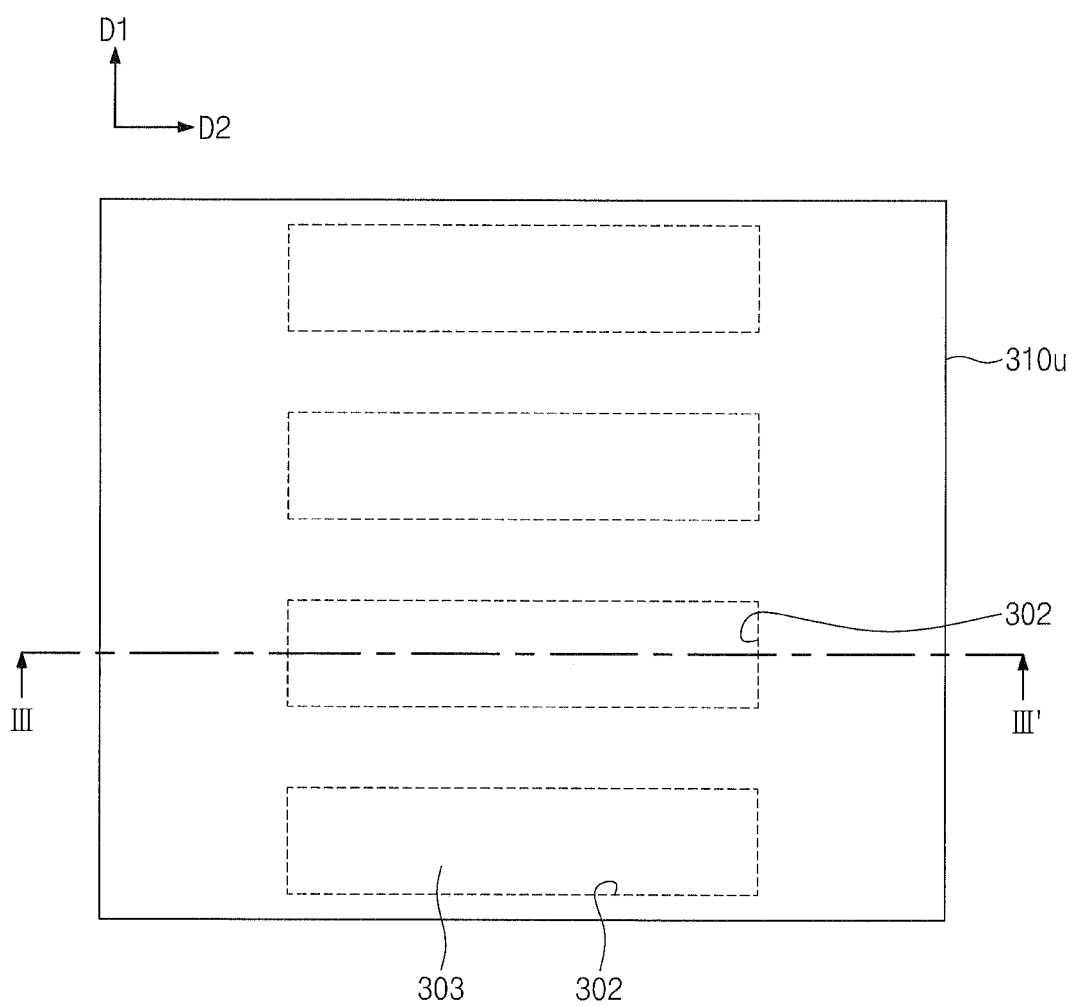
FIGS. 28A, 29A, 30A, and 31A are plan views illustrating a method of manufacturing a 3D semiconductor memory device according to an embodiment of the inventive concept.
Figure 28B:
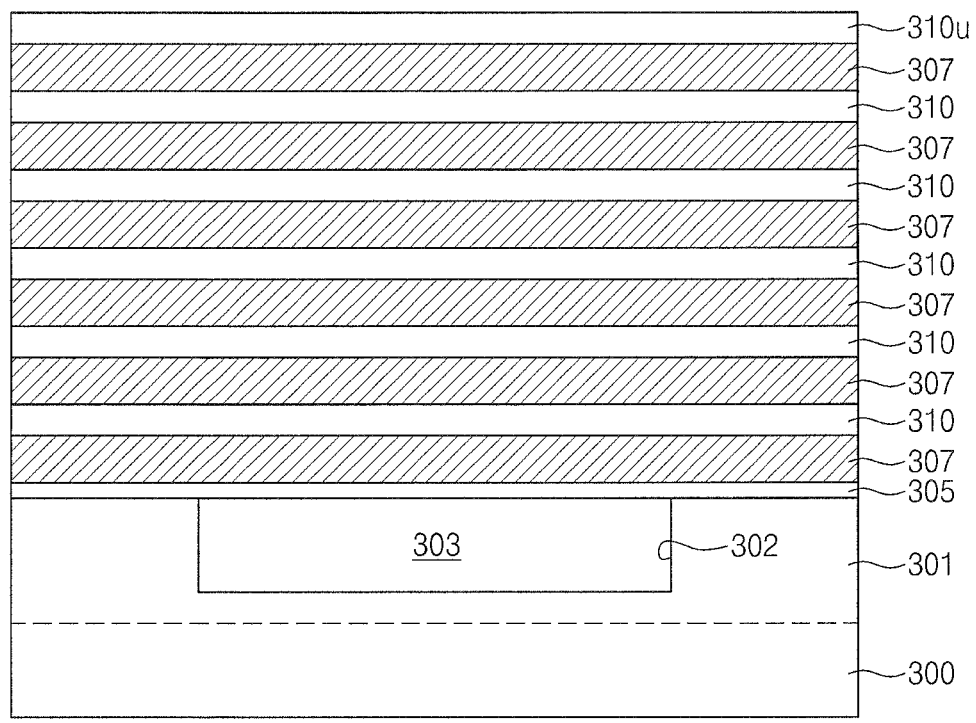
FIGS. 28B, 29B, 30B, and 31B are cross-sectional views taken along lines III-III' of FIGS. 28A, 29A, 30A, and 31A, respectively.

Referring to FIGS. 28A and 28B, dopants of a first or a second conductivity type are provided into the semiconductor substrate 300 to form an electrode-doped region 301. Recess regions 302 are formed in the semiconductor substrate 300. The recess regions 302 are arranged in a first direction D1 in a plan view. The recess regions 302 are spaced apart from each other. The recess regions 302 are formed in the electrode-doped region 301. A bottom sacrificial pattern 303 is formed in each of the recess region 302.

Insulating layers 305, 310, and 310u and conductive layers 307 are alternately and repeatedly stacked on the semiconductor substrate 300. The lowermost insulating layer 305 of the insulating layers 305, 310, and 310u is disposed between the semiconductor substrate 300 and the lowermost conductive layer of the conductive layers 307. The uppermost insulating layers 310u of the insulating layers 305, 310, and 310u is disposed on the uppermost conductive layer of the conductive layers 307.

Figure 29A:
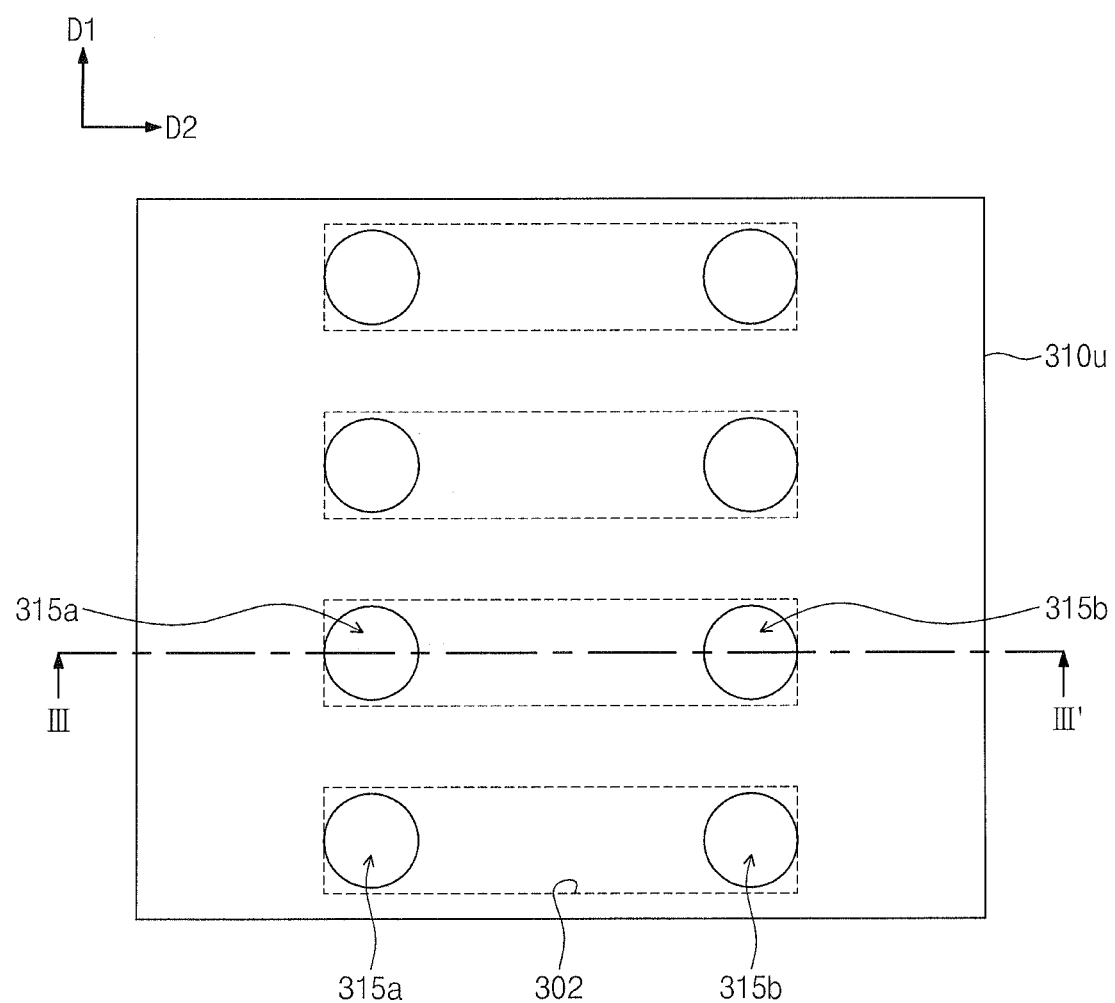
Figure 29B:
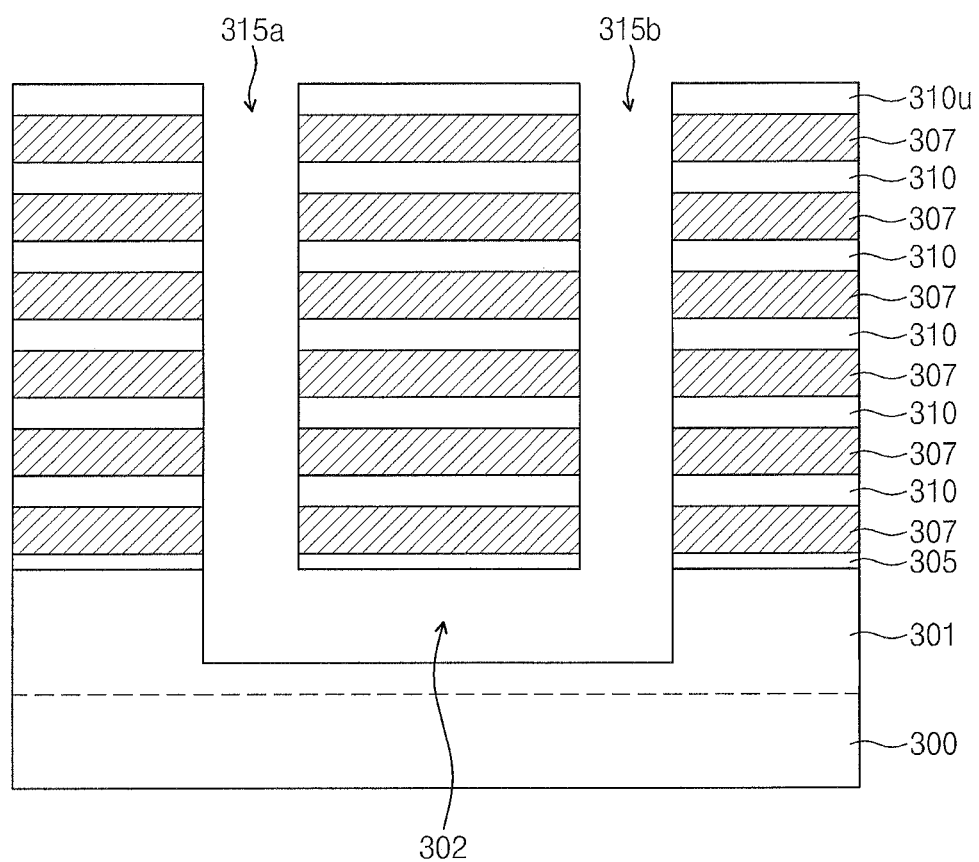

Referring to FIGS. 29A and 29B, the insulating layers 305, 310, and 310u and the conductive layers 307 are patterned to form first holes 315a and second holes 315b. The first holes 315a and the second holes 315b constitute a plurality of rows parallel to a second direction D2 when viewed from a plan view. The first hole 315a and the second hole 315b in each of the rows expose each of the bottom sacrificial pattern 303. The bottom sacrificial pattern 303 is formed of a material having an etch selectivity with respect to the insulating layers 305, 310, and 310u, the conductive layers 307, and the semiconductor substrate 300. The bottom sacrificial patterns 303 exposed by the first and second holes 315a and 315b are removed to expose inner surfaces of the recess regions 302.

Figure 30A:
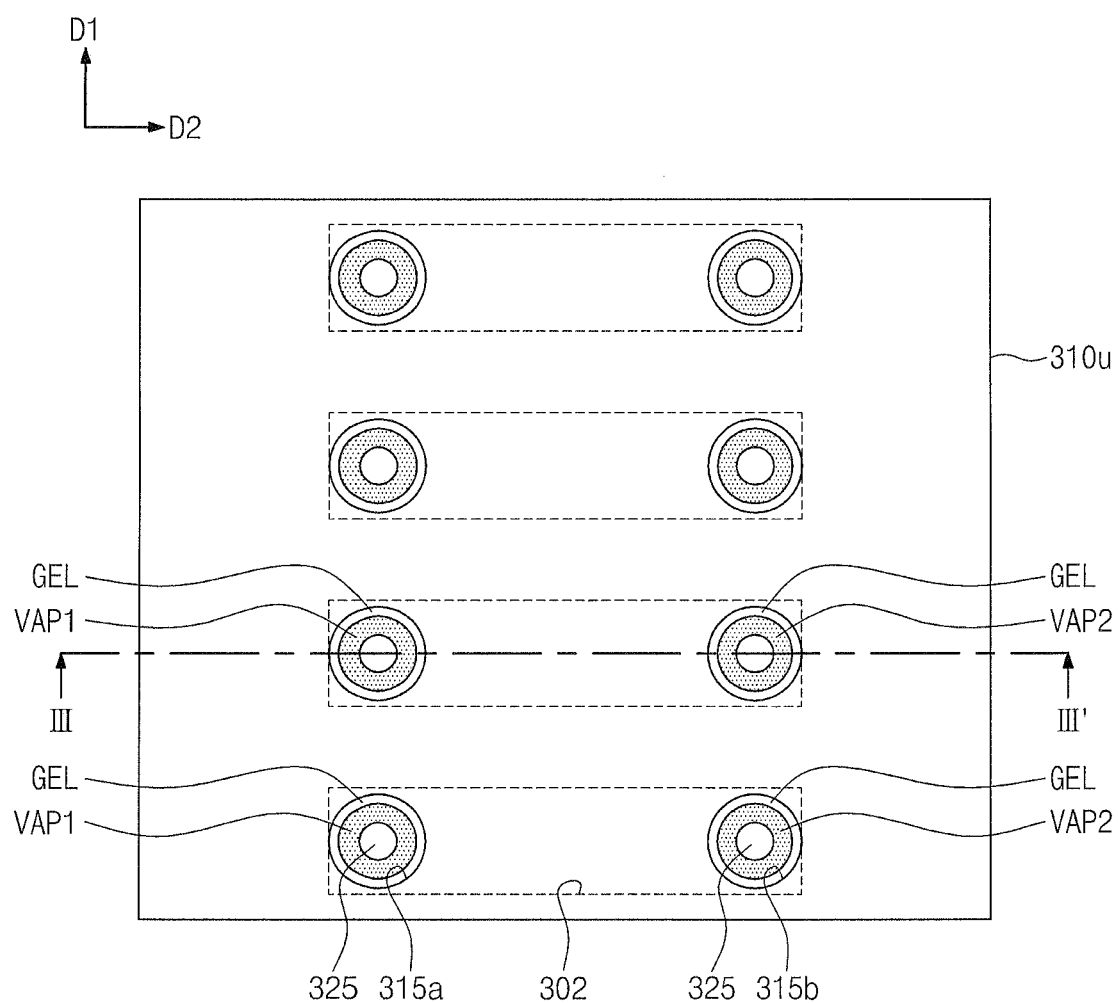
Figure 30B:
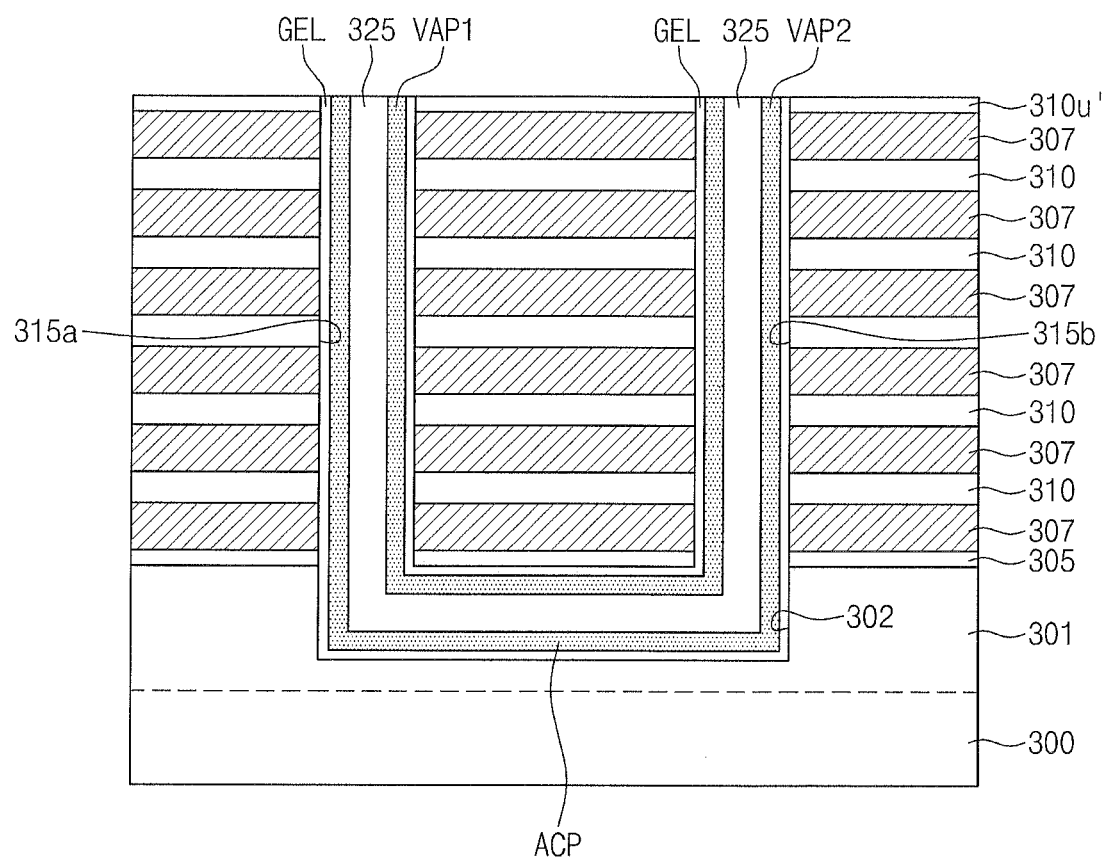

Referring to FIGS. 30A and 30B, a gate dielectric layer GEL is conformally formed on the semiconductor substrate 300 having the holes 315a and 315b and the exposed recess regions 302. The gate dielectric layer GEL is conformally formed on inner surfaces of the holes 315a and 315b and the exposed inner surfaces of the recess regions 302. An active layer is conformally formed on the semiconductor substrate 300 having the gate dielectric layer GEL, and then a filling dielectric layer is formed to fill the holes 315a and 315b and the recess regions 302. The active layer is formed of a semiconductor material for vertical active patterns VAP1 and VAP2. The filling dielectric layer and the active layer are planarized to form a first vertical active pattern VAP1 in each of the first holes 315a, a second vertical active pattern VAP2 in each of the second holes 315b, and an active connection portion ACP in each of the recess region 302. Filling dielectric patterns 325 are formed. The uppermost insulating layer 310u is recessed during the planarization of the filling dielectric layer and the active layer. The recessed uppermost insulating layer is denoted by reference numeral 310u'. A surface treatment process is performed on the recessed uppermost insulating layer 310u'.

Figure 31A:
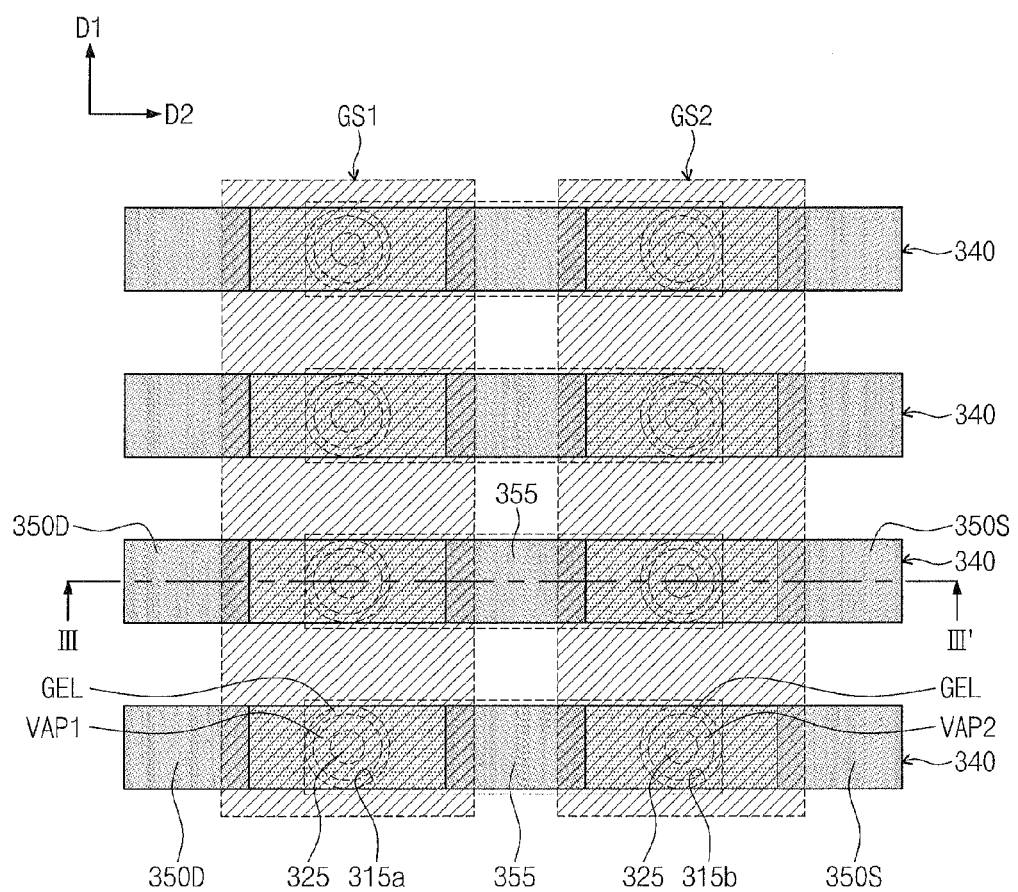
Figure 31B:
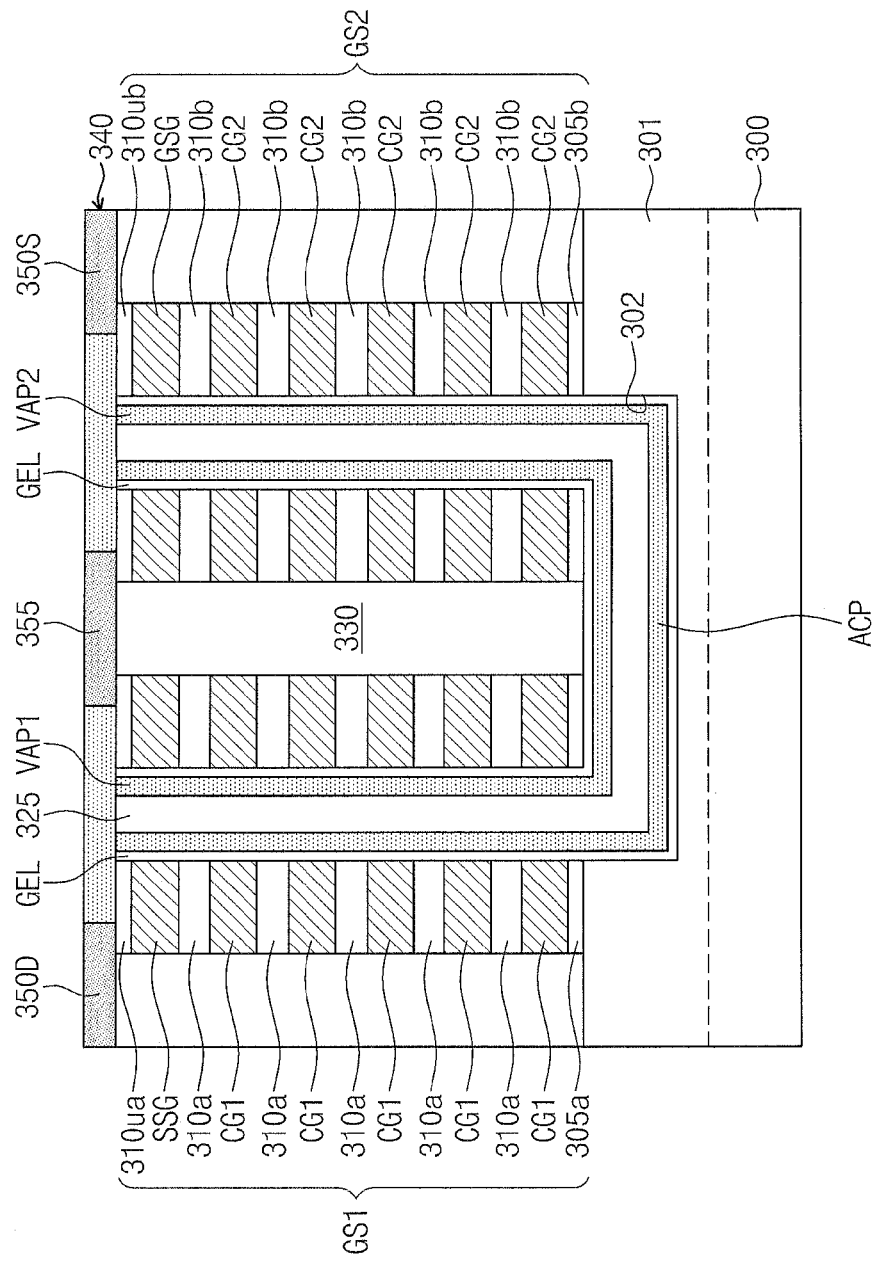

Referring to FIGS. 31A and 31B, the insulating layers 305, 310, and 310u and the conductive layers 307 are successively patterned to form a first gate structure GS1 and a second gate structure GS2. A structural description of the first and second gate structures GS1 and GS2 is described above with reference to FIGS. 26 and 27. Device isolation patterns 330 are formed at two opposite sides of the first and second gate structures GS1 and GS2.

Subsequently, a semiconductor layer is formed on the semiconductor substrate 300. The semiconductor layer contacts the vertical active patterns VAP1 and VAP2. The semiconductor layer is patterned to form semiconductor patterns 340. Dopants of the first conductivity type are provided into the semiconductor patterns 340 to form body pickup regions 355. Dopants of the second conductivity type are provided into the semiconductor patterns 340 to form string drain regions 350D and string source regions 350S. Alternatively, after a first doped region doped with dopants of the first conductivity type, and second and third doped regions doped with dopants of the second conductivity type are formed in the semiconductor layer, the semiconductor layer and the first, second and third doped regions are patterned to form the semiconductor patterns 340, the body pickup regions 355, the string drain regions 350D, and the string source regions 350S.

Subsequently, the interlayer dielectric layers 260 and 275, the contact plugs 365B, 365S, and 380, and the lines 370B, 370S, and BL of FIGS. 26 and 27 are formed. Thus, it is possible to realize the 3D semiconductor memory device illustrated in FIGS. 26 and 27.

According to an embodiment, the components described in connection with FIGS. 26 to 31 are formed of the same materials as the respective corresponding components described above in connection with FIGS. 1 to 20. According to an embodiment, the embodiment described with reference to FIGS. 5 to 9 is applied to the embodiment described in connection with FIGS. 26 to 31 under a non-contradictable condition.

According to an embodiment, the 3D semiconductor memory devices described above are encapsulated using various packaging techniques, such as, for example, any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

Figure 32:
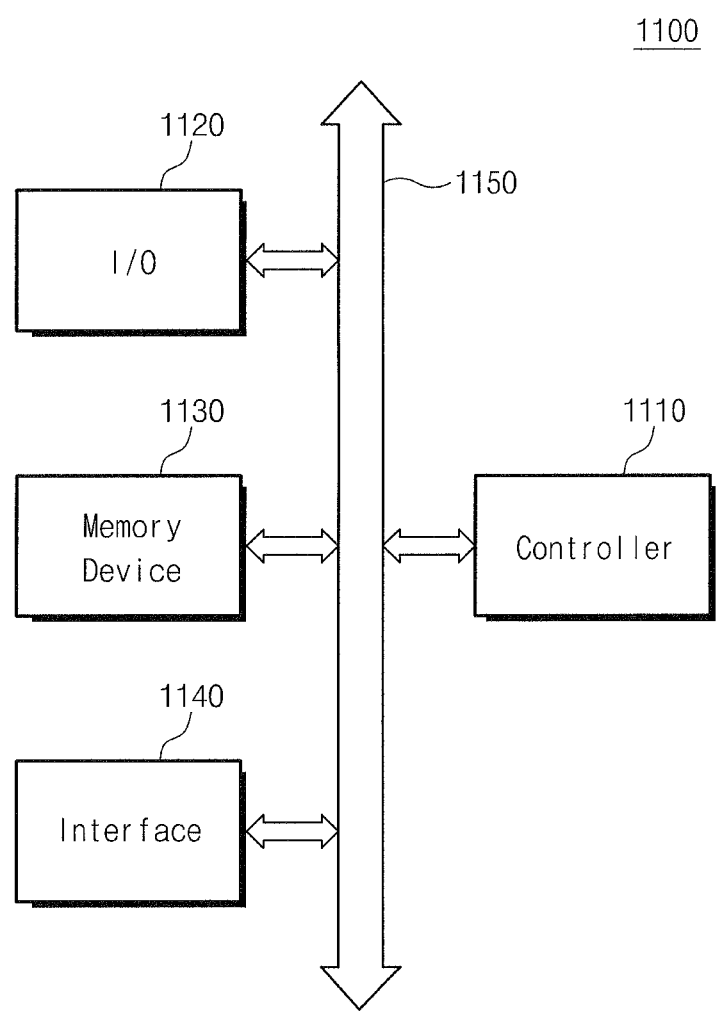
FIG. 32 is a schematic block diagram illustrating an example of an electronic system including 3D semiconductor memory devices according to an embodiment of the inventive concept.

FIG. 32 is a schematic block diagram illustrating an example of an electronic system including 3D semiconductor memory devices according to an embodiment of the inventive concept.

Referring to FIG. 32, an electronic system 1100 according to an embodiment of the inventive concept includes a controller 1110, an input/output (I/O) unit 1120, a memory device 1130, an interface unit 1140 and a data bus 1150. At least two of the controller 1110, the I/O unit 1120, the memory device 1130 and the interface unit 1140 communicate with each other through the data bus 1150. The data bus 1150 corresponds to a path through which electrical signals are transmitted.

The controller 1110 includes at least one of a microprocessor, a digital signal processor, a microcontroller or another logic device. The other logic device has a similar function to any one of the microprocessor, the digital signal processor and the microcontroller. The I/O unit 1120 includes a keypad, a keyboard and/or a display unit. The memory device 1130 stores data and/or commands. The memory device 1130 includes at least one of the 3D semiconductor memory devices according to the embodiments described above. The memory device 1130 further includes another type of semiconductor memory devices which are different from the 3D semiconductor memory devices described above. For example, according to an embodiment, the memory device 1130 further includes a magnetic memory device, a static random access memory (SRAM) device, a dynamic random access memory (DRAM) device, a resistive random access memory (RRAM) device, and/or a phase change memory device. The interface unit 1140 transmits electrical data to a communication network or receives electrical data from a communication network. The interface unit 1140 operates by wireless or cable. For example, the interface unit 1140 includes an antenna for wireless communication or a transceiver for cable communication. According to an embodiment, the electronic system 1100 further includes a fast DRAM device and/or a fast SRAM device which acts as a cache memory for improving an operation of the controller 1110.

The electronic system 1100 is applied to a personal digital assistant (PDA), a portable computer, a web tablet, a wireless phone, a mobile phone, a digital music player, a memory card or other electronic products. The other electronic products receive or transmit information data by wireless.

Figure 33:
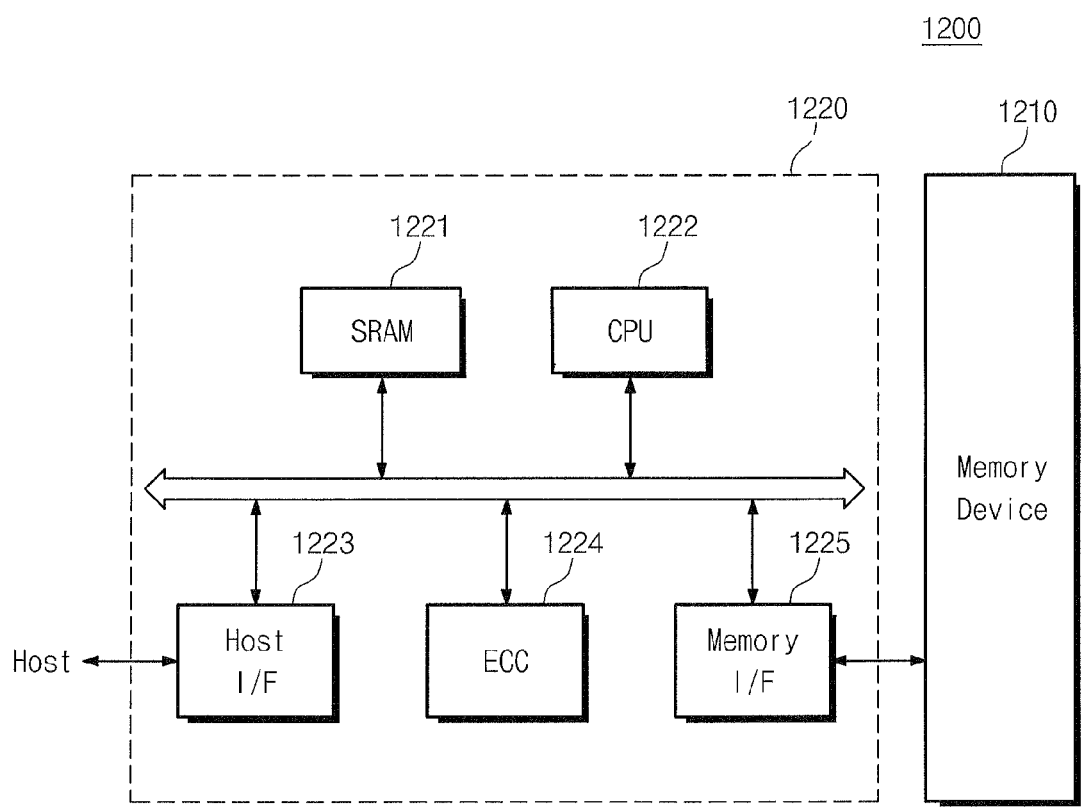
FIG. 33 is a schematic block diagram illustrating an example of memory cards including 3D semiconductor memory devices according to embodiments of the inventive concept.

FIG. 33 is a schematic block diagram illustrating an example of memory cards including 3D semiconductor memory devices according to embodiments of the inventive concept.

Referring to FIG. 33, a memory card 1200 according to an embodiment of the inventive concept includes a memory device 1210. The memory device 1210 includes at least one of the 3D semiconductor memory devices according to the embodiments mentioned above. In an embodiment, the memory device 1210 further includes another type of semiconductor memory devices which are different from the 3D semiconductor memory devices according to the embodiments described above. For example, according to an embodiment, the memory device 1210 further includes a magnetic memory device, a SRAM device, a DRAM device, a RRAM device, and/or a phase change memory device. The memory card 1200 includes a memory controller 1220 that controls data communication between a host and the memory device 1210.

The memory controller 1220 includes a central processing unit (CPU) 1222 that controls overall operations of the memory card 1200. The memory controller 1220 includes an SRAM device 1221 used as an operation memory of the CPU 1222. According to an embodiment, the memory controller 1220 further includes a host interface unit 1223 and a memory interface unit 1225. The host interface unit 1223 is configured to include a data communication protocol between the memory card 1200 and the host. The memory interface unit 1225 connects the memory controller 1220 to the memory device 1210. The memory controller 1220 further includes an error check and correction (ECC) block 1224. The ECC block 1224 detects and corrects errors of data which are read out from the memory device 1210. According to an embodiment, the memory card 1200 further includes a read only memory (ROM) device that stores code data to interface with the host. The memory card 1200 is used as a portable data storage card. Alternatively, the memory card 1200 is realized as solid state disks (SSD) which are used as hard disks of computer systems.

As described above, the string drain region is disposed in the semiconductor pattern on the gate structure and is spaced apart from the vertical active pattern. Thus, dopants in the string drain region may not influence a dopant concentration of the vertical channel region in the vertical active pattern. As a result, it is possible to realize the 3D semiconductor memory device with improved reliability and higher integration.

While the embodiments of the inventive concept have been described, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A three-dimensional (3D) semiconductor memory device comprising:
   a gate structure including gate patterns and insulating patterns alternately stacked on a semiconductor substrate;
   a vertical active pattern penetrating the gate structure;
   a gate dielectric layer disposed between a sidewall of the vertical active pattern and each of the gate patterns;
   a semiconductor pattern disposed on the gate structure, the semiconductor pattern connected to the vertical active pattern; and
   a string drain region formed in a portion of the semiconductor pattern, the string drain region spaced apart from the vertical active pattern.

2. The 3D semiconductor memory device of claim 1, wherein an uppermost gate pattern of the gate patterns is configured to control a vertical channel region defined in the vertical active pattern and a horizontal channel region defined in the semiconductor pattern;
   wherein the vertical channel region is connected to one end of the horizontal channel region; and
   wherein the string drain region is connected to another end of the horizontal channel region.

3. The 3D semiconductor memory device of claim 1, wherein the semiconductor pattern contacts the vertical active pattern.

4. The 3D semiconductor memory device of claim 1, wherein an uppermost gate pattern of the gate patterns extends in a first direction when viewed from a plan view; and
   wherein the semiconductor pattern extends in a second direction different from the first direction when viewed from the plan view.

5. The 3D semiconductor memory device of claim 4, further comprising:
   a bit line electrically connected to the string drain region, the bit line extending in the second direction.

6. The 3D semiconductor memory device of claim 1, further comprising:
- a common source region formed in the semiconductor substrate at a side of the gate structure,
- wherein a lowermost gate pattern of the gate patterns is configured to control a vertical channel region defined in the vertical active pattern and a horizontal channel region defined in the semiconductor substrate; and
- wherein an end of the horizontal channel region is connected to the common source region, and another end of the horizontal channel region is connected to the vertical channel region.

7. The 3D semiconductor memory device of claim 1, further comprising:
- a body pickup region disposed in the semiconductor pattern, the body pickup region spaced apart from the string drain region,
- wherein the body pickup region is doped with dopants of a first conductivity type, and the string drain region is doped with dopants of a second conductivity type.

8. The 3D semiconductor memory device of claim 7, further comprising:
- a bit line electrically connected to the string drain region; and
- a body pickup line electrically connected to the body pickup region,
- wherein the bit line is disposed at a level different from the body pickup line with respect to a top surface of the semiconductor substrate.

9. The 3D semiconductor memory device of claim 7, further comprising:
- a common source region formed in the semiconductor substrate, the common source region doped with dopants of the second conductivity type,
- wherein the vertical active pattern contacts the common source region.

10. A three-dimensional (3D) semiconductor memory device comprising:
- a first gate structure including first gate patterns and first insulating patterns alternately stacked on a semiconductor substrate;
- a first vertical active pattern penetrating the first gate structure;
- a second gate structure including second gate patterns and second insulating patterns alternately stacked on the semiconductor substrate, the second gate structure laterally spaced apart from the first gate structure;
- a second vertical active pattern penetrating the second gate structure;
- a gate dielectric layer disposed between a sidewall of each of the first and second vertical active patterns and each of the first and second gate patterns;
- a semiconductor pattern disposed on the first and second gate structures, the semiconductor pattern connected to the first and second vertical active patterns; and
- a string drain region disposed in the semiconductor pattern, the string drain region spaced apart from the first and second vertical active patterns.

11. The 3D semiconductor memory device of claim 10, further comprising:
- a string source region disposed in the semiconductor pattern, the string source region spaced apart from the string drain region and the first and second vertical active patterns,
- wherein bottom ends of the first and second vertical active patterns are connected to each other and constitute a U-shape active part;
- wherein an uppermost gate pattern of the first gate patterns corresponds to a string selection gate pattern, and an uppermost gate pattern of the second gate patterns corresponds to a ground selection gate pattern; and
- wherein an lowermost gate pattern of the first gate patterns and an lowermost gate pattern of the second gate patterns correspond to cell gate patterns.

12. The 3D semiconductor memory device of claim 11, wherein the string selection gate pattern is configured to control a first vertical channel region defined in the first vertical active pattern and a first horizontal channel region defined in the semiconductor pattern;
- wherein one end of the first horizontal channel region is connected to the first vertical channel region, and another end of the first horizontal channel region is connected to the string drain region;
- wherein the ground selection gate pattern is configured to control a second vertical channel region defined in the second vertical active pattern and a second horizontal channel region defined in the semiconductor pattern; and
- wherein one end of the second horizontal channel region is connected to the second vertical channel region, and another end of the second horizontal channel region is connected to the string source region.

13. The 3D semiconductor memory device of claim 11, further comprising:
- a body pickup region formed in the semiconductor pattern, the body pickup region spaced apart from the string drain region and the string source region,
- wherein the body pickup region is doped with dopants of a first conductivity type;
- wherein the string drain region and the string source region are doped with dopants of a second conductivity type; and
- wherein the body pickup region is disposed between the string drain region and the string source region.

14. The 3D semiconductor memory device of claim 13, further comprising:
- a bit line electrically connected to the string drain region;
- a common source line electrically connected to the string source region; and
- a body pickup line electrically connected to the body pickup region,
- wherein the bit line is disposed at a level different from the common source line with respect to a top surface of the semiconductor substrate; and
- wherein the bit line, the common source line, and the body pickup line are spaced apart from each other.

15. The 3D semiconductor memory device of claim 11, further comprising:
- an active connection portion disposed in a recess region formed in the semiconductor substrate under the first and second gate structures,
- wherein the active connection portion is formed of the same semiconductor material as the first and second vertical active patterns;
- wherein the bottom end of the first vertical active pattern is connected to the bottom end of the second vertical active pattern through the active connection portion; and
- wherein the gate dielectric layer extends to be disposed between the active connection portion and the semiconductor substrate.

16. A semiconductor memory device comprising:
- a gate structure including an insulating pattern and a gate pattern stacked on a substrate;

a vertical active pattern penetrating the gate structure in a direction substantially perpendicular to a top surface of the substrate; and a semiconductor pattern disposed on top surfaces of the gate structure and the vertical active pattern, the semiconductor pattern including a string drain region, wherein the string drain region does not contact the vertical active pattern.

17. The semiconductor memory device of claim 16, wherein the vertical active pattern includes a first vertical channel region, and the semiconductor pattern includes a horizontal channel region, wherein the horizontal channel region connects the first vertical channel region with the string drain region.

18. The semiconductor memory device of claim 16, further comprising a common source region in the substrate, wherein the common source region does not contact the vertical active pattern.

19. The semiconductor memory device of claim 18, wherein the vertical active pattern includes a second vertical channel region, and the substrate includes a horizontal channel region, wherein the horizontal channel region of the substrate connects the second vertical channel region with the common source region.

20. The semiconductor memory device of claim 16, further comprising a device isolation pattern at a side of the vertical active pattern.

\* \* \* \* \*